(12) United States Patent
Li et al.

(10) Patent No.: US 11,183,670 B2
(45) Date of Patent: Nov. 23, 2021

(54) ORGANIC LIGHT EMITTING DIODE WITH SPLIT EMISSIVE LAYER

(71) Applicant: Arizona Board of Regents on behalf of Arizona State University, Scottsdale, AZ (US)

(72) Inventors: Jian Li, Tempe, AZ (US); Kody George Klimes, Phoenix, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 15/845,575

(22) Filed: Dec. 18, 2017

(65) Prior Publication Data
US 2018/0175329 A1 Jun. 21, 2018

Related U.S. Application Data

(60) Provisional application No. 62/435,455, filed on Dec. 16, 2016.

(51) Int. Cl.
*H01L 51/52* (2006.01)
*H01L 51/50* (2006.01)
(Continued)

(52) U.S. Cl.
CPC ........ *H01L 51/5278* (2013.01); *C07F 15/006* (2013.01); *C09K 11/06* (2013.01);
(Continued)

(58) Field of Classification Search
CPC ............... H01L 51/5278; H01L 51/504; H01L 51/0084; H01L 51/56; H01L 2251/558;
(Continued)

(56) References Cited

U.S. PATENT DOCUMENTS

| 4,769,292 A | 9/1988 | Tang et al. |
| 5,451,674 A | 9/1995 | Silver |

(Continued)

FOREIGN PATENT DOCUMENTS

| CN | 1680366 A | 10/2005 |
| CN | 1777663 | 5/2006 |

(Continued)

OTHER PUBLICATIONS

Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.

(Continued)

*Primary Examiner* — Benjamin Tzu-Hung Liu
(74) *Attorney, Agent, or Firm* — Riverside Law LLP

(57) ABSTRACT

An organic light emitting diode (OLED) device includes an emissive layer having a first sublayer with a first emitter as a dopant, a second sublayer with a second emitter as a dopant, and a third sublayer with a third emitter as a dopant. The second sublayer is between the first sublayer and the third sublayer. A concentration of the first emitter in the first sublayer exceeds a concentration of the third emitter in the third sublayer, and the concentration of the third emitter in the third sublayer exceeds a concentration of the second emitter in the second sublayer.

15 Claims, 10 Drawing Sheets

(51) Int. Cl.
  *C09K 11/06* (2006.01)
  *C07F 15/00* (2006.01)
  *H01L 51/00* (2006.01)
  *H01L 51/56* (2006.01)
(52) U.S. Cl.
  CPC ........ H01L 51/0084 (2013.01); H01L 51/504
      (2013.01); *C09K 2211/1014* (2013.01); *C09K
      2211/1044* (2013.01); *C09K 2211/185*
      (2013.01); *H01L 51/0008* (2013.01); *H01L
      51/5016* (2013.01); *H01L 51/56* (2013.01);
      *H01L 2251/558* (2013.01); *Y02E 10/549*
      (2013.01)
(58) Field of Classification Search
  CPC . H01L 51/0008; H01L 51/5016; C09K 11/06;
      C09K 2211/1044; C09K 2211/1014;
      C09K 2211/185; C07F 15/006; Y02E
      10/549
  See application file for complete search history.

(56) References Cited

U.S. PATENT DOCUMENTS

| | | |
|---|---|---|
| 5,641,878 A | 6/1997 | Dandliker |
| 5,707,745 A | 1/1998 | Forrest et al. |
| 5,844,363 A | 12/1998 | Gu et al. |
| 6,200,695 B1 | 3/2001 | Arai |
| 6,303,238 B1 | 10/2001 | Thompson et al. |
| 6,780,528 B2 | 8/2004 | Tsuboyama et al. |
| 7,002,013 B1 | 2/2006 | Chi et al. |
| 7,037,599 B2 | 5/2006 | Culligan et al. |
| 7,064,228 B1 | 6/2006 | Yu et al. |
| 7,268,485 B2 | 9/2007 | Tyan et al. |
| 7,279,704 B2 | 10/2007 | Walters et al. |
| 7,332,232 B2 | 2/2008 | Ma et al. |
| 7,442,797 B2 | 10/2008 | Itoh et al. |
| 7,501,190 B2 | 3/2009 | Ise |
| 7,635,792 B1 | 12/2009 | Cella |
| 7,655,322 B2 | 2/2010 | Forrest et al. |
| 7,854,513 B2 | 12/2010 | Quach |
| 7,947,383 B2 | 5/2011 | Ise et al. |
| 8,106,199 B2 | 1/2012 | Jabbour |
| 8,133,597 B2 | 3/2012 | Yasukawa et al. |
| 8,389,725 B2 | 3/2013 | Li et al. |
| 8,617,723 B2 | 12/2013 | Stoessel |
| 8,669,364 B2 | 3/2014 | Li |
| 8,778,509 B2 | 7/2014 | Yasukawa |
| 8,816,080 B2 | 8/2014 | Li et al. |
| 8,846,940 B2 | 9/2014 | Li |
| 8,871,361 B2 | 10/2014 | Xia et al. |
| 8,927,713 B2 | 1/2015 | Li et al. |
| 8,946,417 B2 | 2/2015 | Li et al. |
| 8,987,451 B2 | 3/2015 | Tsai |
| 9,059,412 B2 | 6/2015 | Zeng et al. |
| 9,076,974 B2 | 7/2015 | Li |
| 9,082,989 B2 | 7/2015 | Li |
| 9,203,039 B2 | 12/2015 | Li |
| 9,221,857 B2 | 12/2015 | Li et al. |
| 9,224,963 B2 | 12/2015 | Li et al. |
| 9,238,668 B2 | 1/2016 | Li et al. |
| 9,312,502 B2 | 4/2016 | Li et al. |
| 9,312,505 B2 | 4/2016 | Brooks et al. |
| 9,318,725 B2 | 4/2016 | Li |
| 9,324,957 B2 | 4/2016 | Li et al. |
| 9,382,273 B2 | 7/2016 | Li |
| 9,385,329 B2 | 7/2016 | Li et al. |
| 9,425,415 B2 | 8/2016 | Li et al. |
| 9,461,254 B2 | 10/2016 | Tsai |
| 9,493,698 B2 | 11/2016 | Beers |
| 9,502,671 B2 | 11/2016 | Li |
| 9,550,801 B2 | 1/2017 | Li et al. |
| 9,598,449 B2 | 3/2017 | Li |
| 9,617,291 B2 | 4/2017 | Li et al. |
| 9,666,822 B2 * | 5/2017 | Forrest ................ H01L 51/0085 |
| 9,673,409 B2 | 6/2017 | Li |
| 9,698,359 B2 | 7/2017 | Li et al. |
| 9,711,739 B2 | 7/2017 | Li |
| 9,711,741 B2 | 7/2017 | Li |
| 9,711,742 B2 | 7/2017 | Li et al. |
| 9,735,397 B2 | 8/2017 | Riegel |
| 9,755,163 B2 | 9/2017 | Li et al. |
| 9,818,959 B2 | 11/2017 | Li |
| 9,865,825 B2 | 1/2018 | Li |
| 9,879,039 B2 | 1/2018 | Li |
| 9,882,150 B2 | 1/2018 | Li |
| 9,899,614 B2 | 2/2018 | Li |
| 9,920,242 B2 | 3/2018 | Li |
| 9,923,155 B2 | 3/2018 | Li et al. |
| 9,941,479 B2 | 4/2018 | Li |
| 9,947,881 B2 | 4/2018 | Li |
| 9,985,224 B2 | 5/2018 | Li |
| 10,020,455 B2 | 7/2018 | Li |
| 10,033,003 B2 | 7/2018 | Li |
| 10,056,564 B2 | 8/2018 | Li |
| 10,056,567 B2 | 8/2018 | Li |
| 10,158,091 B2 | 12/2018 | Li |
| 10,177,323 B2 | 1/2019 | Li |
| 10,211,411 B2 | 2/2019 | Li |
| 10,211,414 B2 | 2/2019 | Li |
| 10,263,197 B2 | 4/2019 | Li |
| 10,294,417 B2 | 5/2019 | Li |
| 10,392,387 B2 | 8/2019 | Li |
| 10,411,202 B2 | 9/2019 | Li |
| 10,414,785 B2 | 9/2019 | Li |
| 10,516,117 B2 | 12/2019 | Li |
| 10,566,553 B2 | 2/2020 | Li |
| 10,566,554 B2 | 2/2020 | Li |
| 2001/0019782 A1 | 9/2001 | Igarashi et al. |
| 2002/0068190 A1 | 6/2002 | Tsuboyama et al. |
| 2003/0062519 A1 | 4/2003 | Yamazaki et al. |
| 2003/0186077 A1 | 10/2003 | Chen |
| 2004/0230061 A1 | 11/2004 | Seo et al. |
| 2005/0037232 A1 | 2/2005 | Tyan |
| 2005/0139810 A1 | 6/2005 | Kuehl |
| 2005/0170207 A1 | 8/2005 | Ma et al. |
| 2005/0260446 A1 | 11/2005 | Mackenzie et al. |
| 2006/0024522 A1 | 2/2006 | Thompson |
| 2006/0032528 A1 | 2/2006 | Wang |
| 2006/0066228 A1 | 3/2006 | Antoniadis |
| 2006/0073359 A1 | 4/2006 | Ise et al. |
| 2006/0094875 A1 | 5/2006 | Itoh et al. |
| 2006/0127696 A1 | 6/2006 | Stossel et al. |
| 2006/0182992 A1 | 8/2006 | Nii et al. |
| 2006/0202197 A1 | 9/2006 | Nakayama et al. |
| 2006/0210831 A1 | 9/2006 | Sano et al. |
| 2006/0255721 A1 | 11/2006 | Igarashi et al. |
| 2006/0263635 A1 | 11/2006 | Ise |
| 2006/0286406 A1 | 12/2006 | Igarashi et al. |
| 2007/0057630 A1 | 3/2007 | Nishita et al. |
| 2007/0059551 A1 | 3/2007 | Yamazaki |
| 2007/0082284 A1 | 4/2007 | Stoessel et al. |
| 2007/0103060 A1 | 5/2007 | Itoh et al. |
| 2007/0160905 A1 | 7/2007 | Morishita |
| 2007/0252140 A1 | 11/2007 | Limmert |
| 2008/0001530 A1 | 1/2008 | Ise et al. |
| 2008/0036373 A1 | 2/2008 | Itoh et al. |
| 2008/0054799 A1 | 3/2008 | Satou |
| 2008/0079358 A1 | 4/2008 | Satou |
| 2008/0102310 A1 | 5/2008 | Thompson |
| 2008/0111476 A1 | 5/2008 | Choi et al. |
| 2008/0241518 A1 | 10/2008 | Satou et al. |
| 2008/0241589 A1 | 10/2008 | Fukunaga et al. |
| 2008/0269491 A1 | 10/2008 | Jabbour |
| 2008/0315187 A1 | 12/2008 | Bazan |
| 2009/0026936 A1 | 1/2009 | Satou et al. |
| 2009/0026939 A1 | 1/2009 | Kinoshita et al. |
| 2009/0032989 A1 | 2/2009 | Karim et al. |
| 2009/0039768 A1 | 2/2009 | Igarashi et al. |
| 2009/0079340 A1 | 3/2009 | Kinoshita et al. |
| 2009/0126796 A1 | 5/2009 | Yang |
| 2009/0128008 A1 | 5/2009 | Ise et al. |
| 2009/0136779 A1 | 5/2009 | Cheng et al. |
| 2009/0153045 A1 | 6/2009 | Kinoshita et al. |

(56) References Cited

U.S. PATENT DOCUMENTS

| | | |
|---|---|---|
| 2009/0167167 A1 | 7/2009 | Aoyama |
| 2009/0205713 A1 | 8/2009 | Mitra |
| 2009/0218561 A1 | 9/2009 | Kitamura et al. |
| 2009/0261721 A1 | 10/2009 | Murakami et al. |
| 2009/0267500 A1* | 10/2009 | Kinoshita ............ C09K 11/06 313/504 |
| 2010/0000606 A1 | 1/2010 | Thompson et al. |
| 2010/0013386 A1 | 1/2010 | Thompson et al. |
| 2010/0043876 A1 | 2/2010 | Tuttle |
| 2010/0093119 A1 | 4/2010 | Shimizu |
| 2010/0127246 A1 | 5/2010 | Nakayama |
| 2010/0141127 A1 | 6/2010 | Xia et al. |
| 2010/0147386 A1 | 6/2010 | Benson-Smith |
| 2010/0171111 A1 | 7/2010 | Takada et al. |
| 2010/0171418 A1 | 7/2010 | Kinoshita et al. |
| 2010/0200051 A1 | 8/2010 | Triani |
| 2010/0204467 A1 | 8/2010 | Lamarque et al. |
| 2010/0270540 A1 | 10/2010 | Chung et al. |
| 2010/0288362 A1 | 11/2010 | Hatwar |
| 2010/0297522 A1 | 11/2010 | Creeth |
| 2010/0307594 A1 | 12/2010 | Zhu |
| 2011/0028723 A1 | 2/2011 | Li |
| 2011/0049496 A1 | 3/2011 | Fukuzaki |
| 2011/0062858 A1 | 3/2011 | Yersin et al. |
| 2011/0132440 A1 | 6/2011 | Sivarajan |
| 2011/0217544 A1 | 9/2011 | Young |
| 2011/0227058 A1 | 9/2011 | Masui et al. |
| 2011/0301351 A1 | 12/2011 | Li |
| 2012/0024383 A1 | 2/2012 | Kaiho |
| 2012/0025588 A1 | 2/2012 | Humbert |
| 2012/0039323 A1 | 2/2012 | Hirano |
| 2012/0095232 A1 | 4/2012 | Li et al. |
| 2012/0108806 A1 | 5/2012 | Li |
| 2012/0146012 A1 | 6/2012 | Limmert |
| 2012/0181528 A1 | 7/2012 | Takada et al. |
| 2012/0199823 A1 | 8/2012 | Molt et al. |
| 2012/0202997 A1 | 8/2012 | Parham et al. |
| 2012/0204960 A1 | 8/2012 | Kato |
| 2012/0215001 A1 | 8/2012 | Li et al. |
| 2012/0223634 A1 | 9/2012 | Xia et al. |
| 2012/0264938 A1 | 10/2012 | Li et al. |
| 2012/0273736 A1 | 11/2012 | James et al. |
| 2012/0302753 A1 | 11/2012 | Li |
| 2013/0048963 A1 | 2/2013 | Beers et al. |
| 2013/0082245 A1 | 4/2013 | Kottas et al. |
| 2013/0137870 A1 | 5/2013 | Li |
| 2013/0168656 A1 | 7/2013 | Tsai et al. |
| 2013/0172561 A1 | 7/2013 | Tsai et al. |
| 2013/0200340 A1 | 8/2013 | Otsu |
| 2013/0203996 A1 | 8/2013 | Li et al. |
| 2013/0237706 A1 | 9/2013 | Li |
| 2013/0341600 A1 | 12/2013 | Lin et al. |
| 2014/0014922 A1 | 1/2014 | Lin et al. |
| 2014/0014931 A1 | 1/2014 | Riegel |
| 2014/0027733 A1 | 1/2014 | Zeng et al. |
| 2014/0042475 A1 | 2/2014 | Park |
| 2014/0066628 A1 | 3/2014 | Li |
| 2014/0073798 A1 | 3/2014 | Li |
| 2014/0084261 A1 | 3/2014 | Brooks et al. |
| 2014/0114072 A1* | 4/2014 | Li ........................ C07F 7/24 546/4 |
| 2014/0147996 A1 | 5/2014 | Vogt |
| 2014/0148594 A1 | 5/2014 | Li |
| 2014/0191206 A1 | 7/2014 | Cho |
| 2014/0203248 A1 | 7/2014 | Zhou et al. |
| 2014/0249310 A1 | 9/2014 | Li |
| 2014/0326960 A1 | 11/2014 | Kim et al. |
| 2014/0330019 A1 | 11/2014 | Li et al. |
| 2014/0364605 A1 | 12/2014 | Li et al. |
| 2015/0008419 A1 | 1/2015 | Li |
| 2015/0018558 A1 | 1/2015 | Li |
| 2015/0028323 A1 | 1/2015 | Xia et al. |
| 2015/0060804 A1 | 3/2015 | Kanitz |
| 2015/0069334 A1 | 3/2015 | Xia et al. |
| 2015/0105556 A1 | 4/2015 | Li et al. |
| 2015/0123047 A1 | 5/2015 | Maltenberger |
| 2015/0162552 A1 | 6/2015 | Li et al. |
| 2015/0194616 A1 | 7/2015 | Li et al. |
| 2015/0207086 A1* | 7/2015 | Li ........................ C07F 15/006 546/4 |
| 2015/0228914 A1 | 8/2015 | Li et al. |
| 2015/0274762 A1 | 10/2015 | Li et al. |
| 2015/0287938 A1 | 10/2015 | Li et al. |
| 2015/0311456 A1 | 10/2015 | Li |
| 2015/0318500 A1 | 11/2015 | Li |
| 2015/0349279 A1 | 12/2015 | Li et al. |
| 2015/0380666 A1 | 12/2015 | Szigethy |
| 2016/0028028 A1 | 1/2016 | Li et al. |
| 2016/0028029 A1 | 1/2016 | Li |
| 2016/0043331 A1 | 2/2016 | Li et al. |
| 2016/0072082 A1 | 3/2016 | Brooks et al. |
| 2016/0133861 A1 | 5/2016 | Li |
| 2016/0133862 A1 | 5/2016 | Li et al. |
| 2016/0181529 A1 | 6/2016 | Tsai |
| 2016/0194344 A1 | 7/2016 | Li |
| 2016/0197285 A1 | 7/2016 | Zeng et al. |
| 2016/0197291 A1 | 7/2016 | Li et al. |
| 2016/0285015 A1 | 9/2016 | Li et al. |
| 2016/0359120 A1 | 12/2016 | Li |
| 2016/0359125 A1 | 12/2016 | Li |
| 2017/0005278 A1 | 1/2017 | Li et al. |
| 2017/0012224 A1 | 1/2017 | Li et al. |
| 2017/0040555 A1 | 2/2017 | Li et al. |
| 2017/0047533 A1 | 2/2017 | Li et al. |
| 2017/0066792 A1 | 3/2017 | Li et al. |
| 2017/0069855 A1 | 3/2017 | Li et al. |
| 2017/0077420 A1 | 3/2017 | Li |
| 2017/0125708 A1 | 5/2017 | Li |
| 2017/0267923 A1 | 9/2017 | Li |
| 2017/0271611 A1 | 9/2017 | Li et al. |
| 2017/0301871 A1 | 10/2017 | Li |
| 2017/0305881 A1 | 10/2017 | Li et al. |
| 2017/0309943 A1 | 10/2017 | Angell |
| 2017/0331056 A1 | 11/2017 | Li et al. |
| 2017/0342098 A1 | 11/2017 | Li |
| 2017/0373260 A1 | 12/2017 | Li |
| 2018/0006246 A1 | 1/2018 | Li |
| 2018/0013096 A1 | 1/2018 | Hamada |
| 2018/0053904 A1 | 2/2018 | Li |
| 2018/0130960 A1 | 5/2018 | Li |
| 2018/0138428 A1 | 5/2018 | Li |
| 2018/0148464 A1 | 5/2018 | Li |
| 2018/0159051 A1 | 6/2018 | Li |
| 2018/0166655 A1 | 6/2018 | Li et al. |
| 2018/0175329 A1 | 6/2018 | Li |
| 2018/0194790 A1 | 7/2018 | Li |
| 2018/0219161 A1 | 8/2018 | Li |
| 2018/0226592 A1 | 8/2018 | Li |
| 2018/0226593 A1 | 8/2018 | Li |
| 2018/0277777 A1 | 9/2018 | Li |
| 2018/0301641 A1 | 10/2018 | Li |
| 2018/0312750 A1 | 11/2018 | Li |
| 2018/0331307 A1 | 11/2018 | Li |
| 2018/0334459 A1 | 11/2018 | Li |
| 2018/0337345 A1 | 11/2018 | Li |
| 2018/0337349 A1 | 11/2018 | Li |
| 2018/0337350 A1 | 11/2018 | Li |
| 2019/0013485 A1 | 1/2019 | Li |
| 2019/0067602 A1 | 2/2019 | Li |
| 2019/0109288 A1 | 4/2019 | Li |
| 2019/0119312 A1 | 4/2019 | Chen |
| 2019/0194536 A1 | 6/2019 | Li |
| 2019/0259963 A1 | 8/2019 | Li |
| 2019/0276485 A1 | 9/2019 | Li |
| 2019/0312217 A1 | 10/2019 | Li |
| 2019/0367546 A1 | 12/2019 | Li |
| 2019/0389893 A1 | 12/2019 | Li |
| 2020/0006678 A1 | 1/2020 | Li |
| 2020/0071330 A1 | 3/2020 | Li |
| 2020/0075868 A1 | 3/2020 | Li |
| 2020/0119288 A1 | 4/2020 | Li |
| 2020/0119289 A1 | 4/2020 | Lin |
| 2020/0140471 A1 | 5/2020 | Chen |

(56) References Cited

U.S. PATENT DOCUMENTS

| | | | |
|---|---|---|---|
| 2020/0152891 | A1 | 5/2020 | Li |
| 2020/0239505 | A1 | 7/2020 | Li |
| 2020/0243776 | A1 | 7/2020 | Li |

FOREIGN PATENT DOCUMENTS

| | | |
|---|---|---|
| CN | 1894267 | 1/2007 |
| CN | 1894269 | 1/2007 |
| CN | 101142223 | 3/2008 |
| CN | 101667626 | 3/2010 |
| CN | 102449108 A | 5/2012 |
| CN | 102892860 | 1/2013 |
| CN | 102971396 | 3/2013 |
| CN | 103102372 | 5/2013 |
| CN | 104232076 | 12/2014 |
| CN | 104377231 | 2/2015 |
| CN | 104576934 | 4/2015 |
| CN | 104693243 | 6/2015 |
| CN | 105367605 | 3/2016 |
| CN | 105418591 | 3/2016 |
| CN | 106783922 | 5/2017 |
| EP | 1617493 | 1/2006 |
| EP | 1808052 | 7/2007 |
| EP | 1874893 | 1/2008 |
| EP | 1874894 | 1/2008 |
| EP | 1919928 | 5/2008 |
| EP | 1968131 | 9/2008 |
| EP | 2020694 | 2/2009 |
| EP | 2036907 | 3/2009 |
| EP | 2096690 A2 | 9/2009 |
| EP | 2417217 | 2/2012 |
| EP | 2112213 | 7/2012 |
| EP | 2684932 | 1/2014 |
| EP | 2711999 | 3/2014 |
| EP | 3032293 | 6/2016 |
| JP | 2002010505 | 1/2002 |
| JP | 2002105055 A | 4/2002 |
| JP | 2003342284 | 12/2003 |
| JP | 2005031073 | 2/2005 |
| JP | 2005267557 | 9/2005 |
| JP | 2005310733 | 11/2005 |
| JP | 2006047240 | 2/2006 |
| JP | 2006232784 | 9/2006 |
| JP | 2006242080 | 9/2006 |
| JP | 2006242081 | 9/2006 |
| JP | 2006256999 | 9/2006 |
| JP | 2006257238 | 9/2006 |
| JP | 2006261623 | 9/2006 |
| JP | 2006290988 | 10/2006 |
| JP | 2006313796 | 11/2006 |
| JP | 2006332622 | 12/2006 |
| JP | 2006351638 | 12/2006 |
| JP | 2007019462 | 1/2007 |
| JP | 2007031678 A | 2/2007 |
| JP | 2007042875 | 2/2007 |
| JP | 2007051243 | 3/2007 |
| JP | 2007053132 | 3/2007 |
| JP | 2007066581 | 3/2007 |
| JP | 2007073620 | 3/2007 |
| JP | 2007073845 | 3/2007 |
| JP | 2007073900 | 3/2007 |
| JP | 2007080593 | 3/2007 |
| JP | 2007080677 | 3/2007 |
| JP | 2007088105 | 4/2007 |
| JP | 2007088164 | 4/2007 |
| JP | 2007096259 | 4/2007 |
| JP | 2007099765 A | 4/2007 |
| JP | 2007110067 | 4/2007 |
| JP | 2007110102 | 4/2007 |
| JP | 2007519614 | 7/2007 |
| JP | 2007258550 | 10/2007 |
| JP | 2007324309 | 12/2007 |
| JP | 2008010353 | 1/2008 |
| JP | 2008091860 | 4/2008 |
| JP | 2008103535 | 5/2008 |
| JP | 2008108617 | 5/2008 |
| JP | 2008109085 | 5/2008 |
| JP | 2008109103 | 5/2008 |
| JP | 2008116343 A | 5/2008 |
| JP | 2008117545 A | 5/2008 |
| JP | 2008160087 | 7/2008 |
| JP | 2008198801 | 8/2008 |
| JP | 2008270729 | 11/2008 |
| JP | 2008270736 | 11/2008 |
| JP | 2008310220 A | 12/2008 |
| JP | 2009016184 | 1/2009 |
| JP | 2009016579 | 1/2009 |
| JP | 2009032977 | 2/2009 |
| JP | 2009032988 | 2/2009 |
| JP | 2009059997 | 3/2009 |
| JP | 2009076509 A | 4/2009 |
| JP | 2009161524 | 7/2009 |
| JP | 2009247171 | 10/2009 |
| JP | 2009266943 | 11/2009 |
| JP | 2009267171 | 11/2009 |
| JP | 2009267244 | 11/2009 |
| JP | 2009272339 | 11/2009 |
| JP | 2009283891 | 12/2009 |
| JP | 2010135689 | 6/2010 |
| JP | 2010171205 | 8/2010 |
| JP | 2011071452 | 4/2011 |
| JP | 2012079895 | 4/2012 |
| JP | 2012079898 | 4/2012 |
| JP | 2012522843 | 9/2012 |
| JP | 2012207231 | 10/2012 |
| JP | 2012222255 | 11/2012 |
| JP | 2012231135 | 11/2012 |
| JP | 2013023500 | 2/2013 |
| JP | 2013048256 | 3/2013 |
| JP | 2013053149 | 3/2013 |
| JP | 2013525436 | 6/2013 |
| JP | 2014019701 | 2/2014 |
| JP | 2014058504 | 4/2014 |
| JP | 2014520096 | 8/2014 |
| JP | 5604505 | 10/2014 |
| JP | 2012709899 | 11/2014 |
| JP | 2014221807 | 11/2014 |
| JP | 2014239225 | 12/2014 |
| JP | 2015081257 | 4/2015 |
| KR | 20060011537 | 2/2006 |
| KR | 20060015371 | 2/2006 |
| KR | 1020060115371 | 11/2006 |
| KR | 2007061830 | 6/2007 |
| KR | 2007112465 | 11/2007 |
| KR | 1020130043460 | 4/2013 |
| KR | 101338250 | 12/2013 |
| KR | 20140052501 | 5/2014 |
| TW | 200701835 | 1/2007 |
| TW | 201249851 | 12/2012 |
| TW | 201307365 | 2/2013 |
| TW | 201710277 | 3/2017 |
| WO | WO2008054578 | 5/2000 |
| WO | 2000070655 | 11/2000 |
| WO | WO2000070655 | 11/2000 |
| WO | WO2004003108 | 1/2004 |
| WO | 2004070655 | 8/2004 |
| WO | WO2004085450 | 10/2004 |
| WO | WO2004108857 | 12/2004 |
| WO | WO2005042444 | 5/2005 |
| WO | WO2005042550 | 5/2005 |
| WO | WO2005113704 | 12/2005 |
| WO | WO2006033440 | 3/2006 |
| WO | WO2006067074 | 6/2006 |
| WO | 2006081780 | 8/2006 |
| WO | WO2006098505 | 9/2006 |
| WO | WO2006113106 | 10/2006 |
| WO | WO2006115299 | 11/2006 |
| WO | WO2006115301 | 11/2006 |
| WO | WO2007034985 | 3/2007 |
| WO | WO2007069498 | 6/2007 |
| WO | WO2008066192 | 6/2008 |
| WO | WO2008066195 | 6/2008 |
| WO | WO2008066196 | 6/2008 |
| WO | WO2008101842 | 8/2008 |

(56) References Cited

FOREIGN PATENT DOCUMENTS

| | | |
|---|---|---|
| WO | WO2008117889 | 10/2008 |
| WO | WO2008123540 | 10/2008 |
| WO | 2008131932 A1 | 11/2008 |
| WO | 2009003455 | 1/2009 |
| WO | 2009008277 | 1/2009 |
| WO | 2009011327 | 1/2009 |
| WO | WO2009017211 | 2/2009 |
| WO | WO2009023667 | 2/2009 |
| WO | 2009086209 | 7/2009 |
| WO | 2009111299 | 9/2009 |
| WO | WO2010007098 | 1/2010 |
| WO | WO2010056669 | 5/2010 |
| WO | WO2010093176 | 8/2010 |
| WO | 2010105141 | 9/2010 |
| WO | 2010118026 | 10/2010 |
| WO | WO2010118026 | 10/2010 |
| WO | WO2011064335 | 6/2011 |
| WO | WO2011070989 | 6/2011 |
| WO | WO2011089163 | 7/2011 |
| WO | 2011137429 | 11/2011 |
| WO | 2011137431 | 11/2011 |
| WO | WO2011137429 | 11/2011 |
| WO | WO2011137431 | 11/2011 |
| WO | 2012074909 | 6/2012 |
| WO | 2012112853 | 8/2012 |
| WO | WO2012112853 | 8/2012 |
| WO | WO2012116231 | 8/2012 |
| WO | 2012142387 | 10/2012 |
| WO | WO2012142387 | 10/2012 |
| WO | 2012162488 | 11/2012 |
| WO | WO2012162488 | 11/2012 |
| WO | WO2012163471 | 12/2012 |
| WO | 2013130483 | 9/2013 |
| WO | WO2013130483 | 9/2013 |
| WO | 2014009310 | 1/2014 |
| WO | WO2014016611 | 1/2014 |
| WO | 2014031977 | 2/2014 |
| WO | WO2014031977 | 2/2014 |
| WO | 2014047616 | 3/2014 |
| WO | WO2014047616 | 3/2014 |
| WO | 2014109814 | 7/2014 |
| WO | WO2014109814 | 7/2014 |
| WO | WO2014208271 | 12/2014 |
| WO | 2015027060 | 2/2015 |
| WO | WO2015027060 | 2/2015 |
| WO | 2015131158 | 9/2015 |
| WO | WO2015131158 | 9/2015 |
| WO | 2016025921 | 2/2016 |
| WO | 2016029186 | 2/2016 |
| WO | WO2016025921 | 2/2016 |
| WO | WO2016029137 | 2/2016 |
| WO | WO2016029186 | 2/2016 |
| WO | WO2016197019 | 12/2016 |
| WO | 2017117935 | 7/2017 |
| WO | WO2018071697 | 4/2018 |
| WO | WO2018140765 | 8/2018 |
| WO | 2019079505 | 4/2019 |
| WO | 2019079508 | 4/2019 |
| WO | 2019079509 | 4/2019 |
| WO | 2019236541 | 12/2019 |
| WO | 2020018476 | 1/2020 |

OTHER PUBLICATIONS

U.S. Appl. No. 61/945,940, filed Feb. 28, 2014, Chiral Metal Complexes as Emitters for Organic Polarized Electroluminescent Devices, Jian Li.
U.S. Appl. No. 15/119,961, filed Aug. 18, 2016, Chiral Metal Complexes as Emitters for Organic Polarized Electroluminescent Devices, Jian Li.
U.S. Appl. No. 62/037,802, filed Aug. 15, 2014, Non-Platinum Metal Complexes for Excimer Based Single Dopant White Organic Light Emitting Diodes, Jian Li, Liang Huang, Tyler Fleetham.
U.S. Appl. No. 15/503,690, filed Feb. 13, 2017, Non-Platinum Metal Complexes for Excimer Based Single Dopant White Organic Light Emitting Diodes, Jian Li, Liang Huang, Tyler Fleetham.
U.S. Appl. No. 62/040,470, filed Aug. 22, 2014, Organic Light-Emitting Diodes With Fluorescent and Phosphorescent Emitters, Jian Li, Tyler Fleetham.
U.S. Appl. No. 15/505,527, filed Feb. 21, 2017, Organic Light-Emitting Diodes With Fluorescent and Phosphorescent Emitters, Jian Li, Tyler Fleetham.
U.S. Appl. No. 62/040,727, filed Aug. 22, 2014, Metal-Assisted Delayed Fluorescent Materials as Co-Host Materials for Fluorescent OLEDs, Jian Li.
U.S. Appl. No. 15/505,544, filed Feb. 21, 2017, Metal-Assisted Delayed Fluorescent Materials as Co-Host Materials for Fluorescent OLEDs, Jian Li.
U.S. Appl. No. 62/050,243, filed Sep. 15, 2014, Ionic Liquid Catholyte, C. Austen Angell, Leigang Xue.
U.S. Appl. No. 62/138,710, filed Mar. 26, 2015, Ionic Liquid Catholytes and Electrochemical Devices Containing Same, Charles Austen Angell, Leigang Xue.
U.S. Appl. No. 15/508,032, filed Mar. 1, 2017, Ionic Liquid Catholytes and Electrochemical Devices Containing Same, Charles Austen Angell, Leigang Xue.
U.S. Appl. No. 62/170,809, filed Jun. 4, 2015, Transparent Electroluminescent Devices With Controlled One-Side Emissive Displays, Jian Li.
U.S. Appl. No. 15/577,655, filed Nov. 28, 2017, Transparent Electroluminescent Devices With Controlled One-Side Emissive Displays, Jian Li.
U.S. Appl. No. 62/323,383, filed Apr. 15, 2016, OLED With Doped Electron Blocking Layer, Jian Li.
U.S. Appl. No. 62/377,747, filed Aug. 22, 2016, OLED With Multi-Emissive Material Layer, Jian Li.
U.S. Appl. No. 62/407,020, filed Oct. 12, 2016, Narrow Band Red Phosphorescent Tetradentate Platinum (II) Complexes, Jian Li, Qunbo Mei.
U.S. Appl. No. 62/435,455, filed Dec. 16, 2016, Organic Light Emitting Diode With Split Emissive Layer, Jian Li, Kody George Klimes.
U.S. Appl. No. 14/437,963, filed Apr. 23, 2015, Metal Complexes, Methods, and Uses Thereof, Eric Turner, Jian Li.
U.S. Appl. No. 15/905,385, filed Feb. 26, 2018, Metal Complexes, Methods, and Uses Thereof, Eric Turner, Jian Li.
U.S. Appl. No. 61/166,901, filed Apr. 6, 2009, Synthesis of Four Coordinated Platinum Complexes and Their Applications in Light Emitting Devices Thereof, Eric Turner, Jian Li, Zixing Wang.
U.S. Appl. No. 13/263,096, filed Jan. 3, 2014, Synthesis of Four Coordinated Platinum Complexes and Their Applications in Light Emitting Devices Thereof, Eric Turner, Jian Li, Zixing Wang.
U.S. Appl. No. 14/611,654, filed Feb. 2, 2015, Synthesis of Four Coordinated Platinum Complexes and Their Applications in Light Emitting Devices Thereof, Eric Turner, Jian Li, Zixing Wang.
U.S. Appl. No. 61/329,687, filed Apr. 30, 2010, Synthesis of Four Coordinated Gold Complexes and Their Applications in Light Emitting Devices Thereof, Eric Turner, Jian Li.
U.S. Appl. No. 13/695,338, filed May 16, 2013, Synthesis of Four Coordinated Gold Complexes and Their Applications in Light Emitting Devices Thereof, Eric Turner, Jian Li.
U.S. Appl. No. 61/913,552, filed Dec. 9, 2013, Stable Emitters, Jian Li, Guijie Li.
U.S. Appl. No. 61/969,729, filed Mar. 24, 2014, Efficient Pure Blue OLEDs Employing Tetradentate Pt Complexes with Narrow Spectral Bandwidth, Jian Li, Guijie Li.
U.S. Appl. No. 62/021,488, filed Jul. 7, 2014, Stable and Efficient Platinum Complexes as Red Phosphorescent Emitters, Jian Li, Guijie Li.
U.S. Appl. No. 14/562,195, filed Dec. 5, 2014, Stable Emitters, Jian Li, Guijie Li.
U.S. Appl. No. 61/329,684, filed Apr. 30, 2010, Synthesis of Four Coordinated Palladium Complexes and Their Applications in Light Emitting Devices Thereof, Eric Turner, Jian Li.

(56) References Cited

OTHER PUBLICATIONS

U.S. Appl. No. 13/695,337, filed Mar. 13, 2013, Synthesis of Four Coordinated Palladium Complexes and Their Applications in Light Emitting Devices Thereof, Eric Turner, Jian Li.
U.S. Appl. No. 14/145,461, filed Dec. 31, 2013, Synthesis of Four Coordinated Palladium Complexes and Their Applications in Light Emitting Devices Thereof, Eric Turner, Jian Li.
U.S. Appl. No. 15/202,058, filed Jul. 5, 2016, Synthesis of Four Coordinated Palladium Complexes and Their Applications in Light Emitting Devices Thereof, Eric Turner, Jian Li.
U.S. Appl. No. 15/692,660, filed Aug. 31, 2017, Synthesis of Four Coordinated Palladium Complexes and Their Applications in Light Emitting Devices Thereof, Eric Turner, Jian Li.
U.S. Appl. No. 61/444,387, filed Feb. 18, 2011, Four Coordinated Platinum and Palladium Complexes With Geometrically Distorted Charge Transfer State and Their Applications in Light Emitting Devices, Eric Turner, Jian Li, Xiaochun Hang.
U.S. Appl. No. 13/399,252, filed Feb. 17, 2012, Four Coordinated Platinum and Palladium Complexes With Geometrically Distorted Charge Transfer State and Their Applications in Light Emitting Devices, Eric Turner, Jian Li, Xiaochun Hang.
U.S. Appl. No. 14/332,610, filed Jul. 16, 2014, Four Coordinated Platinum and Palladium Complexes With Geometrically Distorted Charge Transfer State and Their Applications in Light Emitting Devices, Eric Turner, Jian Li, Xiaochun Hang.
U.S. Appl. No. 14/589,599, filed Jan. 5, 2015, Four Coordinated Platinum and Palladium Complexes With Geometrically Distorted Charge Transfer State and Their Applications in Light Emitting Devices, Eric Turner, Jian Li, Xiaochun Hang.
U.S. Appl. No. 15/243,801, filed Aug. 22, 2016, Four Coordinated Platinum and Palladium Complexes With Geometrically Distorted Charge Transfer State and Their Applications in Light Emitting Devices, Eric Turner, Jian Li, Xiaochun Hang.
U.S. Appl. No. 61/490,111, filed May 26, 2011, Synthesis of Platinum and Palladium Complexes as Narrow-Band Phosphorescent Emitters for Full Color Displays, Eric Turner, Jian Li.
U.S. Appl. No. 13/479,921, filed May 24, 2012, Synthesis of Platinum and Palladium Complexes as Narrow-Band Phosphorescent Emitters for Full Color Displays, Eric Turner, Jian Li.
U.S. Appl. No. 14/996,522, filed Jan. 15, 2016, Synthesis of Platinum and Palladium Complexes as Narrow-Band Phosphorescent Emitters for Full Color Displays, Eric Turner, Jian Li.
U.S. Appl. No. 15/640,686, filed Jul. 3, 2017, Synthesis of Platinum and Palladium Complexes as Narrow-Band Phosphorescent Emitters for Full Color Displays, Eric Turner, Jian Li.
U.S. Appl. No. 61/704,880, filed Sep. 24, 2012, Tetradentate Cyclometalated Metal Complexes, Guijie Li, Jian Li.
U.S. Appl. No. 14/430,454, filed Mar. 23, 2015, Metal Compounds, Methods, and Uses Thereof, Guijie Li, Jian Li.
U.S. Appl. No. 15/882,358, filed Jan. 29, 2018, Metal Compounds, Methods, and Uses Thereof, Guijie Li, Jian Li.
U.S. Appl. No. 61/833,091, filed Jun. 10, 2013, Phosphorescent Tetradentate Metal Complexes Having Modified Emission Spectra, Guijie Li, Jason Brooks, Jian Li.
U.S. Appl. No. 61/868,411, filed Aug. 21, 2013, Highly Efficient Organic Electrophosphorescent Devices With "Quantum Dot" Like Emission, Jian Li.
U.S. Appl. No. 14/913,306, filed Feb. 19, 2016, Phosphorescent Tetradentate Metal Complexes Having Modified Emission Spectra, Guijie Li, Jason Brooks, Jian Li.
U.S. Appl. No. 14/513,506, filed Oct. 14, 2014, Platinum Complexes and Devices, Guijie Li, Jason Brooks, Jian Li.
U.S. Appl. No. 15/202,111, filed Jul. 5, 2016, Platinum Complexes and Devices, Guijie Li, Jason Brooks, Jian Li.
U.S. Appl. No. 15/615,566, filed Jun. 6, 2017, Phosphorescent Tetradentate Metal Complexes Having Modified Emission Spectra, Guijie Li, Jason Brooks, Jian Li, Jason Brooks.
U.S. Appl. No. 15/900,260, filed Feb. 20, 2018, Phosphorescent Tetradentate Metal Complexes Having Modified Emission Spectra, Guijie Li, Jason Brooks, Jian Li, Jason Brooks.

U.S. Appl. No. 61/890,545, filed Oct. 14, 2013, Platinum Complexes, Devices, and Uses Thereof, Guijie Li, Jason Brooks, Jian Li.
U.S. Appl. No. 61/890,580, filed Oct. 14, 2013, Platinum Complexes, Devices, and Uses Thereof, Guijie Li, Jason Brooks, Jian Li.
U.S. Appl. No. 61/924,462, filed Jan. 7, 2014, Delayed Fluorescent Emitters Containing Phenyl-Pyrazole and Its Analogues, Guijie Li, Jian Li.
U.S. Appl. No. 14/591,188, filed Jan. 7, 2015, Tetradentate Plantinum and Palladium Complex Emitters Containing Phenyl-Pyrazole and Its Analogues, Guijie Li, Jian Li.
U.S. Appl. No. 61/897,065, filed Oct. 29, 2013, Efficient and Stable Blue and White Organic Light Emitting Diodes, Guijie Li, Jian Li.
U.S. Appl. No. 62/006,509, filed Jun. 2, 2014, Tetradentate Cyclometalated Platinum Complexes Containing 9,10-Dihydroacridine and Its Analogues, Guijie Li, Jian Li, Zhi-Qiang Zhu.
U.S. Appl. No. 14/728,848, filed Jun. 2, 2015, Tetradentate Cyclometalated Platinum Complexes Containing 9,10-Dihydroacridine and Its Analogues, Guijie Li, Jian Li, Zhi-Qiang Zhu.
U.S. Appl. No. 62/030,235, filed Jul. 29, 2014, Metal-Assisted Delayed Fluorescent Emitters Containing Tridentated Ligands, Guijie Li, Jian Li.
U.S. Appl. No. 14/809,981, filed Jul. 27, 2015, Metal-Assisted Delayed Fluorescent Emitters Containing Tridentated Ligands, Guijie Li, Jian Li.
U.S. Appl. No. 15/711,525, filed Sep. 21, 2017, Metal-Assisted Delayed Fluorescent Emitters Containing Tridentate Ligands, Guijie Li, Jian Li.
U.S. Appl. No. 62/028,562, filed Jul. 24, 2014, Tetradentate Platinum (II) Complexes Cyclometalated With Functionalized Phenyl Carbene Ligands and Their Analogues, Jian Li, Zhi-Qiang Zhu.
U.S. Appl. No. 14/805,691, filed Jul. 22, 2015, Tetradentate Platinum (II) Complexes Cyclometalated With Functionalized Phenyl Carbene Ligands and Their Analogues, Jian Li, Zhi-Qiang Zhu.
U.S. Appl. No. 62/040,133, filed Aug. 21, 2014, Efficient Cyclometalated Platinum Complexes for Displays and Lighting Applications, Jian Li.
U.S. Appl. No. 62/077,431, filed Nov. 10, 2014, Tetradentate Metal Complexes With Carbon Group Bridging Ligands, Guijie Li, Jian Li.
U.S. Appl. No. 14/937,318, filed Nov. 10, 2015, Tetradentate Metal Complexes With Carbon Group Bridging Ligands, Guijie Li, Jian Li.
U.S. Appl. No. 62/170,283, filed Jun. 3, 2015, Tetradentate Metal Complexes Containing Napthyridinocarbazole and Its Analogues, Guijie Li, Jian Li.
U.S. Appl. No. 62/254,011, filed Nov. 11, 2015, Tetradentate and Octahedral Metal Complexes Containing Naphthyridinocarbazole and Its Analogues, Guijie Li, Jian Li.
U.S. Appl. No. 15/168,942, filed May 31, 2016, Tetradentate and Octahedral Metal Complexes Containing Naphthyridinocarbazole and Its Analogues, Guijie Li, Jian Li.
U.S. Appl. No. 15/354,280, filed Nov. 17, 2016, Tetradentate and Octahedral Metal Complexes Containing Naphthyridinocarbazole and Its Analogues, Guijie Li, Jian Li.
U.S. Appl. No. 15/882,267, filed Jan. 29, 2018, Tetradentate and Octahedral Metal Complexes Containing Naphthyridinocarbazole and Its Analogues, Guijie Li, Jian Li.
U.S. Appl. No. 62/170,049, filed Jun. 2, 2015, Tetradentate Metal Complexes Containing Indoloacridine and Its Analogues, Jian Li.
U.S. Appl. No. 62/274,456, filed Jan. 4, 2016, Tetradentate Metal Complexes Containing Indoloacridine and Its Analogues, Jian Li.
U.S. Appl. No. 15/168,910, filed May 31, 2016, Tetradentate Metal Complexes Containing Indoloacridine and Its Analogues, Jian Li.
U.S. Appl. No. 15/651,972, filed Jul. 17, 2017, Tetradentate Metal Complexes Containing Indoloacridine and Its Analogues, Jian Li.
U.S. Appl. No. 62/200,960, filed Aug. 4, 2015, Novel Cyclic Tetradentate Platinum (II) and Palladium (II) Complexes, Jian Li, Zhi-Qiang Zhu.
U.S. Appl. No. 15/228,401, filed Aug. 4, 2016, Tetradentate Platinum (II) and Palladium (II) Complexes, Devices, and Uses Thereof, Jian Li, Zhi-Qiang Zhu.

(56) References Cited

OTHER PUBLICATIONS

U.S. Appl. No. 62/377,883, filed Aug. 22, 2016, Octahedral Iridium (III) Complexes Employing Azepine Functional Group and Their Analogues, Jian Li, Zhi-Qiang Zhu.
U.S. Appl. No. 15/625,082, filed Jun. 16, 2017, Tetradentate Platinum (II) and Palladium (II) Complexes and Octahedral Iridium Complexes Employing Azepine Functional Groups and Their Analogues, Jian Li, Zhi-Qiang Zhu.
U.S. Appl. No. 62/377,884, filed Aug. 22, 2016, Tetradentate Platinum (II) and Palladium (II) Complexes Employing Azepine Functional Group and Their Analogues, Jian Li, Zhi-Qiang Zhu.
U.S. Appl. No. 62/451,574, filed Jan. 27, 2017, Metal-Assisted Delayed Fluorescent Emitters Employing Pyrido-Pyrrolo-Acridine and Analogues Jian Li, Yunlong Ji.
U.S. Appl. No. 15/487,476, filed Apr. 14, 2017, OLED With Multi-Emissive Material Layer, Jian Li.
U.S. Appl. No. 62/508,560, filed May 19, 2017, Metal-Assisted Delayed Fluorescent Emttters Employing Benzo-Imidazo-Phenanthridine and Analogues, Jian Li, Yunlong Ji.
U.S. Appl. No. 62/508,849, filed May 19, 2017, Tetradentate Platinum and Palladium Complexes Based on Biscarbazole and Analogues, Jian Li, Zhiqiang Zhu.
U.S. Appl. No. 62/573,596, filed Oct. 17, 2017, Hole-Blocking Materials for Organic Light Emitting Diodes, Jian Li.
U.S. Appl. No. 62/573,472, filed Oct. 17, 2017, Phosphorescent Excimers With Preferred Molecular Orientation as Monochromatic Emitters for Display and Lighting Applications, Jian Li.
U.S. Appl. No. 62/573,639, filed Oct. 17, 2017, Phosphorescent Excimers With Preferred Molecular Orientation as Monochromatic Emitters for Display and Lighting Applications, Jian Li.
U.S. Appl. No. 62/573,462, filed Oct. 17, 2017, Single-Doped White OLED With Extraction Layer Doped With Down-Conversion Red Phosphors, Jian Li.
Wong; Challenges in organometallic research—Great opportunity for solar cells and OLEDs, Journal of Organometallic Chemistry, 2009, 694, 2644-2647.
JP2009267244, English Translation from EPO, Nov. 2009, 80 pages.
JP2010135689, English translation from EPO, Jun. 2010, 95 pages.
Chi et al.; Transition-metal phosphors with cyclometalating ligands: fundamentals and applications, Chemical Society Reviews, vol. 39, No. 2, Feb. 2010, pp. 638-655.
Satake et al., "Interconvertible Cationic and Neutral Pyridinylimidazole η-Allylpalladium Complexes. Structural Assignment by 1H, 13C, and 15N NMR and X-ray Diffraction", Organometallics, vol. 18, No. 24, 1999, pp. 5108-5111.
Baldo et al., "Highly Efficient Phosphorescent Emission from Organic Electroluminescent Devices," Nature, vol. 395, Sep. 10, 1998, pp. 151-154.
Baldo et al., "Very high-efficiency green organic light-emitting devices based on electrophosphorescence," Applied Physics Letters, vol. 75, No. 1, Jul. 5, 1999, pp. 4-6.
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.
Ayan Maity et al., "Room-temperature synthesis of cyclometalated iridium(III) complexes; kinetic isomers and reactive functionalities" Chem. Sci., vol. 4, pp. 1175-1181 (2013).
Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).
Ji Hyun Seo et al., "Efficient blue-green organic light-emitting diodes based on heteroleptic tris-cyclometalated iridium (III) complexes". Thin Solid Films, vol. 517, pp. 1807-1810 (2009).
Barry O'Brien et al.: White organic light emitting diodes using Pt-based red, green and blue phosphorescent dopants. Proc. SPIE, vol. 8829, pp. 1-6, Aug. 25, 2013.
Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.
Vanessa Wood et al., "Colloidal quantum dot light-emitting devices," Nano Reviews, vol. 1, 2010, 8 pages.
Glauco Ponterini et al., "Comparison of Radiationless Decay Processes in Osmium and Platinum Porphyrins," J. Am. Chem. Soc., vol. 105, No. 14, 1983, pp. 4639-4645.
Shizuo Tokito et al., "Confinement of triplet energy on phosphorescent molecules for highly-efficient organic blue-light-emitting devices," Applied Physics Letters, vol. 83, No. 3, Jul. 21, 2003, pp. 569-571.
Brian W. D'Andrade et al., "Controlling Exciton Diffusion in Multilayer White Phosphorescent Organic Light Emitting Devices," Adv. Mater., vol. 14, No. 2, Jan. 16, 2002, pp. 147-151.
Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.
Evan L. Williams et al., "Excimer-Based White Phosphorescent Organic Light Emitting Diodes with Nearly 100% Internal Quantum Efficiency," Adv. Mater., vol. 19, 2007, pp. 197-202.
Shih-Chun Lo et al., "High-Triplet-Energy Dendrons: Enhancing the Luminescence of Deep Blue Phosphorescent Iridium(III) Complexes," J. Am. Chem. Soc., vol. 131, 2009, pp. 16681-16688.
Jan Kalinowski et al., "Light-emitting devices based on organometallic platinum complexes as emitters," Coordination Chemistry Reviews, vol. 255, 2011, pp. 2401-2425.
Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Chi-Ming Che et al., "Photophysical Properties and OLED Applications of Phosphorescent Platinum(II) Schiff Base Complexes," Chem. Eur. J., vol. 16, 2010, pp. 233-247.
Stephen R. Forrest, "The path to ubiquitous and low-cost organic electronic appliances on plastic," Nature, vol. 428, Apr. 29, 2004, pp. 911-918.
Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.
Xiaofan Ren et al., "Ultrahigh Energy Gap Hosts in Deep Blue Organic Electrophosphorescent Devices," Chem. Mater., vol. 16, 2004, pp. 4743-4747.
Jeonghun Kwak et al., "Bright and Efficient Full-Color Colloidal Quantum Dot Light-Emitting Diodes Using an Inverted Device Structure," Nano Lett., 2012, Vo. 12, pp. 2362-2366.
Hirohiko Fukagawa et al., "Highly Efficient and Stable Red Phosphorescent Organic Light-Emitting Diodes Using Platinum Complexes," Adv. Mater., 2012, vol. 24, pp. 5099-5103.
Eric Turner et al., "Cyclometalated Platinum Complexes with Luminescent Quantum Yields Approaching 100%," Inorg. Chem., 2013, vol. 52, pp. 7344-7351.
Steven C. F. Kui et al., "Robust Phosphorescent Platinum(II) Complexes Containing Tetradentate ONCN Ligands: Excimeric Excited State and Application in Organic White-Light-Emitting Diodes," Chem. Eur. J., 2013, vol. 19, pp. 69-73.
Steven C. F. Kui et al., "Robust phosphorescent platinum(II) complexes with tetradentate ONCN ligands: high efficiency OLEDs with excellent efficiency stability," Chem. Commun., 2013, vol. 49, pp. 1497-1499.
Guijie Li et al., "Efficient and stable red organic light emitting devices from a tetradentate cyclometalated platinum complex," Organic Electronics, 2014, vol. 15 pp. 1862-1867.
Guijie Li et al., Efficient and Stable White Organic Light-Emitting Diodes Employing a Single Emitter, Adv. Mater., 2014, vol. 26, pp. 2931-2936.
Barry O'Brien et al., "High efficiency white organic light emitting diodes employing blue and red platinum emitters," Journal of Photonics for Energy, vol. 4, 2014, pp. 043597-1-043597-8.

(56) References Cited

OTHER PUBLICATIONS

Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.
Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.
Dorwald; "Side Reactions in Organic Synthesis: A Guide to Successful Synthesis Design," Chapter 1, 2005 Wiley-VCH Verlag GmbH & Co. KGaA, Wienheim, 32 pages.
Murakami; JP 2007258550, English machine translation from EPO, Oct. 4, 2007. 80 pages.
Murakami; JP 2007324309, English machine translation from EPO, Dec. 13, 2007, 89 pages.
Marc Lepeltier et al., "Efficient blue green organic light-emitting devices based on a monofluorinated heteroleptic iridium(III) complex," Synthetic Metals, vol. 199, 2015, pp. 139-146.
Stefan Bernhard, "The First Six Years: A Report," Department of Chemistry, Princeton University, May 2008, 11 pages.
Ivaylo Ivanov et al., "Comparison of the INDO band structures of polyacetylene, polythiophene, polyfuran, and polypyrrole," Synthetic Metals, vol. 116, Issues 1-3, Jan. 1, 2001, pp. 111-114.
Zhi-Qiang Zhu et.al., "Harvesting All Electrogenerated Excitons through Metal Assisted Delayed Fluorescent Materials," Adv. Mater. 27 (2015) 2533-2537.
Zhi-Qiang Zhu et. al.. "Efficient Cyclometalated Platinum(II) Complex with Superior Operational Stability," Adv. Mater. 29 (2017) 1605002.
Chew, S. et al.: Photoluminescence and electroluminescence of a new blue-emitting homoleptic iridium complex. Applied Phys. Letters; 2006, vol. 88, pp. 093510-1-093510-3.
Xin Li et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.
Sylvia Bettington et al. "Tris-Cyclometalated Iridium(III) Complexes of Carbazole(fluorenyl)pyridine Ligands: Synthesis, Redox and Photophysical Properties, and Electrophosphorescent Light-Emitting Diodes" Chemistry: A European Journal, 2007, vol. 13, pp. 1423-1431.
Christoph Ulbricht et al., "Synthesis and Characterization of Oxetane-Functionalized Phosphorescent Ir(III)-Complexes", Macromol. Chem. Phys. 2009, 210, pp. 531-541.
Dan Wang et al., "Carbazole and arylamine functionalized iridium complexes for efficient electro-phosphorescent light-emitting diodes", Inorganica Chimica Acta 370 (2011) pp. 340-345.
Huaijun Tang et al., "Novel yellow phosphorescent iridium complexes containing a carbazoleeoxadiazole unit used in polymeric light-emitting diodes", Dyes and Pigments 91 (2011) pp. 413-421.
Hoe-Joo Seo et al., "Blue phosphorescent iridium(III) complexes containing carbazole-functionalized phenyl pyridine for organic light-emitting diodes: energy transfer from carbazolyl moieties to iridium(III) cores", RSC Advances, 2011, 1, pp. 755-757.
Jack W. Levell et al., "Carbazole/iridium dendrimer side-chain phosphorescent copolymers for efficient light emitting devices", New J. Chem., 2012, 36, pp. 407-413.
Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.
Zhaowu Xu et al., "Synthesis and properties of iridium complexes based 1,3,4-oxadiazoles derivatives", Tetrahedron 64 (2008) pp. 1860-1867.
D.F. O'Brien et al., "Improved energy transfer in electrophosphorescent devices," Appl. Phys. Lett., vol. 74, No. 3, Jan. 18, 1999, pp. 442-444.

Vadim Adamovich et al., "High efficiency single dopant white electrophosphorescent light emitting diodes," New J. Chem., 2002, 26, pp. 1171-1178.
Kwon-Hyeon Kim et al., "Controlling Emitting Dipole Orientation with Methyl Substituents on Main Ligand of Iridium Complexes for Highly Efficient Phosphorescent Organic Light-Emitting Diodes", Adv. Optical Mater. 2015, 3, pp. 1191-1196.
Matthew J. Jurow et al., "Understanding and predicting the orientation of heteroleptic phosphors in organic light-emitting materials", Nature Materials, vol. 15, Jan. 2016, pp. 85-93.
Kwon-Hyeon Kim et al., "Crystal Organic Light-Emitting Diodes with Perfectly Oriented Non-Doped Pt-Based Emitting Layer", Adv. Mater. 2016, 28, pp. 2526-2532.
Guijie Li et al., "Modifying Emission Spectral Bandwidth of Phosphorescent Platinum(II) Complexes Through Synthetic Control," Inorg. Chem. 2017, 56, 8244-8256.
Tyler Fleetham et al., "Efficient Red-Emitting Platinum Complex with Long Operational Stability," ACS Appl. Mater. Interfaces 2015, 7, 16240-16246.
Supporting Information: Xiao-Chun Hang et al., "Highly Efficient Blue-Emitting Cyclometalated Platinum(II) Complexes by Judicious Molecular Design," Wiley-VCH 2013, 7 pages.
Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.
Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.
Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.
U.S. Appl. No. 15/925,203, filed Mar. 19, 2018, Metal-Assisted Delayed Fluorescent Materials as Co-Host Materials for Fluorescent OLEDs, Jian Li.
U.S. Appl. No. 15/947,273, filed Apr. 6, 2018, Platinum Complexes and Devices, Guijie Li, Jason Brooks, Jian Li.
U.S. Appl. No. 16/031,517, filed Jul. 10, 2018, Tetradentate Plantinum and Palladium Complex Emitters Containing Phenyl-Pyrazole and Its Analogues, Guijie Li, Jian Li.
U.S. Appl. No. 15/947,092, filed Apr. 6, 2018, Tetradentate Cyclometalated Platinum Complexes Containing 9, 10-Dihydroacridine and Its Analogues, Guijie Li, Jian Li, Zhi-Qiang Zhu.
U.S. Appl. No. 15/925,084, filed Mar. 19, 2018, Tetradentate Platinum (II) Complexes Cyclometalated With Functionalized Phenyl Carbene Ligands and Their Analogues, Jian Li, Zhi-Qiang Zhu.
U.S. Appl. No. 16/043,908, filed Jul. 24, 2018, Tetradentate Metal Complexes With Carbon Group Bridging Ligands, Guijie Li, Jian Li.
U.S. Appl. No. 15/983,680, filed Aug. 18, 2018, Metal-Assisted Delayed Fluorescent Emitters Employing Benzo-Imidazo-Phenanthridine and Analogues, Jian Li, Yunlong Ji, Linyu Cao.
U.S. Appl. No. 15/984,036, filed May 18, 2018, Tetradentate Platinum and Palladium Complexes Based on Biscarbazole and Analogues, Jian Li, Zhiqiang Zhu.
U.S. Appl. No. 16/668,010, filed Oct. 30, 2019, has not yet published. Inventor: Li et al.
U.S. Appl. No. 16/739,480, filed Jan. 10, 2020, has not yet published. Inventors: Li et al.
U.S. Appl. No. 16/751,561, filed Jan. 24, 2020, has not yet published. Inventor: Li.
U.S. Appl. No. 16/751,586, filed Jan. 24, 2020, has not yet published. Inventor: Li et al.
Adachi, C. et al., "High-efficiency organic electrophosphorescent devices with tris(2-phenylpyridine)iridium doped into electron-transporting materials", Applied Physics Letters, Aug. 2000, vol. 77, No. 6, pp. 904-906 <DOI:10.1063/1.1306639>.
Baldo et al., "Very high-efficiency green organic light-emitting devices based on electrophosphorescence," Appl. Phys. Lett., vol. 75, No. 3, 4-6 (1999).

(56) References Cited

OTHER PUBLICATIONS

Baldo et al., Very High-Efficiency Green Organic Light-Emitting Devices Based on Electrophosphorescence, Appl Phys Lett, 75(3):4-6 (1999).
Baldo, M. et al., "Excitonic singlet-triplet ratio in a semiconducting organic thin film", Physical Review B, Nov. 1999, vol. 60, No. 20, pp. 14422-14428 <DOI:10.1103/PhysRevB.60.14422>.
Baldo, M. et al., "High-efficiency fluorescent organic light-emitting devices using a phosphorescent sensitizer", Nature, Feb. 2000, vol. 403, pp. 750-753.
Berson et al. (2007). "Poly(3-hexylthiophene) fibers for photovoltaic applications," Adv. Funct. Mat., 17, 1377-84.
Bouman et al. (1994). "Chiroptical properties of regioregular chiral polythiophenes," Mol. Cryst. Liq. Cryst., 256, 439-48.
Bronner; Dalton Trans., 2010, 39, 180-184. DOI: 10.1039/b908424j (Year: 2010) (5 pages).
Brooks, J. et al., "Synthesis and Characterization of Phosphorescent Cyclometalated Platinum Complexes", Inorganic Chemistry, May 2002, vol. 41, No. 12, pp. 3055-3066 <DOI:10.1021/ic0255508>.
Brown, A. et al., "Optical spectroscopy of triplet excitons and charged excitations in poly(p-phenylenevinylene) light-emitting diodes", Chemical Physics Letters, Jul. 1993, vol. 210, No. 1-3, pp. 61-66 <DOI:10.1016/0009-2614(93)89100-V>.
Burroughes, J. et al., "Light-emitting diodes based on conjugated polymers", Nature, Oct. 1990, vol. 347, pp. 539-541.
Campbell et al. (2008). "Low-temperature control of nanoscale morphology for high performance polymer photovoltaics," Nano Lett., 8, 3942-47.
Chen, F. et al., "High-performance polymer light-emitting diodes doped with a red phosphorescent iridium complex", Applied Physics Letters, Apr. 2002 [available online Mar. 2002], vol. 80, No. 13, pp. 2308-2310 <10.1063/1.1462862>.
Chen, X., et al., "Fluorescent Chemosensors Based on Spiroring-Opening of Xanthenes and Related Derivatives", Chemical Reviews, 2012 [available online Oct. 2011], vol. 112, No. 3, pp. 1910-1956 <DOI:10.1021/cr200201z>.
Chow; Angew. Chem. Int. Ed. 2013, 52, 11775-11779. DOI: 10.1002/anie.201305590 (Year: 2013) (5 pages).
Coakley et al. (2004). "Conjugated polymer photovoltaic cells," Chem. Mater., 16, 4533-4542.
Colombo, M. et al., "Synthesis and high-resolution optical spectroscopy of bis[2-(2-thienyl)pyridinato-C3,N'](2,2'-bipyridine)iridium(III)", Inorganic Chemistry, Jul. 1993, vol. 32, No. 14, pp. 3081-3087 <DOI:10.1021/ic00066a019>.
D'Andrade, B. et al., "Operational stability of electrophosphorescent devices containing p and n doped transport layers", Applied Physics Letters, Nov. 2003, vol. 83, No. 19, pp. 3858-3860 <DOI:10.1063/1.1624473>.
Dorwald, Side Reactions in Organic Synthesis 2005, Wiley:VCH Weinheim Preface, pp. 1-15 & Chapter 1, pp. 279-308.
Dsouza, R., et al., "Fluorescent Dyes and Their Supramolecular Host/Guest Complexes with Macrocycles in Aqueous Solution", Oct. 2011, vol. 111, No. 12, pp. 7941-7980 <DOI:10.1021/cr200213s>.
Finikova,M.A. et al., New Selective Synthesis of Substituted Tetrabenzoporphyris, Doklady Chemistry, 2003, vol. 391, No. 4-6, pp. 222-224.
Fuchs, C. et al., "Enhanced light emission from top-emitting organic light-emitting diodes by optimizing surface plasmon polariton losses", arXiv, submitted Mar. 2015, 11 pages, arXiv:1503.01309.
Fuchs, C. et al., "Enhanced light emission from top-emitting organic light-emitting diodes by optimizing surface plasmon polariton losses", Physical Review B, Dec. 2015, vol. 92, No. 24, pp. 245306-1-245306-10 <DOI:10.1103/PhysRevB.92.245306>.
Galanin et al. Synthesis and Properties of meso-Phenyl-Substituted Tetrabenzoazaporphines Magnesium Complexes. Russian Journal of Organic Chemistry (Translation of Zhurnal Organicheskoi Khimii) (2002), 38(8), 1200-1203.

Galanin et al., meso-Phenyltetrabenzoazaporphyrins and their zinc complexes. Synthesis and spectral properties, Russian Journal of General Chemistry (2005), 75(4), 651-655.
Gather, M. et al., "Recent advances in light outcoupling from white organic light-emitting diodes," Journal of Photonics for Energy, May 2015, vol. 5, No. 1, 057607-1-057607-20 <DOI:10.1117/1.JPE.5.057607>.
Gong et al., Highly Selective Complexation of Metal Ions by the Self-Tuning Tetraazacalixpyridine macrocycles, Tetrahedron, 65(1): 87-92 (2009).
Gottumukkala,V. et al., Synthesis, cellular uptake and animal toxicity of a tetra carboranylphenyl N-tetrabenzoporphyr in, Bioorganic &Medicinal Chemistry, 2006, vol. 14, pp. 1871-1879.
Graf, A. et al., "Correlating the transition dipole moment orientation of phosphorescent emitter molecules in OLEDs with basic material properties", Journal of Materials Chemistry C, Oct. 2014, vol. 2, No. 48, pp. 10298-10304 <DOI:10.1039/c4tc00997e>.
Hansen (1969). "The universality of the solubility parameter," I & EC Product Research and Development, 8, 2-11.
Hatakeyama, T. et al., "Ultrapure Blue Thermally Activated Delayed Fluorescence Molecules: Efficient HOMO-LUMO Separation by the Multiple Resonance Effect", Advanced Materials, Apr. 2016, vol. 28, No. 14, pp. 2777-2781, <DOI:10.1002/adma.201505491>.
Holmes, R. et al., "Efficient, deep-blue organic electrophosphorescence by guest charge trapping", Applied Physics Letters, Nov. 2003 [available online Oct. 2003], vol. 83, No. 18, pp. 3818-3820 <DOI:10.1063/1.1624639>.
Imre et al. (1996). "Liquid-liquid demixing ffrom solutions of polystyrene. 1. A review. 2. Improved correlation with solvent properties," J. Phys. Chem. Ref. Data, 25, 637-61.
Jeong et al. (2010). "Improved efficiency of bulk heterojunction poly (3-hexylthiophene):[6,6]-phenyl-C61-butyric acid methyl ester photovoltaic devices using discotic liquid crystal additives," Appl. Phys. Lett.. 96, 183305. (3 pages).
Kim et al (2009). "Altering the thermodynamics of phase separation in inverted bulk-heterojunction organic solar cells," Adv. Mater., 21, 3110-15.
Kim et al. (2005). "Device annealing effect in organic solar cells with blends of regioregular poly (3-hexylthiophene) and soluble fullerene," Appl. Phys. Lett. 86, 063502. (3 pages).
Kim, HY. et al., "Crystal Organic Light-Emitting Diodes with Perfectly Oriented Non-Doped Pt-Based Emitting Layer", Advanced Functional Materials, Feb. 2016, vol. 28, No. 13, pp. 2526-2532 <DOI:10.1002/adma.201504451>.
Kim, JJ., "Setting up the new efficiency limit of OLEDs; Abstract" [online], Electrical Engineering—Princeton University, Aug. 2014 [retrieved on Aug. 24, 2016], retrieved from the internet: <URL:http://ee.princeton.edu/events/setting-new-efficiency-limit-oled> 2 pages.
Kim, SY. et al., "Organic Light-Emitting Diodes with 30% External Quantum Efficiency Based on a Horizontally Oriented Emitter", Advanced Functional Materials, Mar. 2013, vol. 23, No. 31, pp. 3896-3900 <DOI:10.1002/adfm.201300104 >.
Kroon et al. (2008). "Small bandgap olymers for organic solar cells," Polymer Reviews, 48, 531-82.
Kwong, R. et al., "High operational stability of electrophosphorescent devices", Applied Physics Letters, Jul. 2002 [available online Jun. 2002], vol. 81, No. 1, pp. 162-164 <DOI:10.1063/1.1489503>.
Lamansky, S. et al., "Cyclometalated Ir complexes in polymer organic light-emitting devices", Journal of Applied Physics, Aug. 2002 [available online Jul. 2002], vol. 92, No. 3, pp. 1570-1575 <10.1063/1.1491587>.
Lamansky, S. et al., "Synthesis and Characterization of Phosphorescent Cyclometalated Iridium Complexes", Inorganic Chemistry, Mar. 2001, vol. 40, No. 7, pp. 1704-1711 <DOI:10.1021/ic0008969>.
Lampe, T. et al., "Dependence of Phosphorescent Emitter Orientation on Deposition Technique in Doped Organic Films", Chemistry of Materials, Jan. 2016, vol. 28, pp. 712-715 <DOI:10.1021/acs.chemmater.5b04607>.
Lee et al. (2008). "Processing additives for inproved efficiency from bulk heterojunction solar cells," J. Am. Chem. Soc, 130, 3619-23.

(56) References Cited

OTHER PUBLICATIONS

Li et al. (2005). "Investigation of annealing effects and film thickness dependence of polymer solar cells based on poly (3-hexylthiophene)," J. Appl. Phys., 98, 043704. (5 pages).
Li et al. (2007). "Solvent annealing effect in polymer solar cells based on poly(3-hexylthiophene) and methanofullerenes," Adv. Funct. Mater, 17, 1636-44.
Li, J. et al., "Synthesis and characterization of cyclometalated Ir(III) complexes with pyrazolyl ancillary ligands", Polyhedron, Jan. 2004, vol. 23, No. 2-3, pp. 419-428 <DOI:10.1016/j.poly.2003.11.028>.
Li, J., "Efficient and Stable OLEDs Employing Square Planar Metal Complexes and Inorganic Nanoparticles", in DOE SSL R&D Workshop (Raleigh, North Carolina, 2016), Feb. 2016, 15 pages.
Li, J., et al., "Synthetic Control of Excited-State Properties in Cyclometalated Ir(III) Complexes Using Ancillary Ligands", Inorganic Chemistry, Feb. 2005, vol. 44, No. 6, pp. 1713-1727 <DOI:10.1021/ic048599h>.
Liang, et al. (2010). "For the bright future-bulk heterojunction polymer solar cells with power conversion efficiency of 7.4%," Adv. Mater. 22, E135-38.
Lin, TA et al., "Sky-Blue Organic Light Emitting Diode with 37% External Quantum Efficiency Using Thermally Activated Delayed Fluorescence from Spiroacridine-Triazine Hybrid", Advanced Materials, Aug. 2016, vol. 28, No. 32, pp. 6876-6983 <DOI:10.1002/adma.201601675>.
Markham, J. et al., "High-efficiency green phosphorescence from spin-coated single-layer dendrimer light-emitting diodes", Applied Physics Lettersm Apr. 2002, vol. 80, vol. 15, pp. 2645-2647 <DOI:10.1063/1.1469218>.
Michl, J., "Relationship of bonding to electronic spectra", Accounts of Chemical Research, May 1990, vol. 23, No. 5, pp. 127-128 <DOI:10.1021/ar00173a001>.
Miller, R. et al., "Polysilane high polymers", Chemical Reviews, Sep. 1989, vol. 89, No. 6, pp. 1359-1410 <DOI:10.1021/cr00096a006>.
Morana et al. (2007). "Organic field-effect devices as tool to characterize the bipolar transport in polymer-fullerene blends: the case of P3HT-PCBM," Adv. Funct. Mat., 17, 3274-83.
Moule et al. (2008). "Controlling morphology in Polymer-Fullerene mixtures," Adv. Mater., 20, 240-45.
Nazeeruddin, M. et al., "Highly Phosphorescence Iridium Complexes and Their Application in Organic Light-Emitting Devices", Journal of the American Chemical Society, Jun. 2003, vol. 125, No. 29, pp. 8790-8797 <DOI:10.1021/ja021413y>.
Nillson et al. (2007). "Morphology and phase segregation of spin-casted films of polyfluorene/PCBM Blends," Macromolecules, 40, 8291-8301.
Olynick et al. (2009). "The link between nanoscale feature development in a negative resist and the Hansen solubility sphere," Journal of Polymer Science: Part B: Polymer Physics, 47, 2091-2105.
Peet et al. (2007). "Efficiency enhancement in low-bandgap polymer solar cells by processing with alkane dithiols," Nature Materials, 6, 497-500.
Pivrikas et al. (2008). "Substituting the postproduction treatment for bulk-heterojunction solar cells using chemical additives," Organic Electronics, 9, 775-82.
Results from SciFinder Compound Search on Dec. 8, 2016. (17 pages).
Rui Zhu et al., "Color tuning based on a six-membered chelated iridium (III) complex with aza-aromatic ligand,", Chemistry Letters, vol. 34, No. 12, 2005, pp. 1668-1669.
Sajoto, T. et al., "Temperature Dependence of Blue Phosphorescent Cyclometalated Ir(III) Complexes", Journal of the American Chemical Society, Jun. 2009, vol. 131, No. 28, pp. 9813-9822 <DOI:10.1021/ja903317w>.
Sakai, Y. et al., "Simple model-free estimation of orientation order parameters of vacuum-deposited and spin-coated amorphous films used in organic light-emitting diodes", Applied Physics Express, Aug. 2015, vol. 8, No. 9, pp. 096601-1-096601-4 <DOI:10.7567/APEX.8.096601>.
Saricifci et al. (1993). "Semiconducting polymerbuckminsterfullerene heterojunctions: diodes photodiodes, and photovoltaic cells," Appl. Phys. Lett., 62, 585-87.
Saunders et al. (2008). "Nanoparticle-polymer photovoltaic cells," Advances in Colloid and Interface Science, 138, 1-23.
Senes, A. et al., "Transition dipole moment orientation in films of solution processed fluorescent oligomers: investigating the influence of molecular anisotropy", Journal of Materials Chemistry C, Jun. 2016, vol. 4, No. 26, pp. 6302-6308 <DOI:10.1039/c5tc03481g>.
Shin et al. (2010). "Abrupt morphology change upon thermal annealing in Poly(3-hexathiophene)/soluble fullerene blend films for polymer solar cells," Adv. Funct. Mater., 20, 748-54.
Strouse, G. et al., "Optical Spectroscopy of Single Crystal [Re(bpy)(CO)4](PF6): Mixing between Charge Transfer and Ligand Centered Excited States", Inorganic Chemistry, Oct. 1995, vol. 34, No. 22, pp. 5578-5587 <DOI:10.1021/ic00126a031>.
Tang, C. et al., "Organic electroluminescent diodes", Applied Physics Letters, Jul. 1987, vol. 51, No. 12, pp. 913-915 <DOI:10.1063/1.98799>.
Tsuoboyama, A. et al., "Homoleptic Cyclometalated Iridium Complexes with Highly Efficient Red Phosphorescence and Application to Organic Light-Emitting Diode", Journal of the American Chemical Society, Sep. 2003, vol. 125, No. 42, pp. 12971-12979 <DOI:10.1021/ja034732d>.
Turro, N., "Modern Molecular Photochemistry" (Sausalito, California, University Science Books, 1991), p. 48. (3 pages).
U.S. Appl. No. 16/668,010, filed Oct. 30, 2019.
U.S. Appl. No. 16/739,480, filed Jan. 10, 2020.
U.S. Appl. No. 61/692,937.
U.S. Appl. No. 61/719,077.
V. Thamilarasan et al., "Green-emitting phosphorescent iridium(III) complex: Structural, photophysical and electrochemical properties," Inorganica Chimica Acta, vol. 408, 2013, pp. 240-245.
Wang et al. (2010). "The development of nanoscale morphology in polymer: fullerene photovoltaic blends during solvent casting," Soft Matter, 6, 4128-4134.
Wang et al., C(aryl)-C(alkyl) bond formation from Cu(ClO4)2-mediated oxidative cross coupling reaction between arenes and alkyllithium reagents through structurally well-defined Ar—Cu(III) intermediates, Chem Commun, 48: 9418-9420 (2012).
Williams, E. et al., "Excimer Based White Phosphorescent Organic Light Emitting Diodes with Nearly 100 % Internal Quantum Efficiency", Advanced Materials, Jan. 2007, vol. 19, No. 2, pp. 197-202 <DOI:10.1002/adma.200602174>.
Williams, E. et al., "Organic light-emitting diodes having exclusive near-infrared electrophosphorescence", Applied Physics Letters, Aug. 2006, vol. 89, No. 8, pp. 083506-1-083506-3 <DOI:10.1063/1.2335275>.
Yakubov, L.A. et al., Synthesis and Properties of Zinc Complexes of mesoHexadecyloxy-Substituted Tetrabenzoporphyrin and Tetrabenzoazaporphyrins, Russian Journal of Organic Chemistry, 2008, vol. 44, No. 5, pp. 755-760.
Yang et al. (2005). "Nanoscale morphology of high-performance polymer solar cells," Nano Lett., 5, 579-83.
Yang, X. et al., "Efficient Blue and White Emitting Electrophosphorescent Devices Based on Platinum(II) [1,3 Difluoro 4,6 di(2 pyridinyl)benzene] Chloride", Advanced Materials, Jun. 2008, vol. 20, No. 12, pp. 2405-2409 <DOI:10.1002/adma.200702940>.
Yao et al. (2008). "Effect of solvent mixture on nanoscale phase separation in polymer solar cells," Adv. Funct. Mater.,18, 1783-89.
Yao et al., Cu(ClO4)2-Mediated Arene C—H Bond Halogenations of Azacalixaromatics Using Alkali Metal Halides as Halogen Sources, The Journal of Organic Chemistry, 77(7): 3336-3340 (2012).
Yu et al. (1995). "Polymer Photovoltaic Cells: Enhanced efficiencies via a network of internal donor-acceptor heterojunctions," Science, 270, 1789-91.

(56) References Cited

OTHER PUBLICATIONS

Zhu, W. et al., "Highly efficient electrophosphorescent devices based on conjugated polymers doped with iridium complexes", Applied Physics Letters, Mar. 2002, vol. 80, No. 12, pp. 2045-2047 <DOI:10.1063/1.1461418>.

* cited by examiner

ORGANIC LIGHT EMITTING DIODE WITH SPLIT EMISSIVE LAYER

CROSS-REFERENCE TO RELATED APPLICATION

This application claims the benefit of U.S. Patent Application No. 62/435,455 entitled "ORGANIC LIGHT EMITTING DIODE WITH SPLIT EMISSIVE LAYER" and filed on Dec. 16, 2016, which is hereby incorporated by reference in its entirety.

STATEMENT OF GOVERNMENT INTEREST

This invention was made with government support under DE-EE0007090 awarded by the Department of Energy. The government has certain rights in the invention.

TECHNICAL FIELD

This invention relates organic light emitting diodes with multiple emissive layers.

BACKGROUND

Organic light emitting diodes (OLEDs) have shown promise as a potential replacement for existing lighting technologies due to their efficiencies, potential for low cost and scalable production, and compatibility with flexible substrates. Through continuous improvements in device designs and by employing phosphorescent iridium, palladium or platinum emitters, OLEDs with high efficiencies and high color quality have been achieved.

Nevertheless, major challenges still remain, including the deficiency of an efficient and stable phosphorescent blue emitter and the cost prohibitive nature of typical multilayer OLED structures. The relatively complex multilayer structure typically used in high performance OLEDs may complicate the goal of low cost fabrication. Devices employing platinum complexes can achieve emission spanning the visible spectrum while also achieving high efficiencies by utilizing phosphorescent excimers. However, these devices have limited operational lifetimes. OLEDs fabricated with platinum and iridium complexes can have insufficient blue emission and inefficient excimer emission.

SUMMARY

In a first general aspect, an organic light emitting diode device includes an emissive layer having a first sublayer with a first emitter as a dopant, a second sublayer having a second emitter as a dopant, and a third sublayer having a third emitter as a dopant. The second sublayer is between the first sublayer and the third sublayer. A concentration of the first emitter in the first sublayer exceeds a concentration of the third emitter in the third sublayer, and the concentration of the third emitter in the third sublayer exceeds a concentration of the second emitter in the second sublayer.

Implementations of the first general aspect may include one or more of the following features.

The first sublayer may be in direct contact with the second sublayer. The second sublayer may be in direct contact with the third sublayer. The concentration of the first emitter in the first sublayer may be in a range of about 12 wt % to about 50 wt %. The concentration of the second emitter in the second sublayer may be in a range of about 1 wt % to about 6 wt %. The concentration of the third emitter in the third sublayer may be in a range of about 4 wt % and about 15 wt %. The first sublayer typically has a thickness of at least about 4 nm. A thickness of the second sublayer is typically at least about 1 nm or at least about 2 nm. A thickness of the third sublayer is typically at least about 4 nm or at least about 6 nm.

The device may include a hole-transporting layer and an electron-transporting layer, with the emissive layer between the hole-transporting layer and the electron-transporting layer. The emissive layer may be in direct contact with the hole-transporting layer and the electron-transporting layer. The device may include an electron-blocking layer and a hole-blocking layer, with the electron-blocking layer between the emissive layer and the hole-transporting layer, and the hole-blocking layer between the emissive layer and the electron-transporting layer.

In some cases, the emissive layer includes four or more sublayers, five or more sublayers, six or more sublayers, or seven or more sublayers, each sublayer comprising an emitter as a dopant.

In one implementation, the emissive layer of the first general aspect further includes a fourth sublayer with a fourth emitter and a fifth sublayer with a fifth emitter. The fourth sublayer is between the second sublayer and the fifth sublayer, and the fifth sublayer is between the fourth sublayer and the third sublayer. A concentration of the fourth emitter in the fourth sublayer exceeds the concentration of the second emitter in the second sublayer, the concentration of the third emitter in the third sublayer, and a concentration of the fifth emitter in the fifth sublayer. The concentration of the third emitter in the third sublayer exceeds the concentration of the fifth emitter in the fifth sublayer. The concentration of the fourth emitter in the fourth sublayer may be substantially the same as the concentration of the first emitter in the first sublayer. The concentration of the fifth emitter in the fifth sublayer may be substantially the same as the concentration of the second emitter in the second sublayer. The concentration of the fourth emitter in the fourth sublayer may be in a range of about 12 wt % to about 50 wt %. The concentration of the fifth emitter in the fifth sublayer may be in a range of about 1 wt % to about 6 wt %.

In some implementations, the first sublayer is between the hole-transporting layer and the second sublayer; the second sublayer is between the first sublayer and the fourth sublayer; the fourth sublayer is between the second sublayer and the fifth sublayer; the fifth sublayer is between the fourth sublayer and the third sublayer; the third sublayer is between the fifth sublayer and the electron-transporting layer. In some implementations, the first sublayer is between the electron-transporting layer and the second sublayer; the second sublayer is between the first sublayer and the fourth sublayer; the fourth sublayer is between the second sublayer and the fifth sublayer; the fifth sublayer is between the fourth sublayer and the third sublayer; and the third sublayer is between the fifth sublayer and the hole-transporting layer.

The device of the first general aspect may be a phosphorescent organic light emitting diode device.

In a second general aspect, a photovoltaic device includes the device of the first general aspect.

In a third general aspect, a luminescent display device includes the device of the first general aspect.

DETAILED DESCRIPTION

Figure 1:
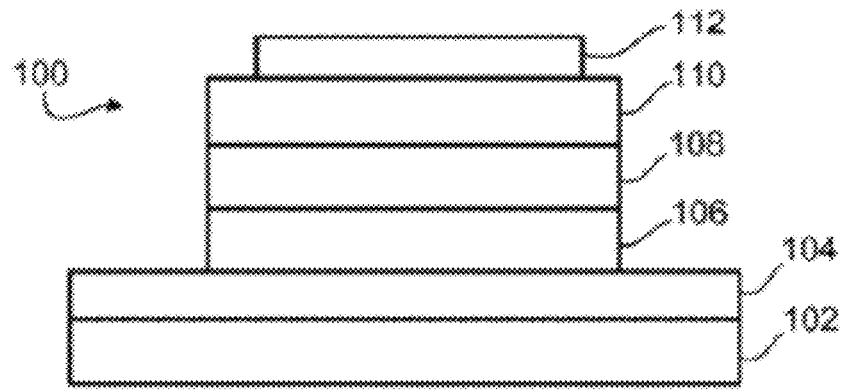
FIG. 1 is a cross-sectional view of an OLED.

Referring to FIG. 1, OLED 100 includes substrate 102, anode 104, hole-transporting layer 106, light-processing layer or emissive layer 108, electron-transporting layer 110, and cathode 112. Anode 104 is typically a transparent material, such as indium tin oxide, and cathode 112 is typically metal. Light-processing layer 108 typically includes an emitter. The emitter may be present as a dopant in a host material.

Figure 2:
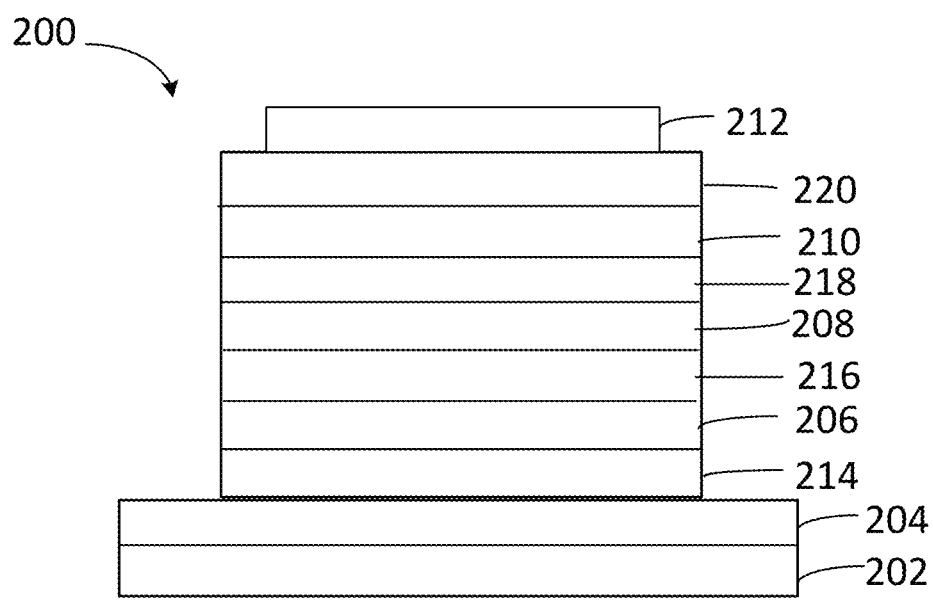
FIG. 2 is a cross-sectional view of an OLED with a split emissive layer.

FIG. 2 depicts OLED 200 having substrate 202, anode 204, hole-transporting layer 206, light-processing layer 208, electron-transporting layer 210, and cathode 212. Hole-injecting layer 214 is between or in direct contact with anode 204 and hole-transporting layer 206. Electron-blocking layer 216 is between or in direct contact with hole-transporting layer 206 and light-processing layer 208. Hole-blocking layer 218 is between or in direct contact with light-processing layer 208 and electron-transporting layer 210. Electron-injecting layer 220 is between or in direct contact with electron-transporting layer 210 and cathode 112. Light-processing layer 208 is a split emissive layer. As used herein, "split emissive layer" generally refers to a light-processing or emissive layer that includes two or more sublayers, each sublayer having an emitter and a host, each sublayer directly contacting another sublayer in the split emissive layer, with sublayers in direct contact having a different concentration of the emitter in the host material. The emitter in a first sublayer may be the same as or different than the emitter in a second sublayer. A thickness of a first sublayer may be the same as or different than the thickness of a second sublayer in the emissive layer.

Each sublayer in light-processing layer 208 may include one or more emitters, such as complexes of the present disclosure, together with a host material. The host material can be any suitable host material known in the art. The emission color of an OLED is determined by the emission energy (optical energy gap) of an emitter in light-processing layer 208, which can be tuned by tuning the electronic structure of the emitter, the host material, or both. The hole-transporting material in hole-transporting layer 206 and the electron-transporting material(s) in electron-transporting layer 210 may include any suitable charge-transporting material known in the art.

Figure 3:
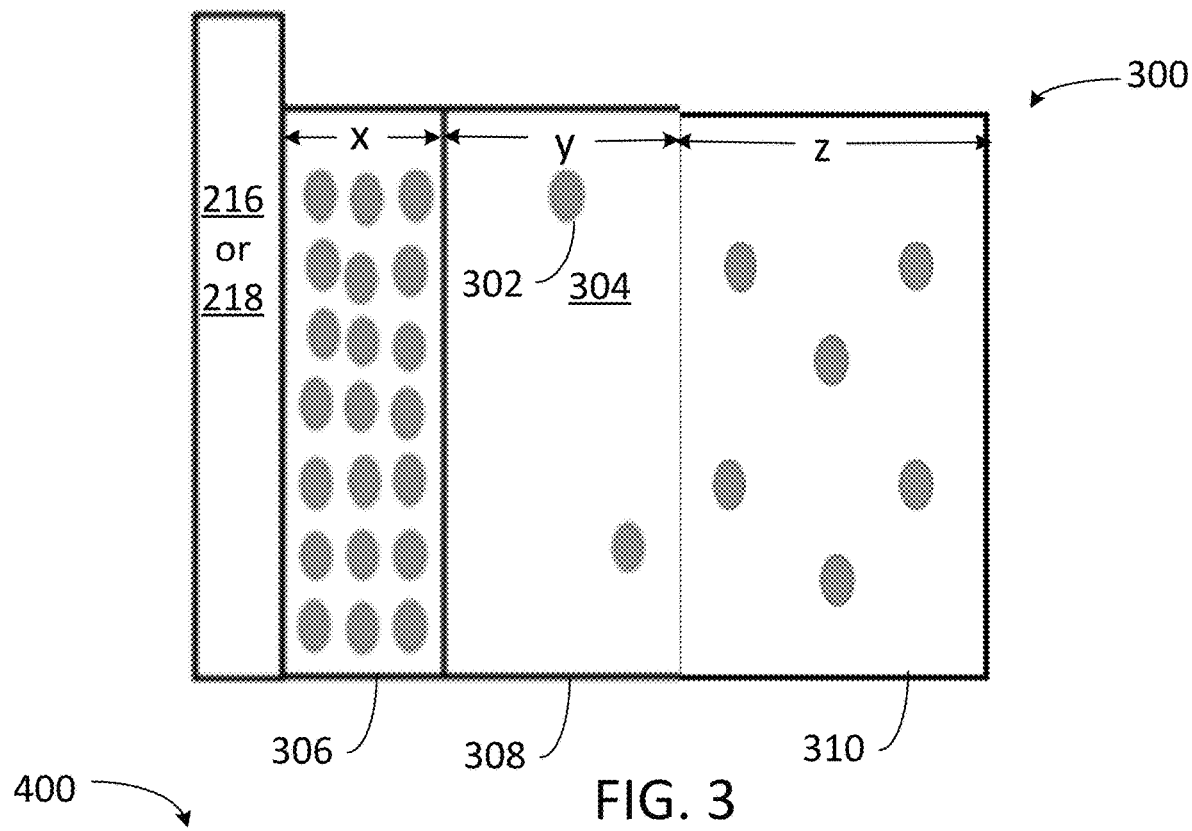
FIG. 3 is a cross-sectional view of a split emissive layer.

FIG. 3 depicts a split emissive layer 300. Split emissive layer 300 may serve as emissive layer 208 of OLED 200 in FIG. 2. Split emissive layer 300 includes emitter 302 as a dopant in host 304. First sublayer 306 provides charge transport to shift the recombination zone away from an interface of the emissive layer, such as an interface with electron-blocking layer or 216 or hole-blocking layer 218 of OLED 200. A majority of emission from split emissive layer 300 may be attributed to the emission from first sublayer 306. A concentration of the emitter (or dopant) in host of first sublayer 306 ranges from about 12 wt % to about 50 wt %, or from about 15 wt % to about 40 wt %. A thickness x of sublayer 300 is at least about 4 nm.

Second sublayer 308 serves as a spacer layer that emits preferential monomer emissions (e.g., blue light). A concentration of the emitter (or dopant) 302 in host 304 of second sublayer 308 ranges from about less than about 1 wt % or about 1 wt % to about 6 wt %, or from about 1 wt % to about 4 wt %. A thickness y of second sublayer 308 is at least about 1 nm or at least about 2 nm.

Third sublayer 310 serves as a spacer that balances charge and keeps the recombination deep inside split emissive layer 300. A concentration of the emitter (or dopant) 302 in host 304 of third sublayer 310 from about 4 wt % to about 15 wt % or from about to 6% to about 12 wt %. A thickness z of sublayer 304 is at least about 4 nm or at least about 6 nm.

As depicted in FIG. 3, second sublayer 308 is between or in direct contact with first sublayer 306 and third sublayer 310. Emitter 302 may include two or more different emitters. Emitter 302 is independently the same or different in each sublayer of split emissive layer 300. A concentration of the first emitter in first sublayer 306 exceeds a concentration of the third emitter in third sublayer 310, and the concentration of the third emitter in the third sublayer exceeds a concentration of the second emitter in second sublayer 308. A concentration of the first emitter in first sublayer 306 may be in a range of about 12 wt % to about 50 wt %. A concentration of the second emitter in second sublayer 308 may be in a range of about 1 wt % to about 6 wt %. A concentration of the third emitter in third sublayer 310 may be in a range of about 4 wt % and about 15 wt %. The first sublayer typically has a thickness x of at least about 4 nm. A thickness y of second sublayer 308 is typically at least about 1 nm or about 2 nm. A thickness z of third sublayer 310 is typically at least about 4 nm or about 6 nm.

Split emissive layer 300 may correspond to emissive layer 208 in OLED 200, with split emissive layer 300 between hole-transporting layer 206 and electron-transporting layer 210. Split emissive layer 300 may be in direct contact with the hole-transporting layer and the electron-transporting layer. OLED 200 may include electron-blocking layer 216 and hole-blocking layer 218, with the electron-blocking layer between split emissive layer 300 and hole-transporting layer 206, and the hole-blocking layer between the split emissive layer and electron-transporting layer 210.

In some cases, a split emissive layer includes four or more sublayers, five or more sublayers, six or more sublayers, or seven or more sublayers, each sublayer including one or more emitters as a dopant in a host material, with each emitter independently the same or different as other emitters in the split emissive layer.

Figure 4:
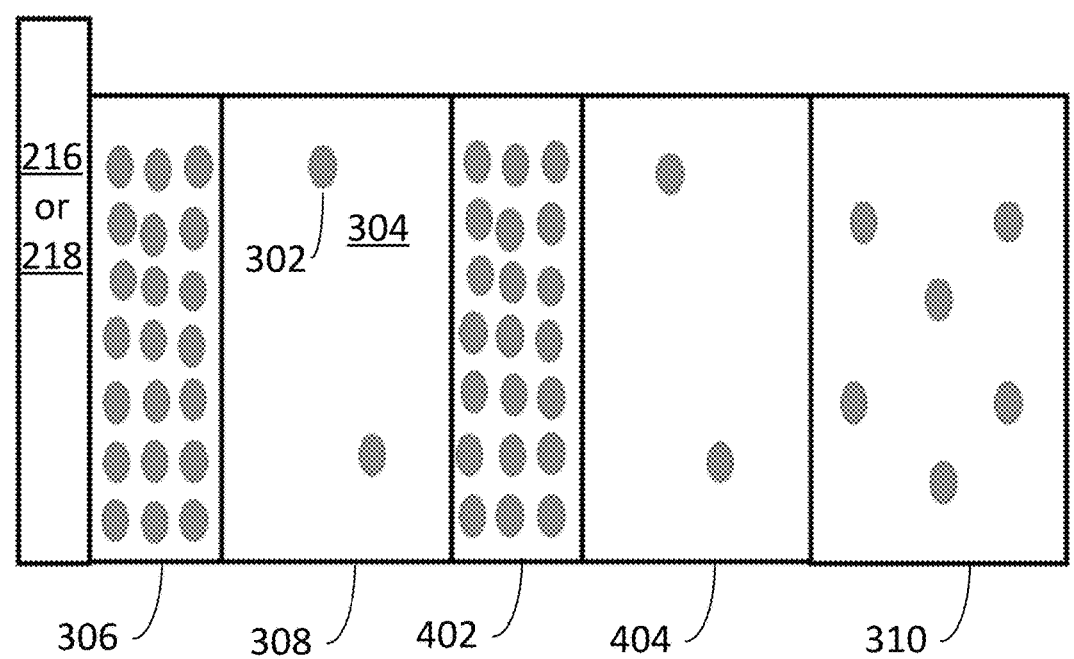
FIG. 4 is a cross-sectional view of a split emissive layer.

FIG. 4 depicts split emissive layer 400, which includes emitter 302, host 304, first sublayer 306, second sublayer 308, and third sublayer 310 of split emissive layer 300, as well as fourth sublayer 402 with a fourth emitter and fifth sublayer 404 with a fifth emitter. Fourth sublayer 402 is between or in direct contact with second sublayer 308 and fifth sublayer 404, and the fifth sublayer is between or in direct contact with the fourth sublayer and third sublayer 310. A concentration of the fourth emitter in fourth sublayer 402 exceeds the concentration of the second emitter in second sublayer 308, the concentration of the third emitter in third sublayer 310, and a concentration of the fifth emitter in fifth sublayer 404. The concentration of the third emitter in third sublayer 310 exceeds the concentration of the fifth emitter in fifth sublayer 404. The concentration of the fourth emitter in fourth sublayer 402 may be substantially the same as the concentration of the first emitter in first sublayer 306 (e.g., within 10%, within 5%, or within 1%). The concentration of the fifth emitter in fifth sublayer 404 may be substantially the same as the concentration of the second emitter in second sublayer 308 (e.g., within 10%, within 5%, or within 1%). The concentration of the fourth emitter in fourth sublayer 402 may be in a range of about 12 wt % to about 50 wt %. The concentration of the fifth emitter in fifth sublayer 404 may be in a range of about 1 wt % to about 6 wt %. A thickness of fourth sublayer 402 may be substantially the same as that of first sublayer 306 (e.g., within 10%, within 5%, or within 1%). A thickness of fifth sublayer 404 may be substantially the same as that of second sublayer 308 (e.g., within 10%, within 5%, or within 1%).

First sublayer 306 may be between or in direct contact with hole-blocking layer 218 and second sublayer 308; with the second sublayer between the first sublayer and fourth sublayer 402, the fourth sublayer between the second sublayer and fifth sublayer 404, the fifth sublayer between the fourth sublayer and third sublayer 310, the third sublayer between the fifth sublayer and electron-blocking layer 216. In some implementations, first sublayer 306 is between or in direct contact with electron-blocking layer 216 and second sublayer 308; the second sublayer is between the first sublayer and fourth sublayer 402; the fourth sublayer is between the second sublayer and fifth sublayer 404; the fifth sublayer is between the fourth sublayer and third sublayer 310; and the third sublayer is between the fifth sublayer and hole-blocking layer 218.

To fabricate a split (or layered) emissive layer, a thermal vapor deposition chamber with source shutters is used. By varying the direct current power applied to the heaters, suitable deposition ratios can be achieved. Once a desired ratio of host to emitter (or dopant) is attained, the source shutter is opened to allow the deposition of the specified layer. The source shutters are then closed and the process is repeated for each consecutive sublayer until the entire light-processing (emissive) layer is deposited.

With a split emissive layer that includes alternating layers of high dopant concentration and low dopant concentration, the monomer-excimer emission ratio and charge balance can be tuned, which improves the device external quantum efficiency (EQE) and brightness, and increases the luminescent stability of the device.

In some embodiments, a light-processing or emissive layer in an OLED includes:
a first sublayer including about 12 wt % to about 50 wt % of a first dopant;
a second sublayer including about 1 wt % to about 6 wt % of a second dopant; and
a third sublayer including about 4 wt % to about 15 wt % of a third dopant.
The first, second, and third dopants (or emitters) are independently the same or different. Light processing layer 208 is between or directly contacts electron-blocking layer 216 and hole-blocking layer 218. Electron-blocking layer 216 is between the light processing layer 208 and hole-transporting layer 206; and hole-blocking layer 218 is between light-processing layer 208 and electron-transporting layer 210.

A split emissive layer can include two or more layers, three or more layers, four or more layers, five or more layers, six or more layers, or seven or more layers of dopant.

In some implementations, the emissive layer includes:
a first sublayer including about 12% to about 50% of a first dopant;
a second sublayer including about 1 wt % to about 6 wt % of a second dopant;
a third sublayer including about 12 wt % to about 50 wt % of a first dopant;
a fourth sublayer including about 1 wt % to about 6 wt % of a second dopant; and
a fifth sublayer including about 4 wt % to about 15 wt % of a third dopant;
wherein the first sublayer is between a hole-transporting layer and the second sublayer; the second sublayer is between the first sublayer and the third sublayer; the third sublayer is between the second sublayer and the fourth sublayer; the fourth sublayer is between the third sublayer and the fifth sublayer; and the fifth sublayer is between the fourth sublayer and an electron-transporting layer.

In some embodiments, an OLED includes a first sublayer is between an electron-transporting layer and a second sublayer; the second sublayer is between the first sublayer and the third sublayer, the third sublayer is between the second sublayer and the fourth sublayer, the fourth sublayer is between the third sublayer and the fifth sublayer; and the fifth sublayer is between the fourth sublayer and a hole-transporting layer.

An OLED can further include an electron-blocking layer between a first sublayer of the emissive layer and a hole-transporting material. In some implementations, an OLED further includes a hole-blocking layer between a fifth sublayer and the electron-transporting layer. In other implementations, an OLED further includes an electron-blocking layer between the fifth sublayer and the hole-transporting material. The device further comprises a hole-blocking layer between the first sublayer and the electron-transporting layer.

A emissive sublayer having between about 12 wt % and about 50 wt % of a first dopant can have a thickness of about 4 nm or greater. An emissive sublayer including about 1 wt % to about 6 wt % of a second dopant can have a thickness between about 1 nm and about 2 nm. An emissive sublayer including about 4 wt % to about 15% of third dopant can have a thickness of about 4 to about 6 nm.

In certain implementations, dopants in emissive sublayers can be the same or different, and each can include one or more complexes as described in WO 2016/025921, which is incorporated herein by reference.

Dopants in emissive sublayers can be the same or different, and each can include one or more complexes of General Formula I:

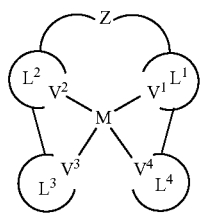

General Formula I where:

M is $Pd^{2+}$, $Ir^+$, $Rh^+$, or $Au^{3+}$;

each of $V^1$, $V^2$, $V^3$, and $V^4$ is coordinated to M and is independently N, C, P, B, or Si;

each of $L^1$, $L^2$, $L^3$, and $L^4$ is independently a substituted or unsubstituted aryl, cycloalkyl, cycloalkenyl, heterocyclyl, heteroaryl, carbene, or N-heterocyclic carbene; and Z is O, S, NR, $CR_2$, $SiR_2$, BR, PR,

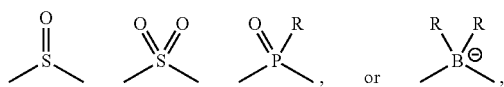

where each R is independently substituted or unsubstituted $C_1$-$C_4$ alkyl or aryl.

Dopants in an emissive sublayer can include one of the following structures:

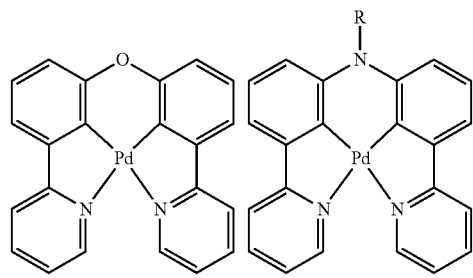

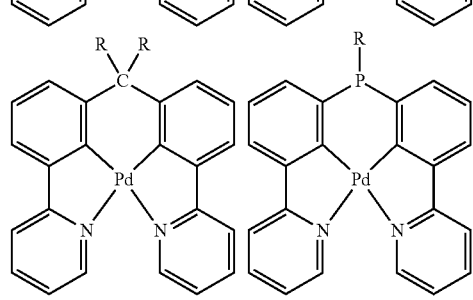

-continued

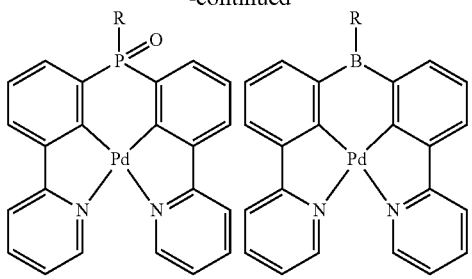

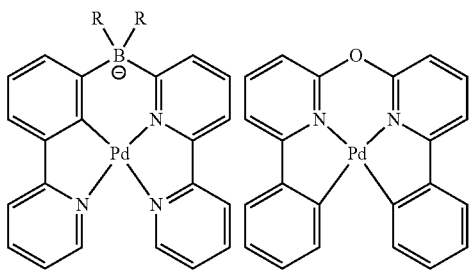

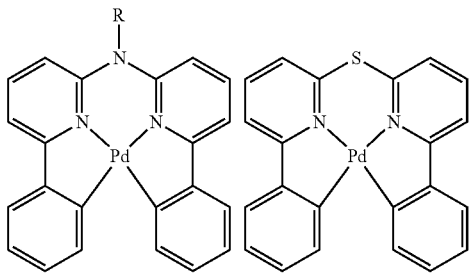

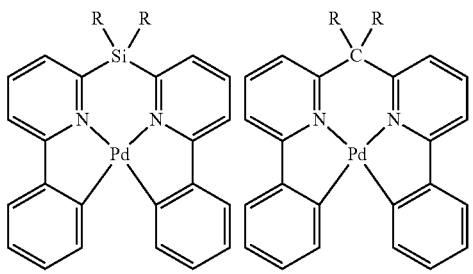

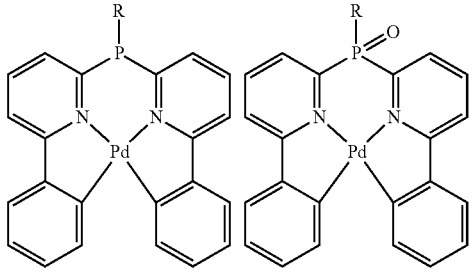

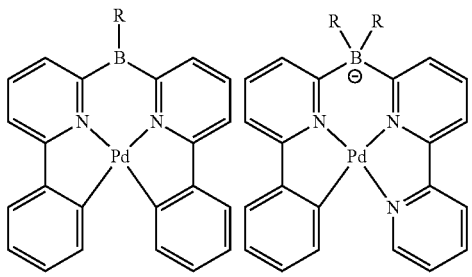

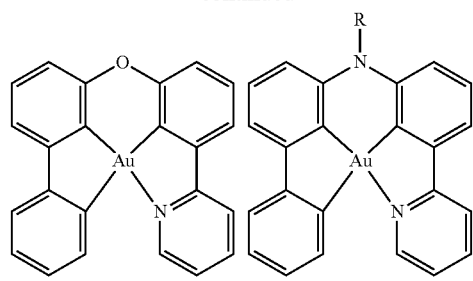
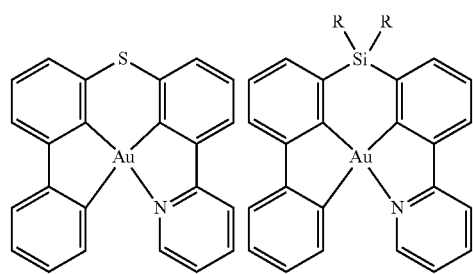
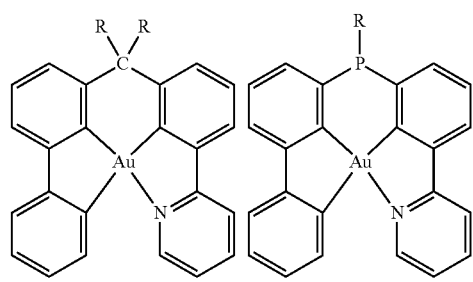
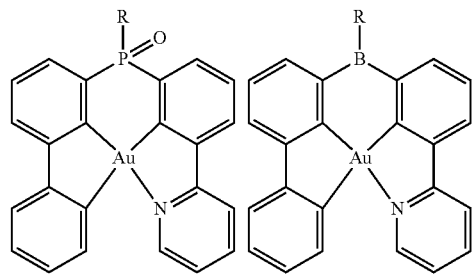
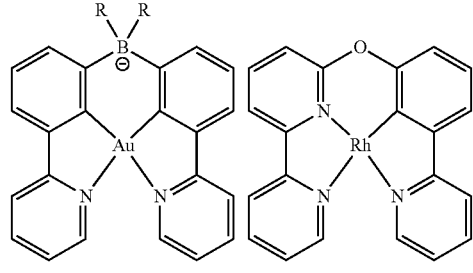
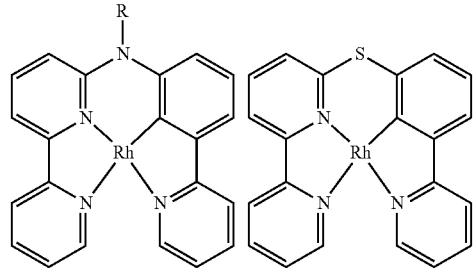
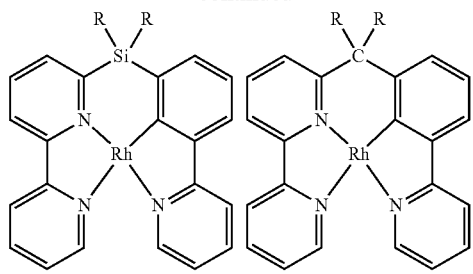
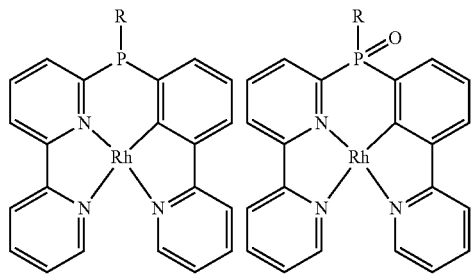
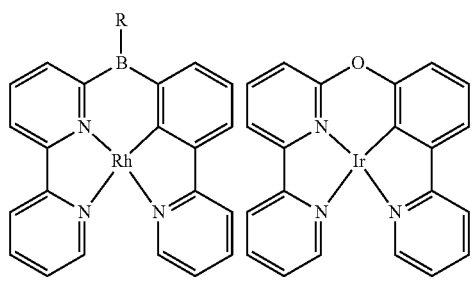
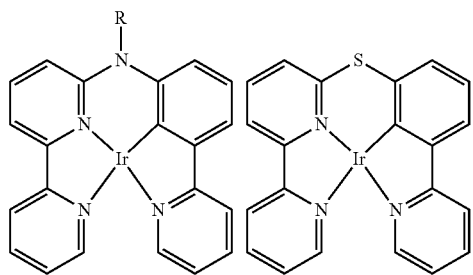
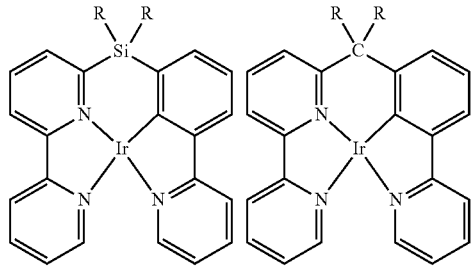
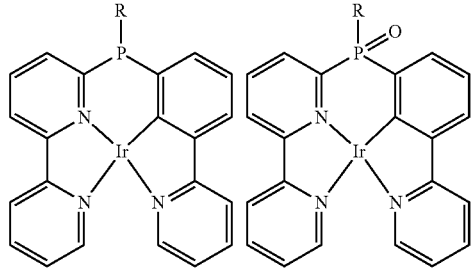

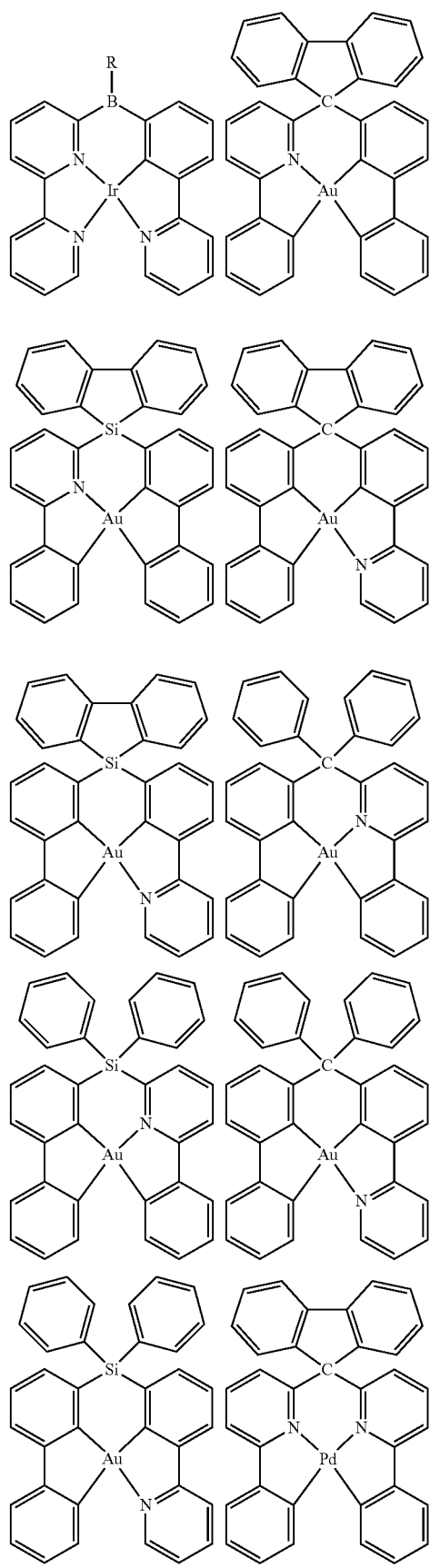
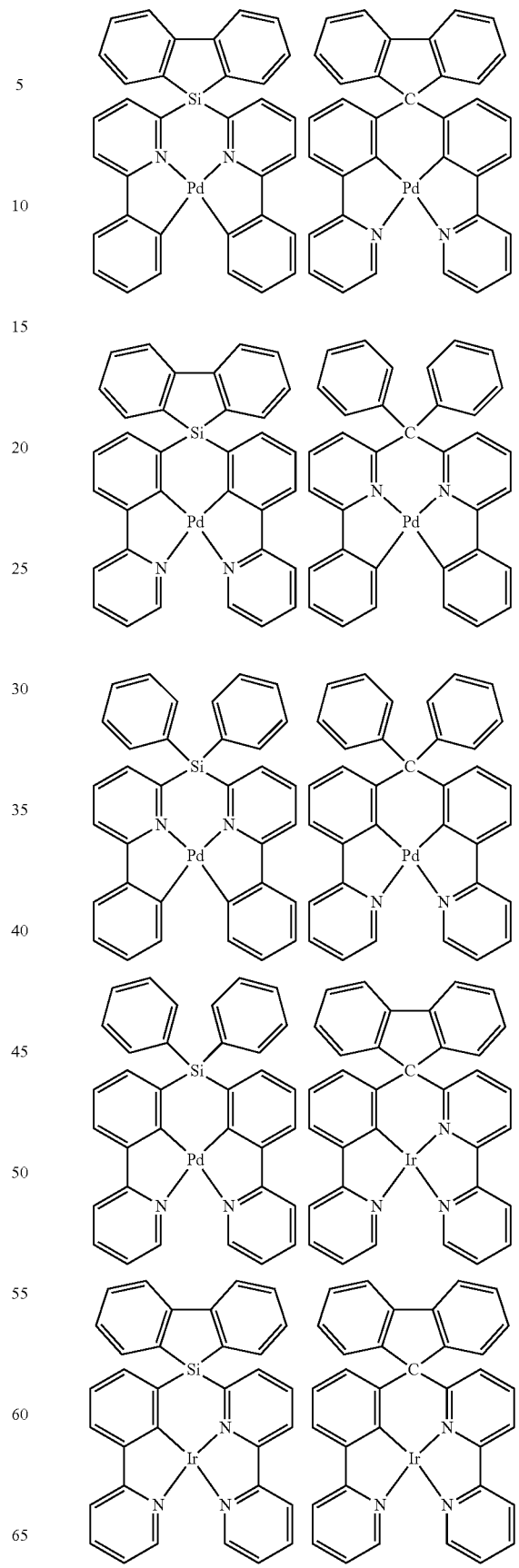

-continued

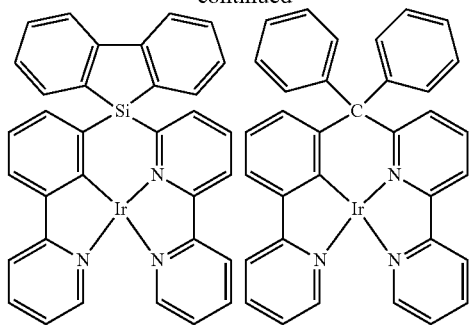

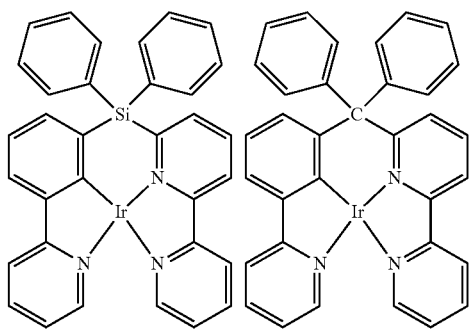

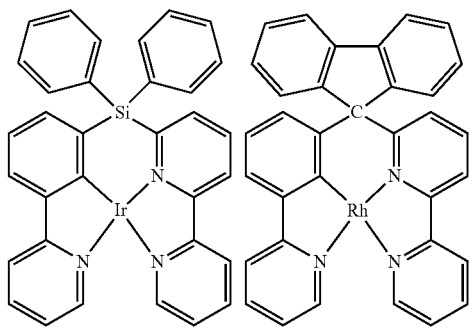

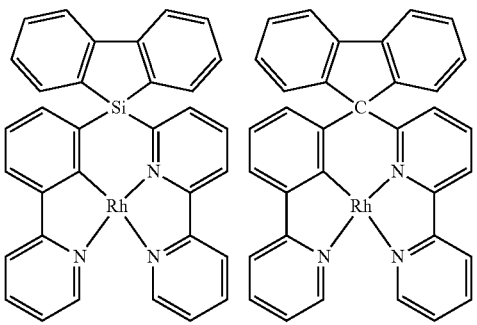

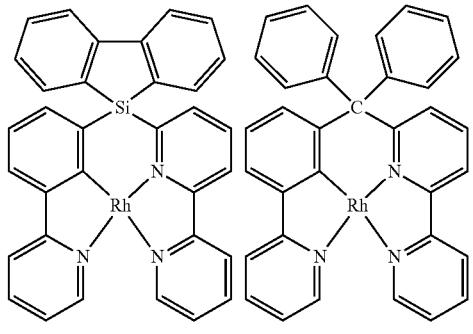

-continued

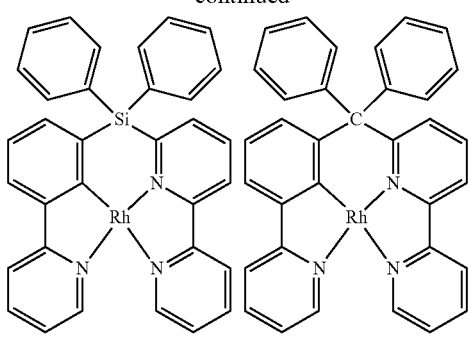

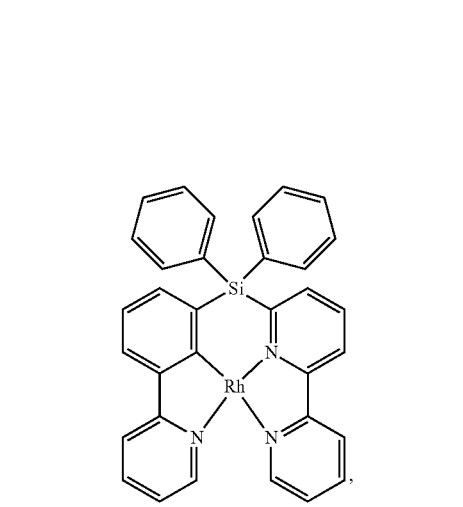

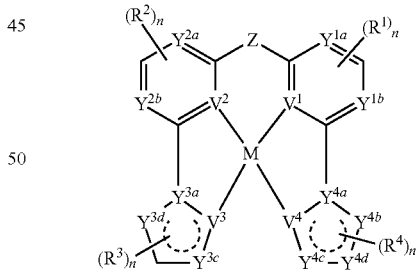

, wherein each R is independently hydrogen, hydroxyl, amino, nitro, thiol, or substituted or unsubstituted $C_1$-$C_4$ alkyl, alkoxy, or aryl, hydroxyl, amino, nitro, or thiol.

Dopants in an emissive sublayer can include one or more complexes of General Formula II:

General Formula II $$\begin{array}{c}(R^2)_n \quad Y^{2a} \quad Z \quad Y^{1a} \quad (R^1)_n \\ Y^{2b} \quad V^2 \quad V^1 \quad Y^{1b} \\ M \\ Y^{3a} \quad Y^{4a} \\ Y^{3d} \quad V^3 \quad V^4 \quad Y^{4b} \\ (R^3)_n \quad Y^{3c} \quad Y^{4c} - Y^{4d} \quad (R^4)_n\end{array}$$

where:

each $R^1$, $R^2$, $R^3$, and $R^4$ represents a non-hydrogen substituent and is independently substituted or unsubstituted $C_1$-$C_4$ alkyl or aryl;

each n is independently an integer of 0 to 3, valency permitting; and each of $Y^{1a}$, $Y^{2a}$, $Y^{1b}$, $Y^{2b}$, $Y^{3a}$, $Y^{3c}$, $Y^{3d}$, $Y^{4a}$, $Y^{4b}$, $Y^{4c}$, $Y^{4d}$ is independently N, $NR^{4a}$, or $CR^{4b}$, where each $R^{4a}$ and $R^{4b}$ is independently hydrogen, hydroxyl, amino, nitro, thiol, or substituted or unsubstituted $C_1$-$C_4$ alkyl, alkoxy, or aryl.

Complexes of General Formula II can include the following structures:
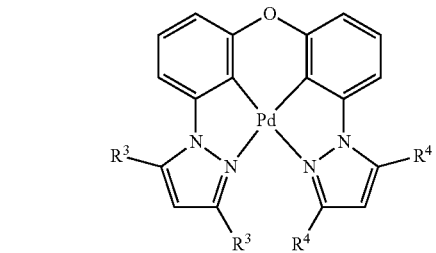
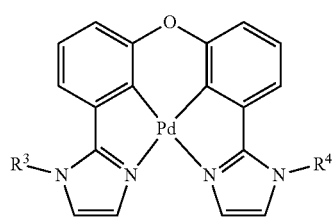
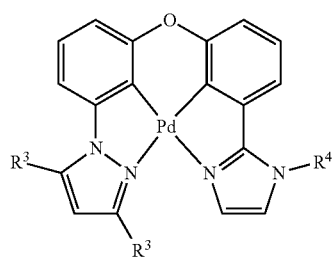
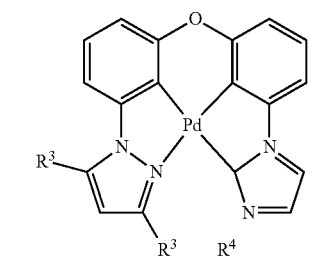
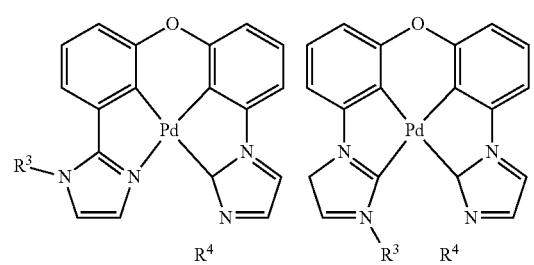
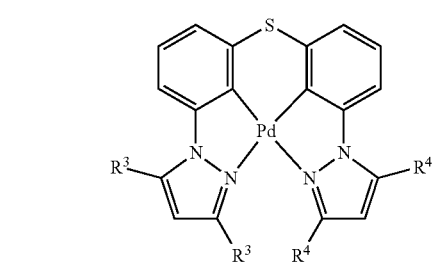
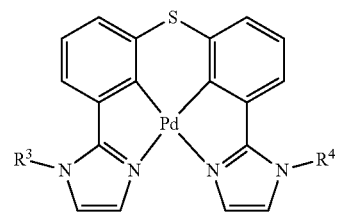
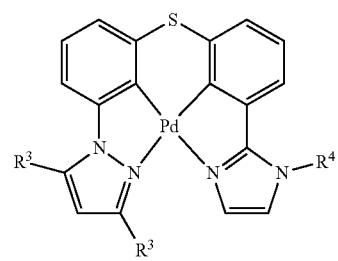
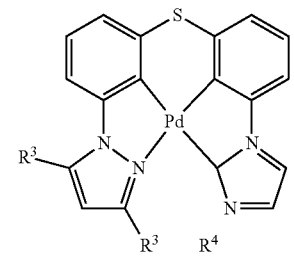
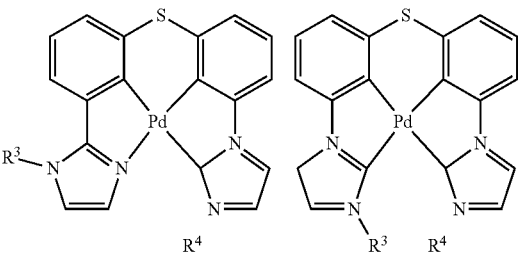
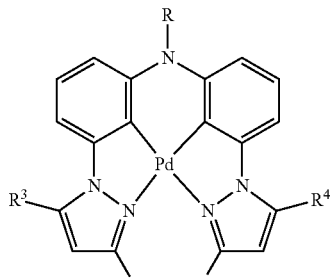
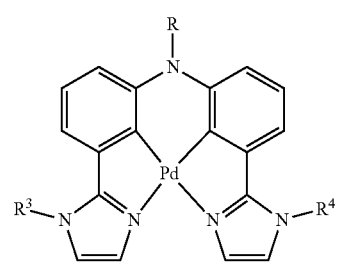

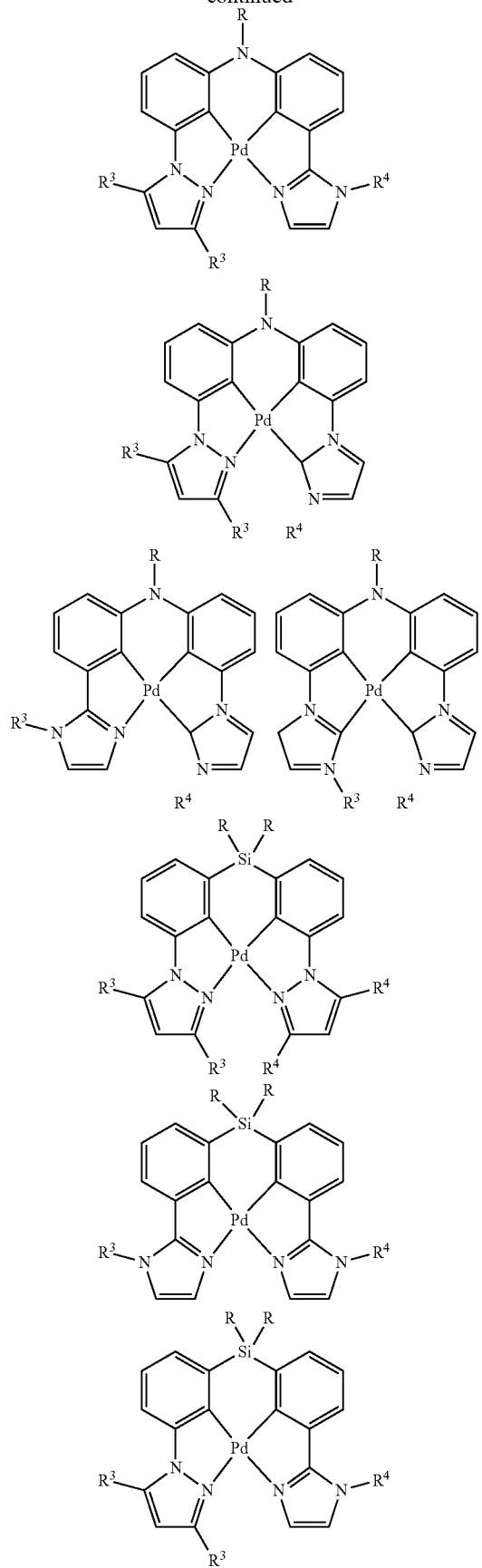
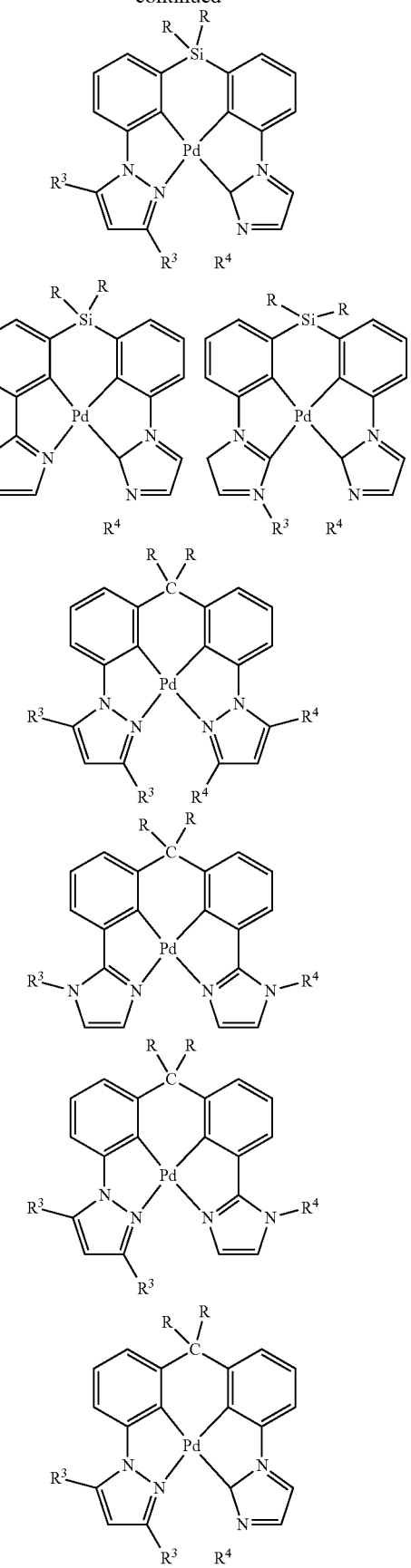

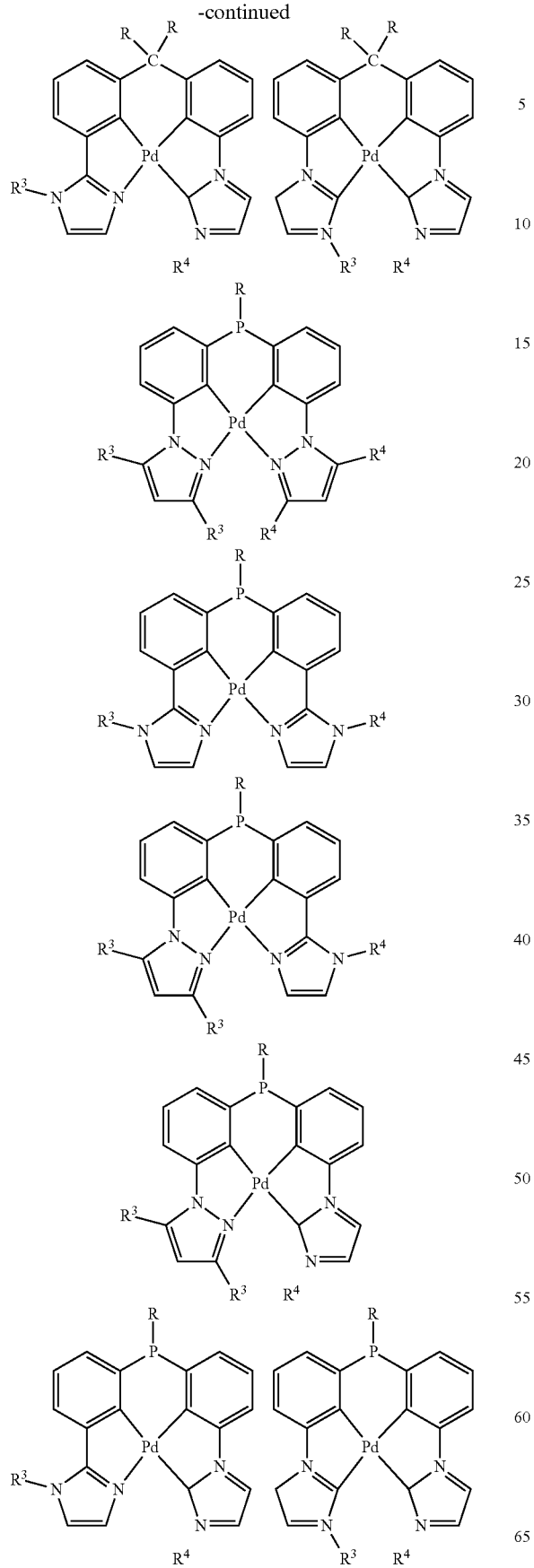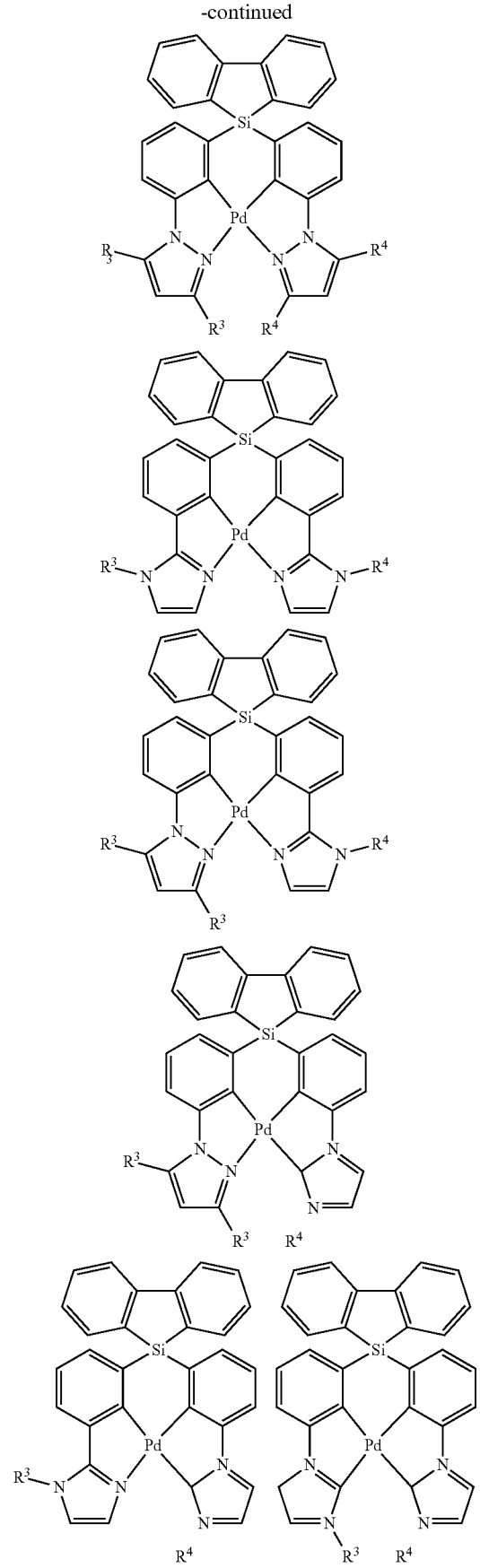

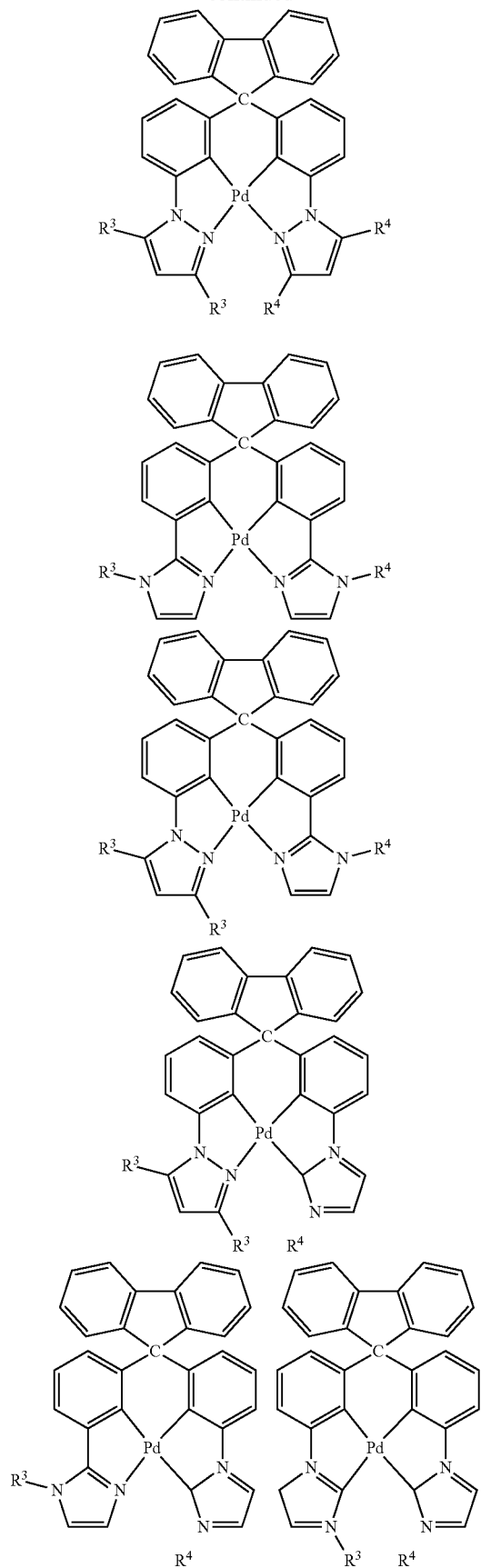
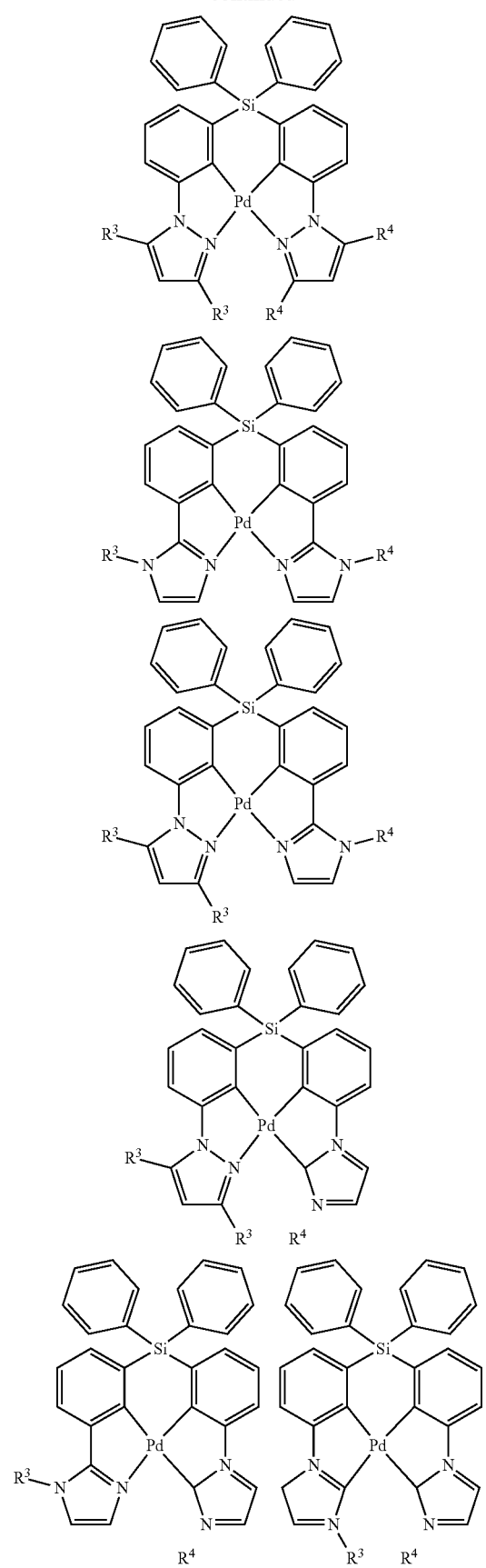

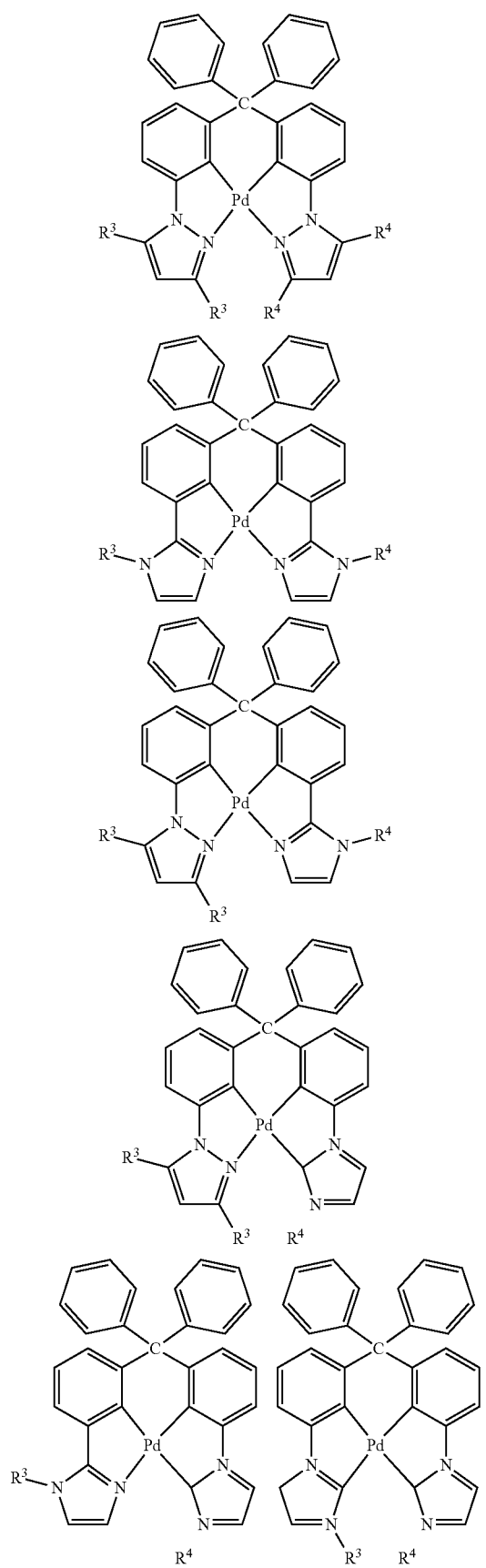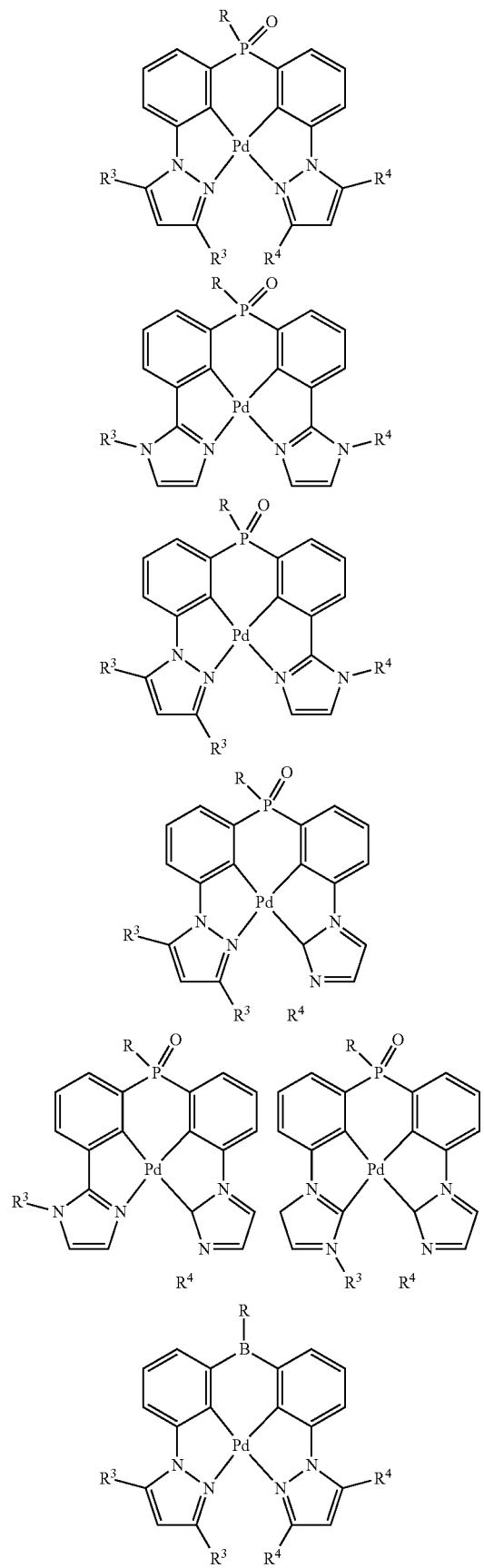

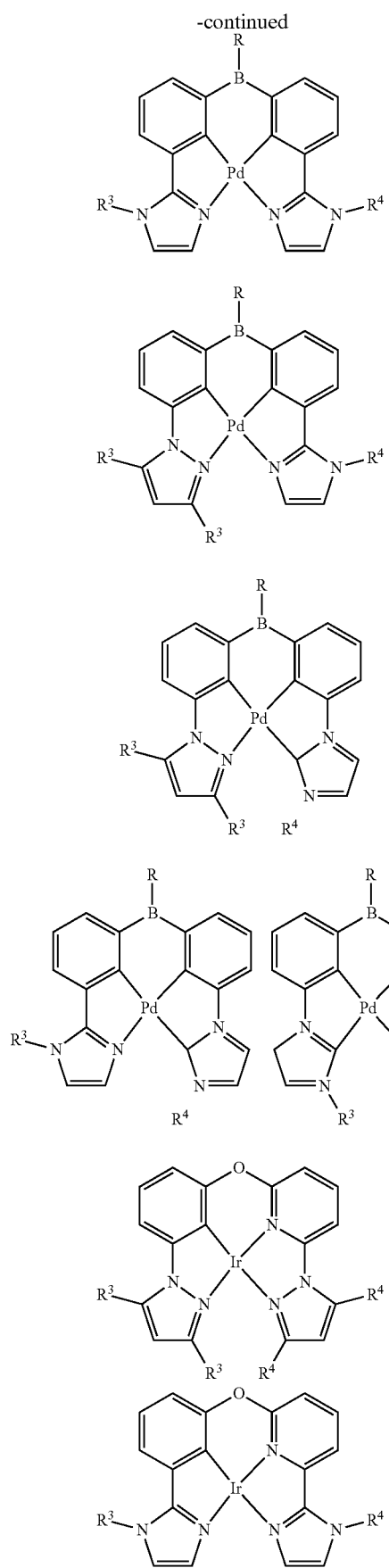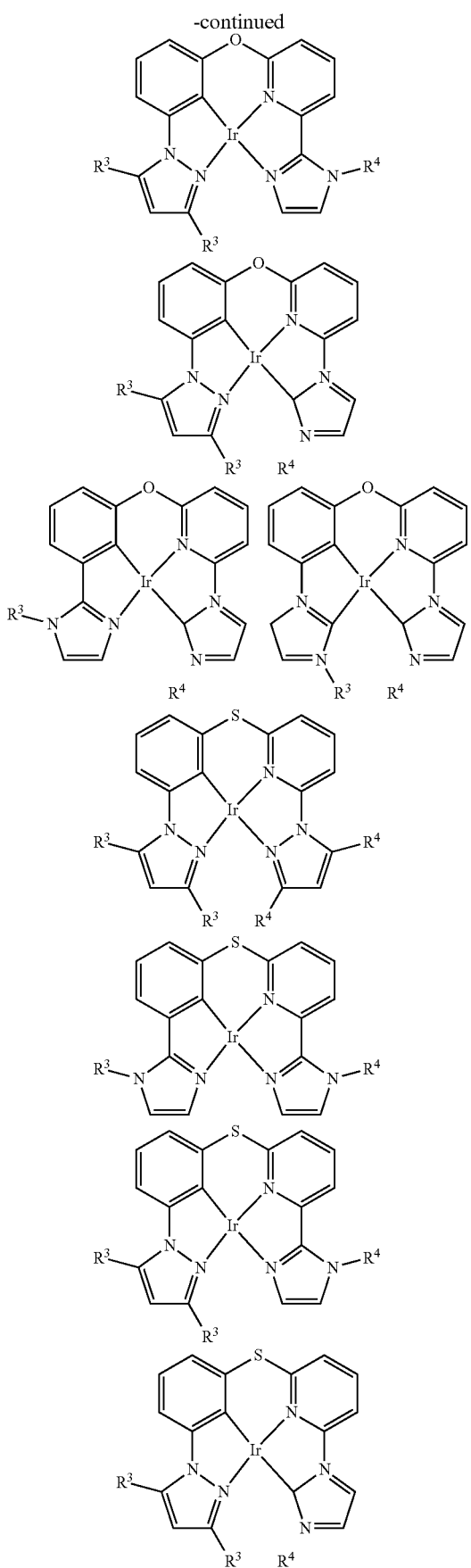

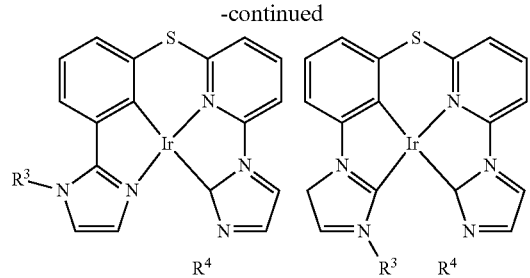
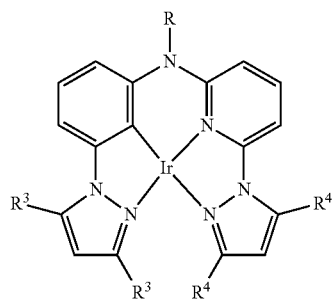
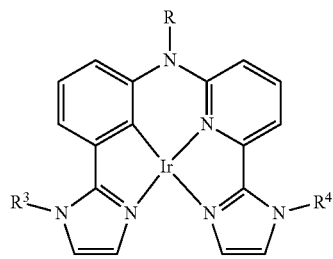
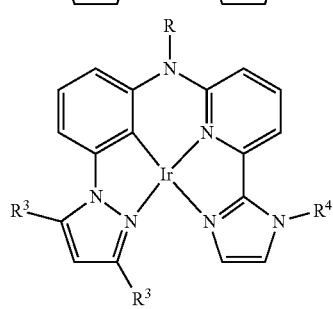
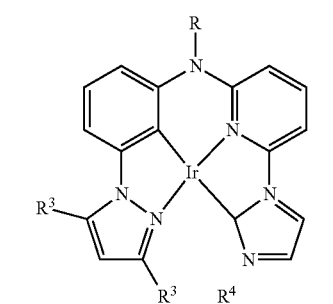
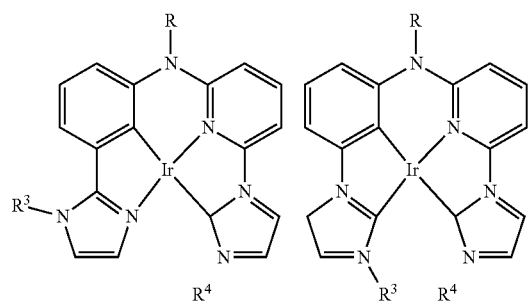
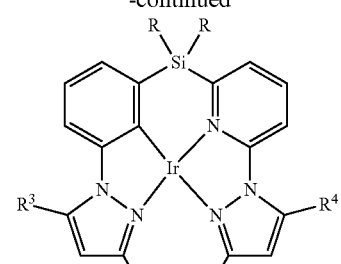
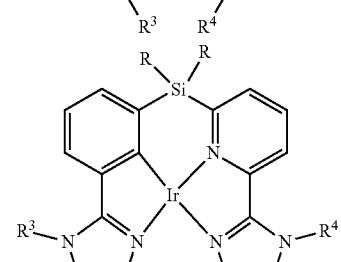
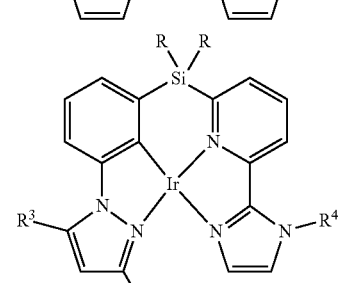
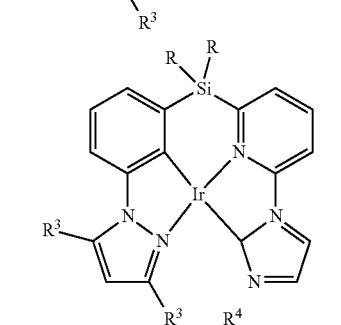
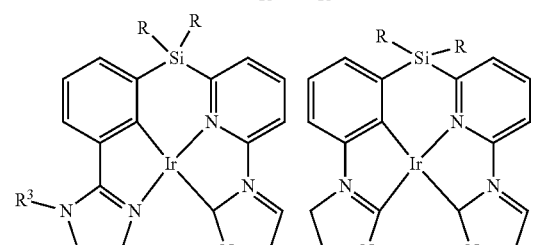
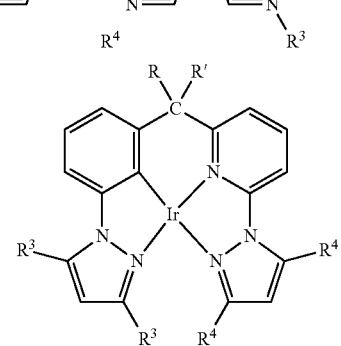

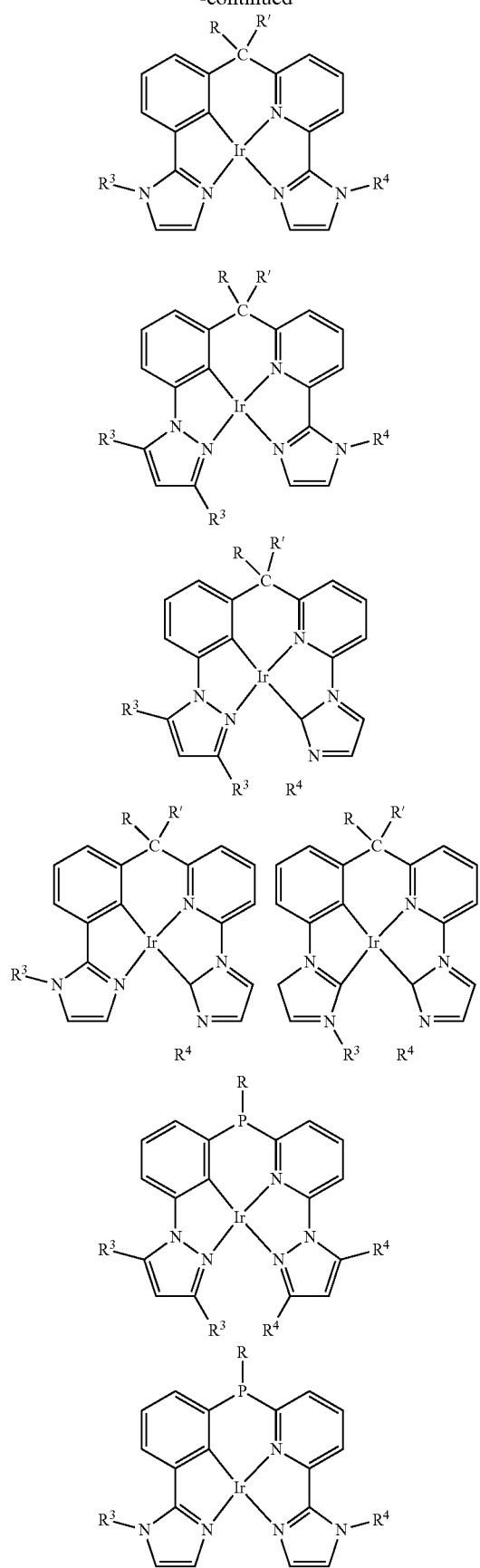
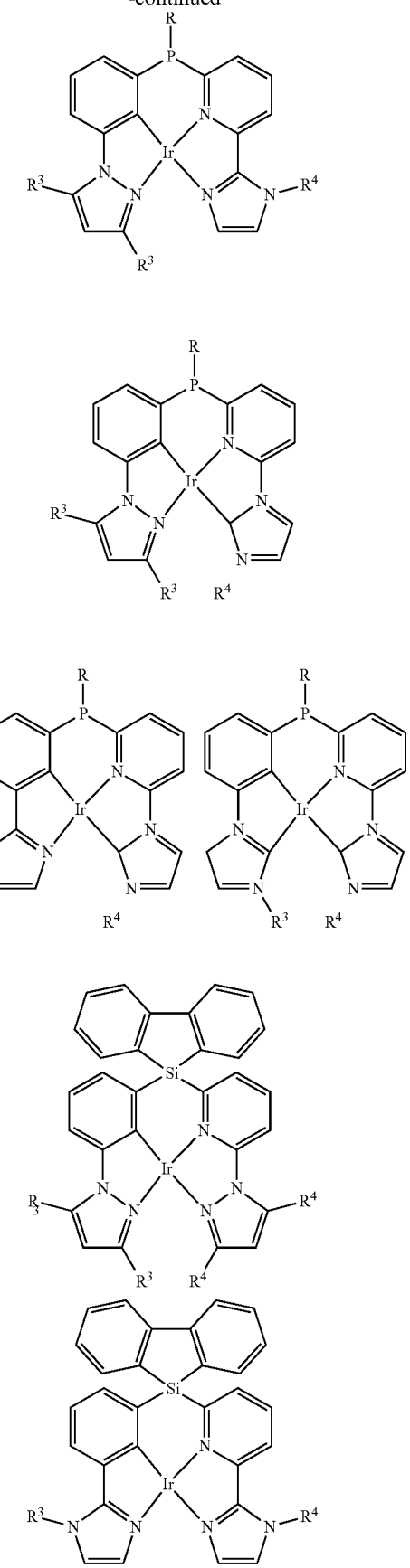

-continued
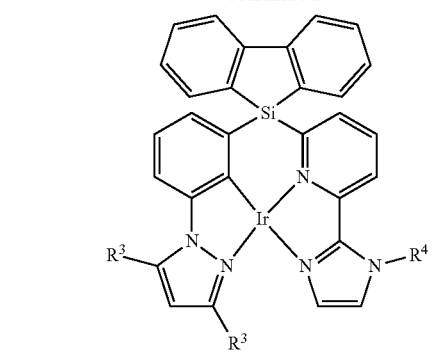
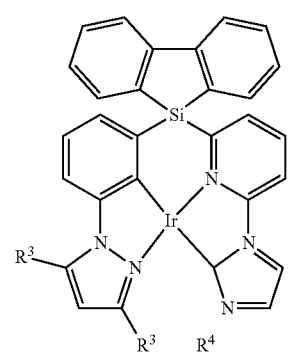
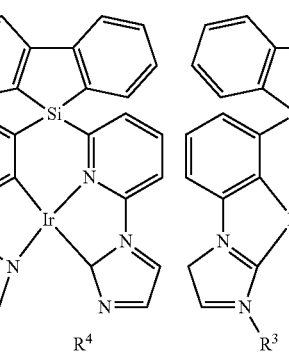
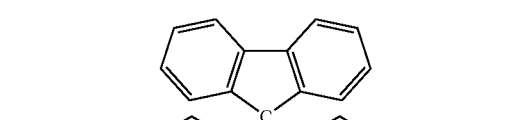
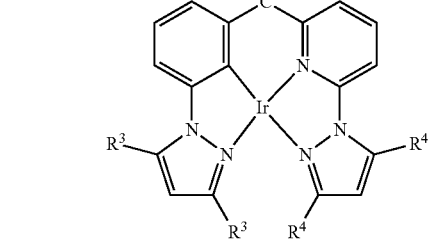
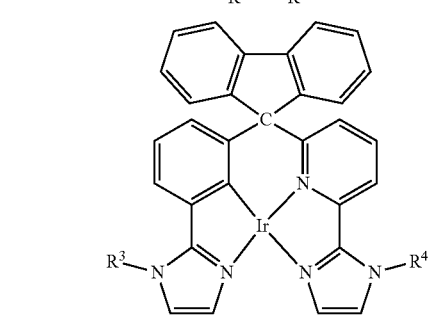
-continued
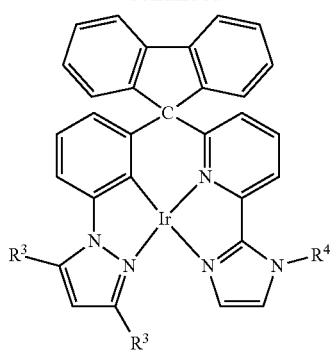
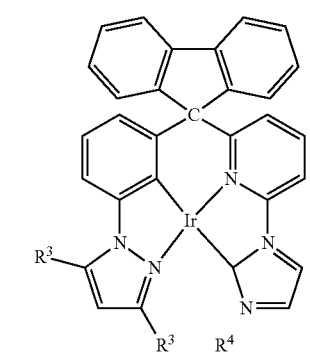
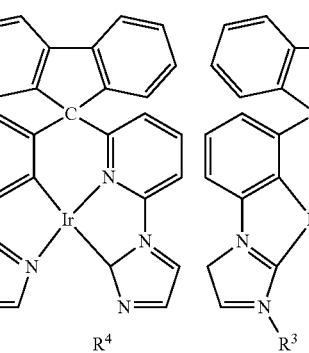
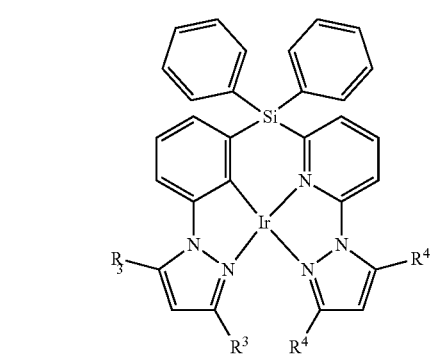
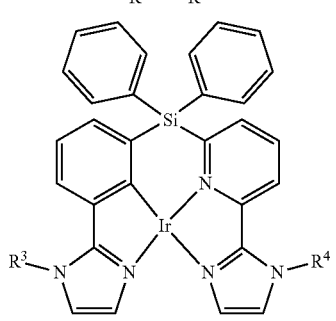

-continued
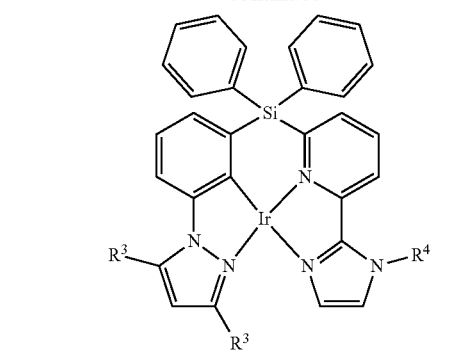
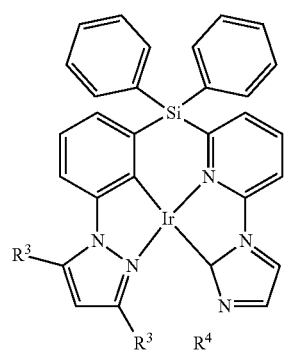
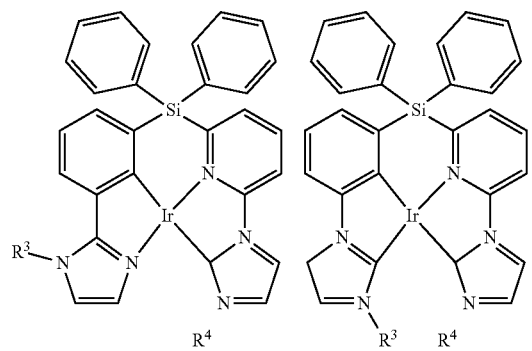
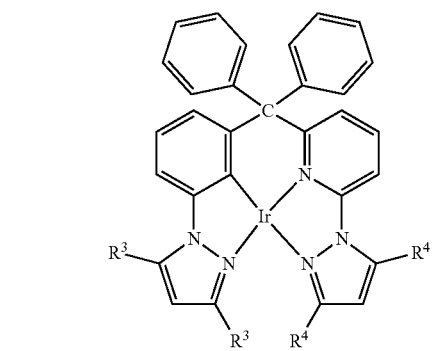
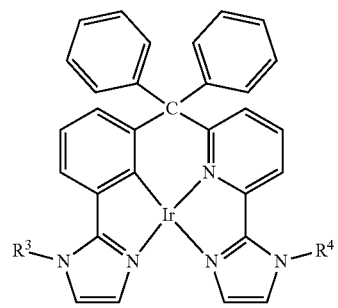
-continued
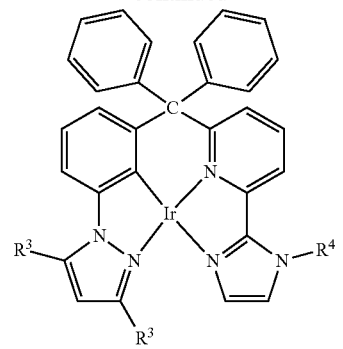
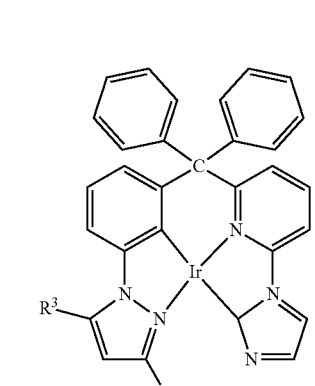
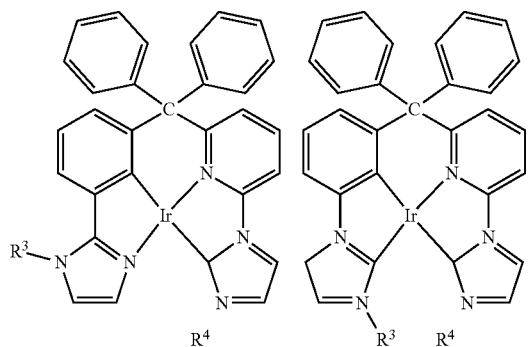
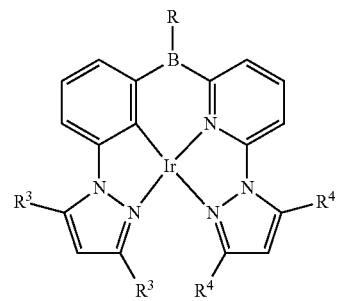
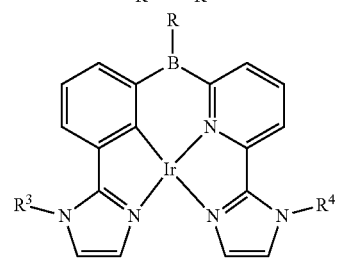

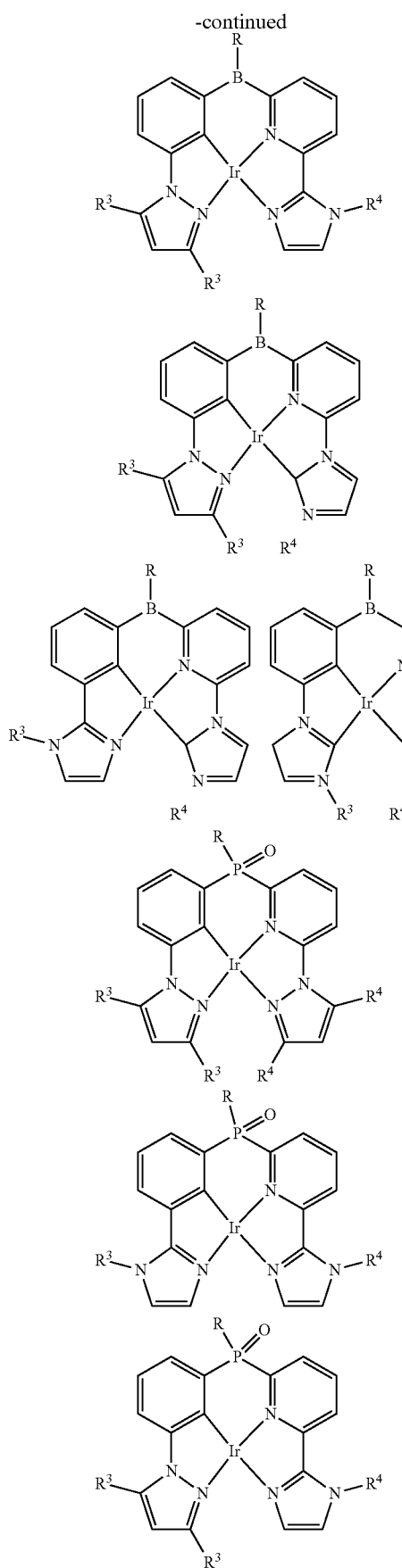
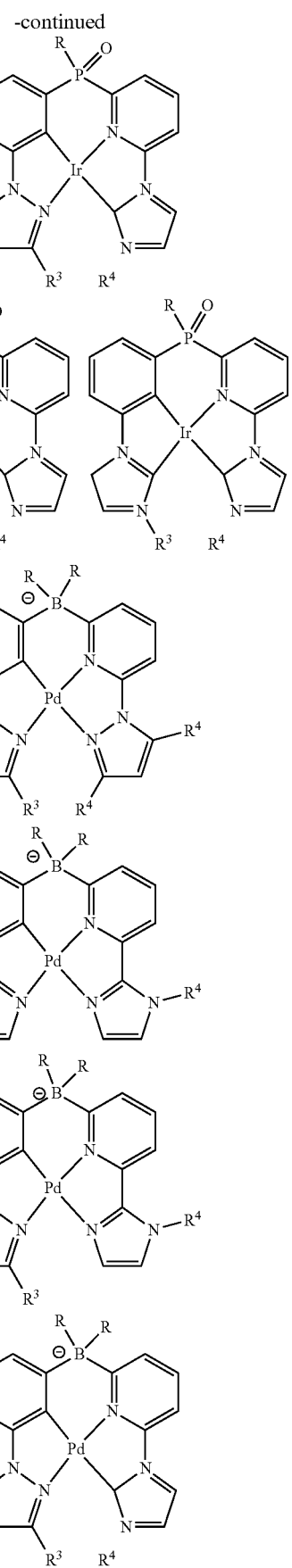

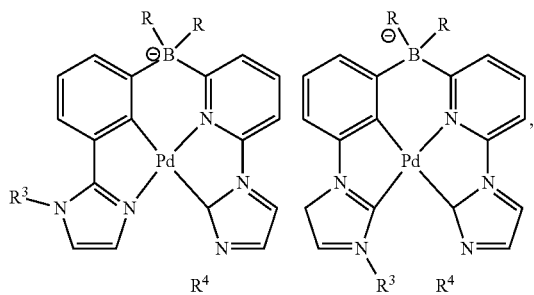

wherein each $R^1$, $R^2$, $R^3$, and $R^4$ is independently hydrogen, hydroxyl, amino, nitro, thiol, or substituted or unsubstituted $C_1$-$C_4$ alkyl, alkoxy, or aryl, hydroxyl, amino, nitro, or thiol.

Dopants in an emissive sublayer can include one or more complexes of General Formula III:

General Formula III

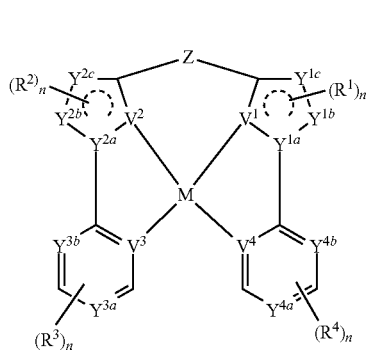

where:

each $R^1$, $R^2$, $R^3$, and $R^4$ represents a non-hydrogen substituent and is independently substituted or unsubstituted $C_1$-$C_4$ alkyl or substituted or unsubstituted aryl;

each n is independently an integer of 0 to 4, valency permitting; and each of $Y^{1a}$, $Y1^b$, $Y^{1c}$, $Y^{2a}$, $Y^{2b}$, $Y^{2c}$, $Y^{3a}$, $Y^{3b}$, $Y^{4a}$, $Y^{4b}$, $Y^{4d}$ is independently N, $NR^{4a}$, or $CR^{4b}$, wherein each $R^{4a}$ and $R^{4b}$ is independently hydrogen, hydroxyl, amino, nitro, or thiol, or substituted or unsubstituted $C_1$-$C_4$ alkyl, alkoxy, substituted or unsubstituted aryl.

Complexes of General Formula III can include the following structures:

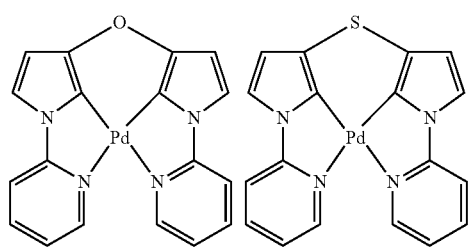

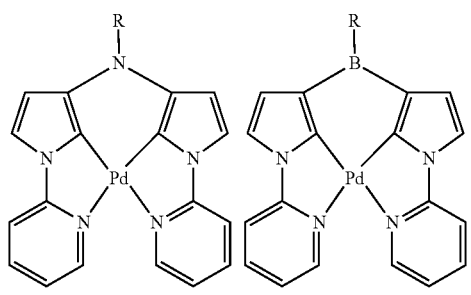

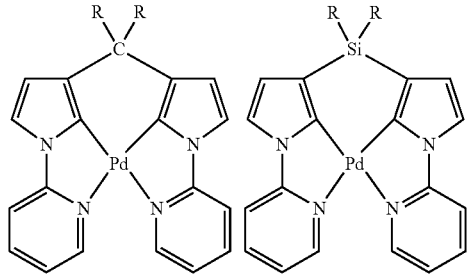

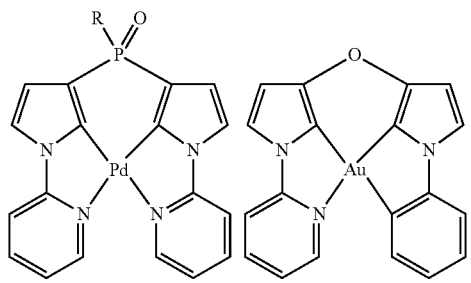

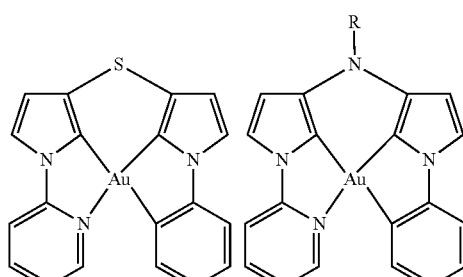

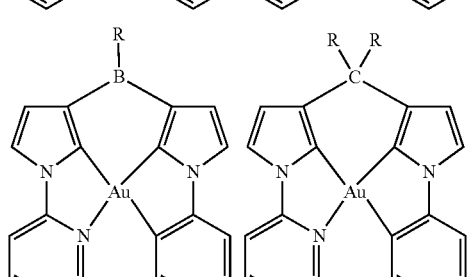

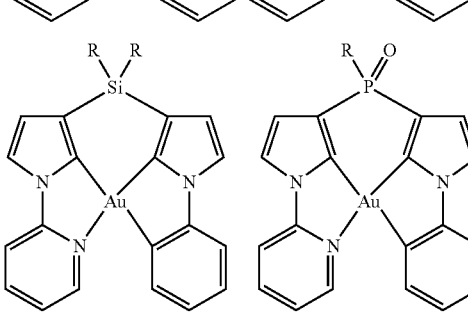

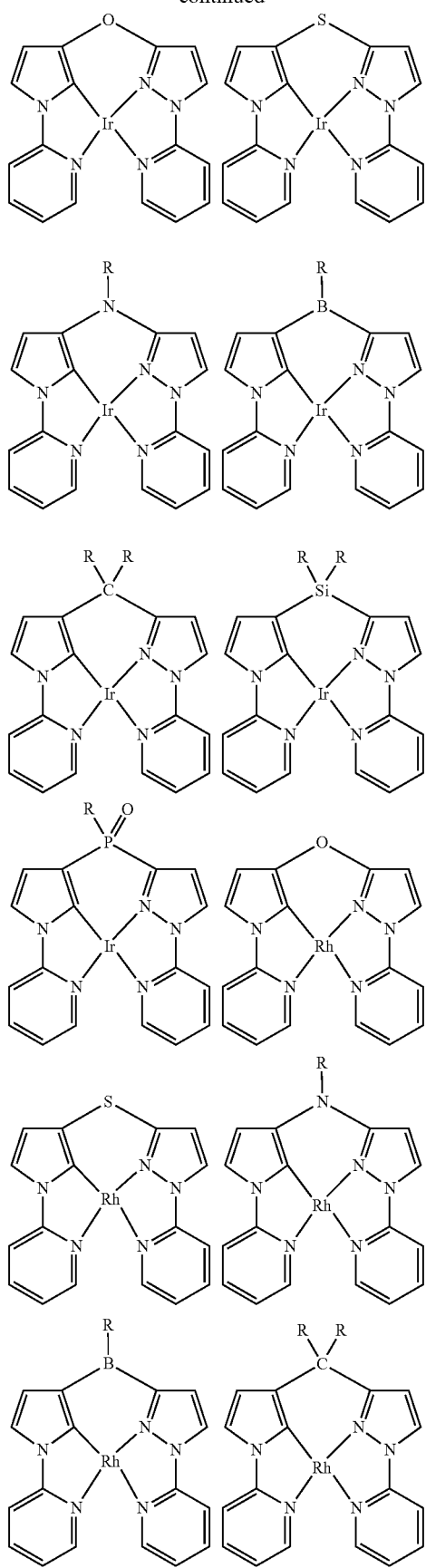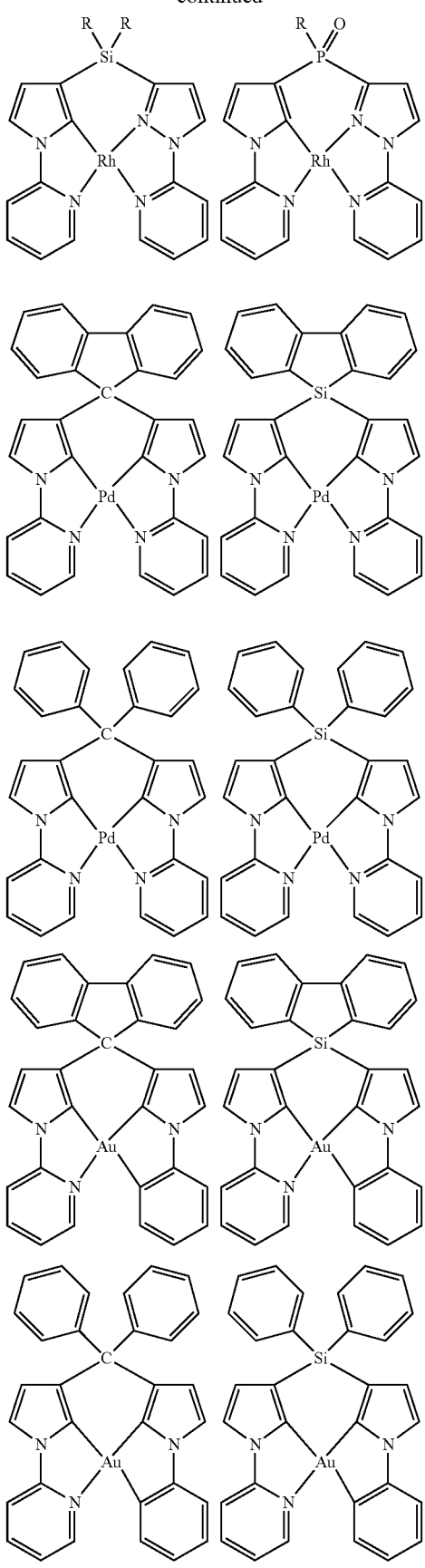

-continued

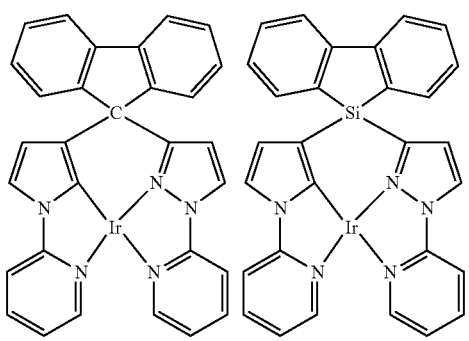

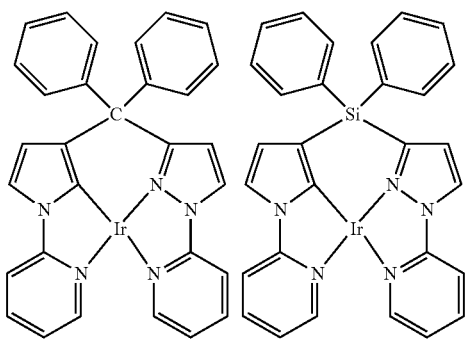

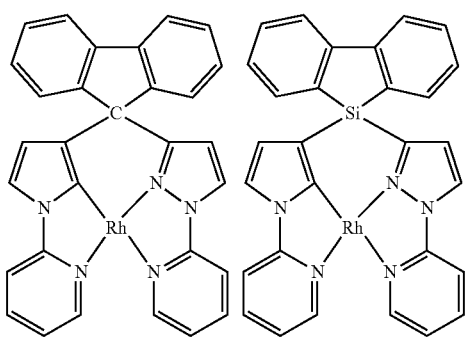

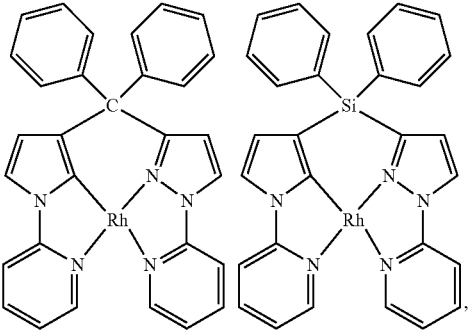

wherein each R is independently hydrogen, hydroxyl, amino, nitro, thiol, or substituted or unsubstituted $C_1$-$C_4$ alkyl, alkoxy, or aryl, hydroxyl, amino, nitro, or thiol.

Dopants in an emissive sublayer can include one or more complexes of General Formula IV:

General Formula IV

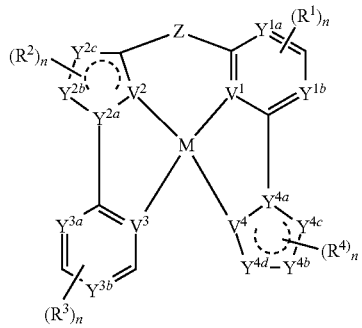

where:

each $R^1$, $R^2$, $R^3$, and $R^4$ represents a non-hydrogen substituent and is independently substituted or unsubstituted $C_1$-$C_4$ alkyl or substituted or unsubstituted aryl;

each n is independently an integer of 0 to 4, valency permitting; and each of $Y^{1a}$, $Y^{1b}$, $Y^{2a}$, $Y^{2b}$, $Y^{2c}$, $Y^{3a}$, $Y^{3b}$, $Y^{4a}$, $Y^{4b}$, $Y^{4c}$, $Y^{4d}$ is independently N, $NR^{4a}$, or $CR^{4b}$, wherein each $R^{4a}$ and $R^{4b}$ is independently hydrogen, hydroxyl, amino, nitro, thiol, or substituted or unsubstituted $C_1$-$C_4$ alkyl, alkoxy, or aryl, hydroxyl, amino, nitro, or thiol.

Complexes of General Formula IV can include the following structures:

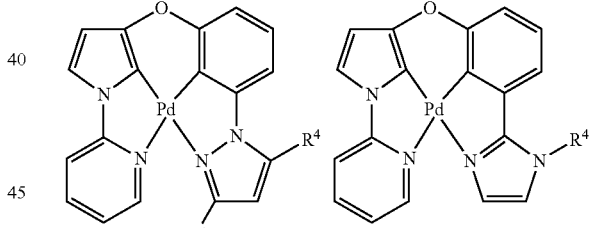

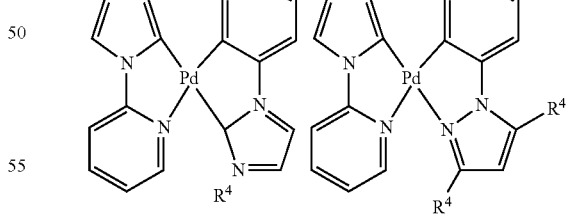

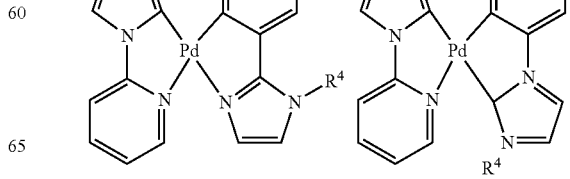

-continued
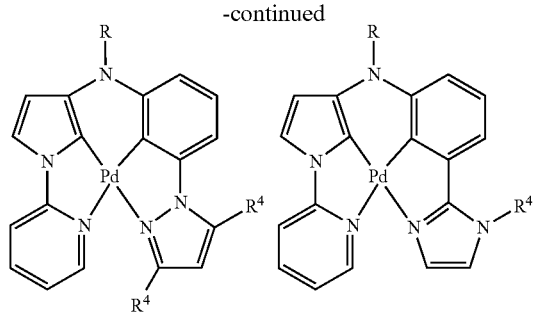
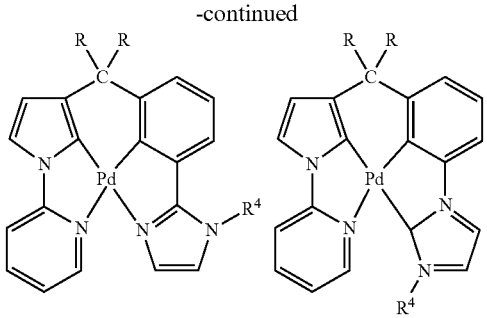
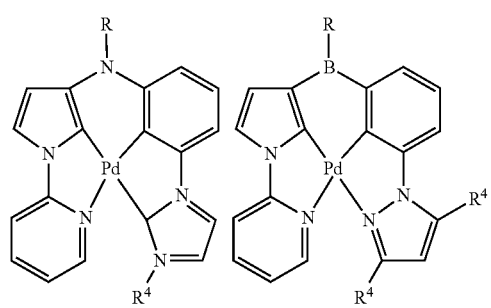
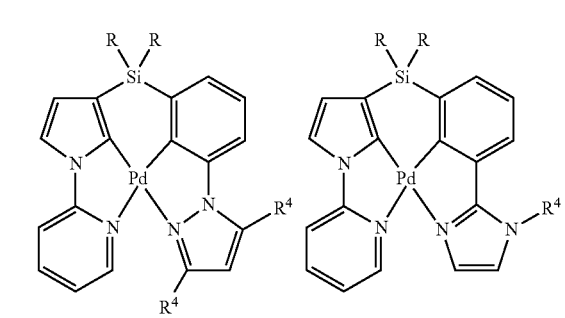
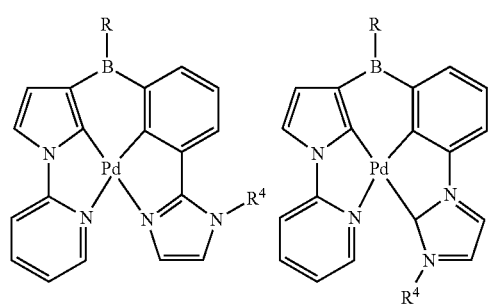
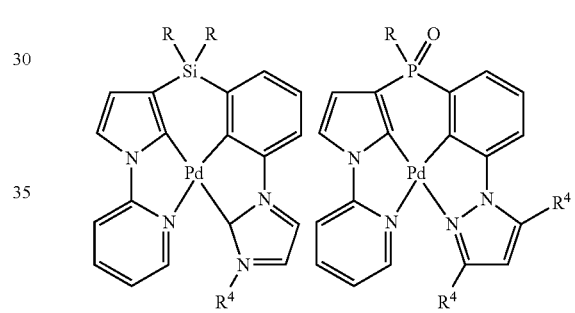
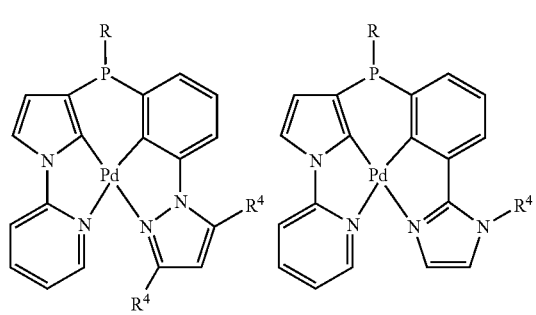
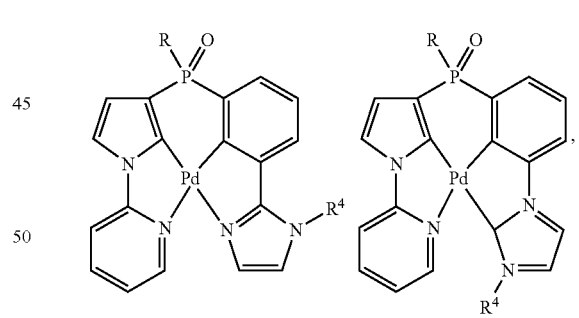
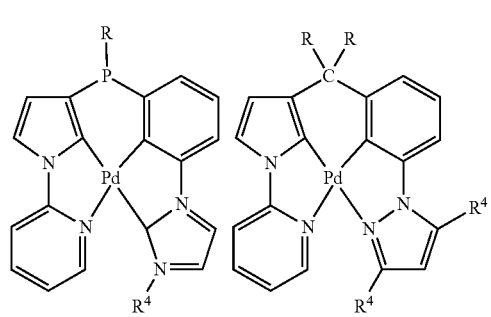
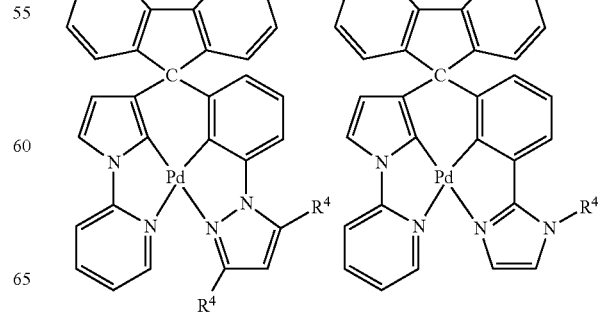

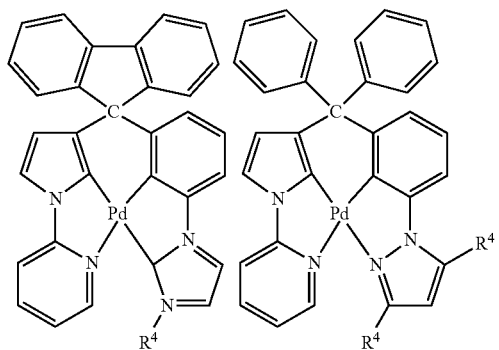

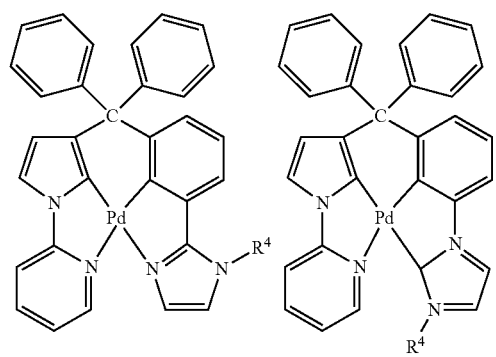

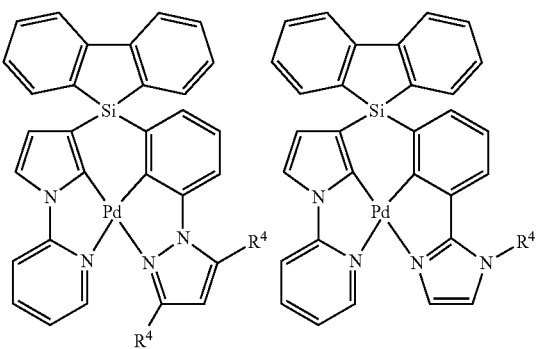

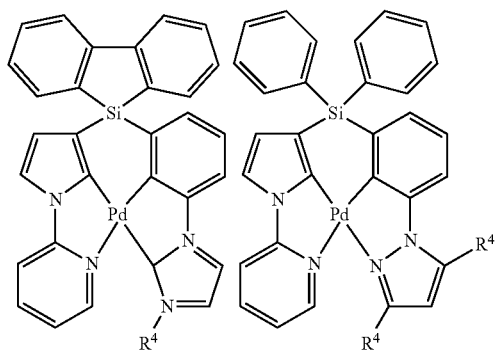

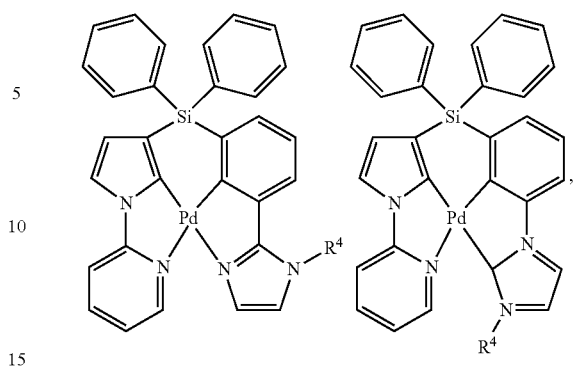

wherein each R and $R^4$ is independently hydrogen, hydroxyl, amino, nitro, thiol, or substituted or unsubstituted $C_1$-$C_4$ alkyl, alkoxy, or aryl, hydroxyl, amino, nitro, or thiol.

Dopants in an emissive sublayer can include one or more complexes of General Formula V:

General Formula V

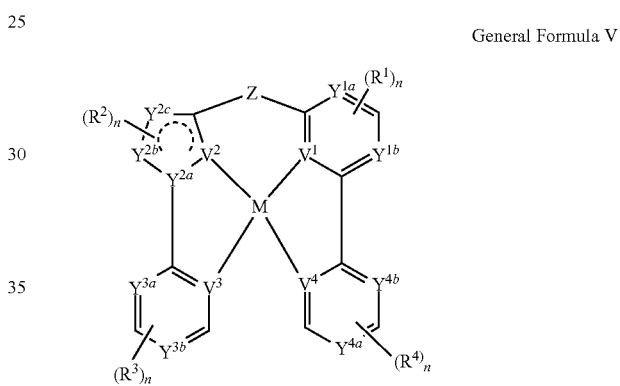

where:

each $R^1$, $R^2$, $R^3$, and $R^4$ represents a non-hydrogen substituent and is independently substituted or unsubstituted $C_1$-$C_4$ alkyl or substituted or unsubstituted aryl;

each n is independently an integer of 0 to 4, valency permitting; and each of $Y^{1a}$, $Y^{1b}$, $Y^{2a}$, $Y^{2b}$, $Y^{2c}$, $Y^{3a}$, $Y^{3b}$, $Y^{4a}$, $Y^{4b}$, is independently N, $NR^{4a}$, or $CR^{4b}$, wherein each $R^{4a}$ and $R^{4b}$ is independently hydrogen, hydroxyl, amino, nitro, or thiol, or substituted or unsubstituted $C_1$-$C_4$ alkyl, alkoxy, or aryl.

Complexes of General Formula V can include the following structures:

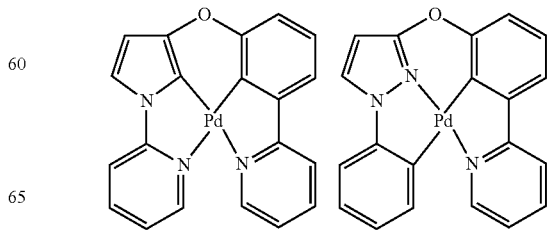

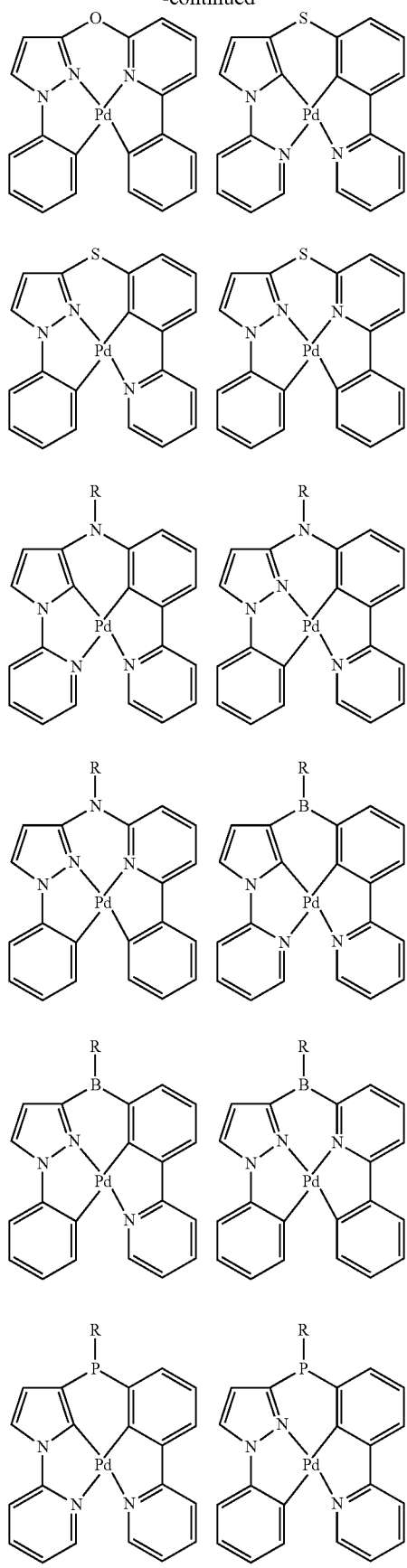
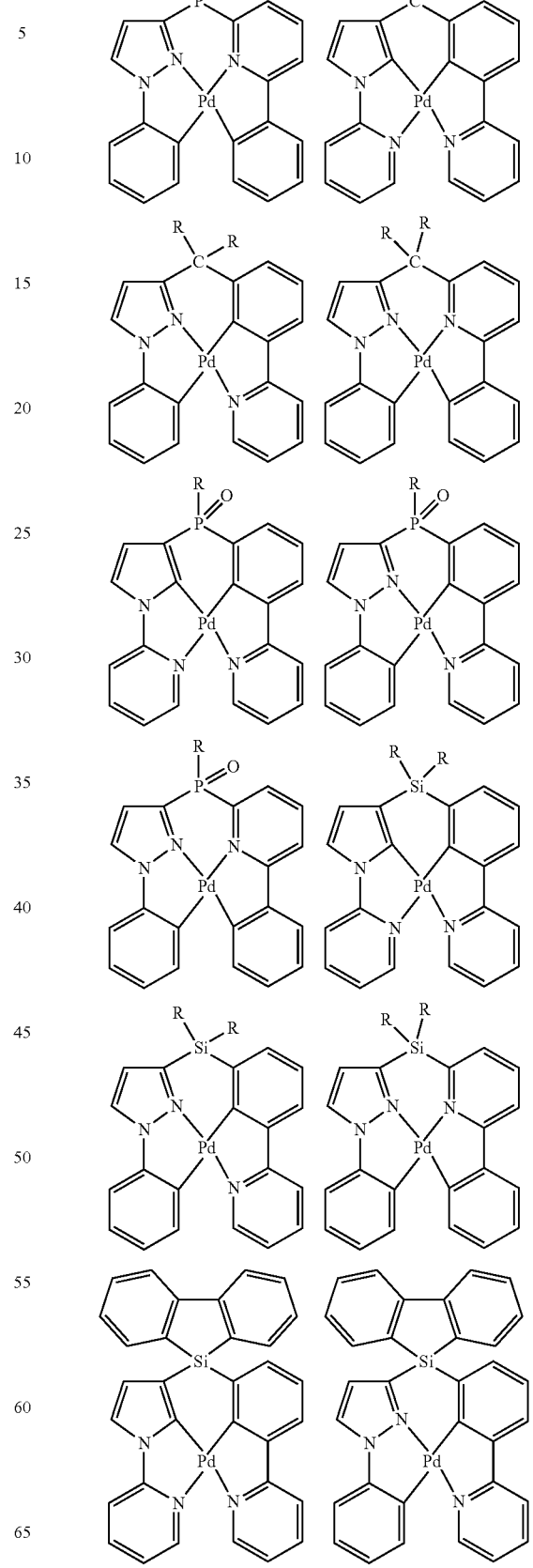

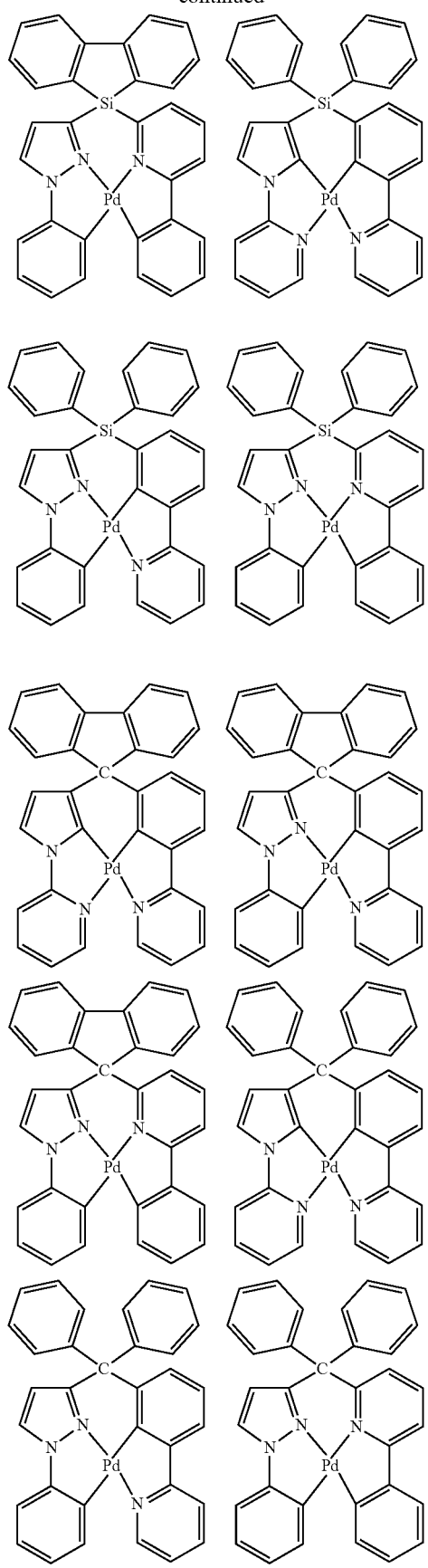
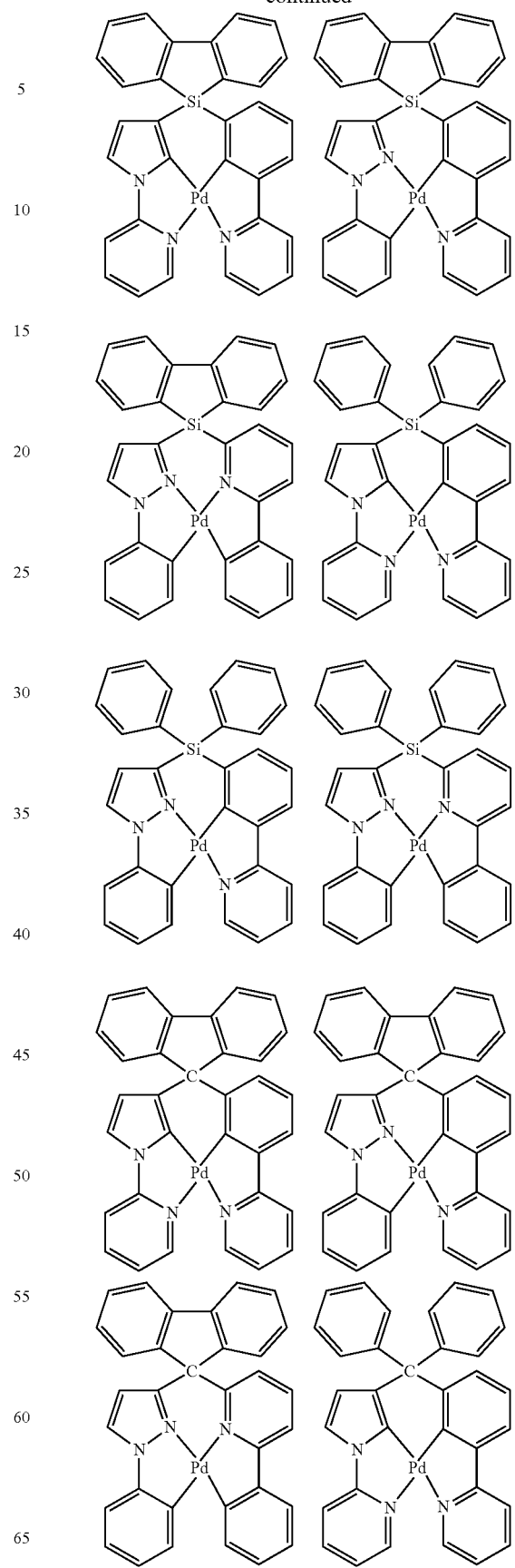

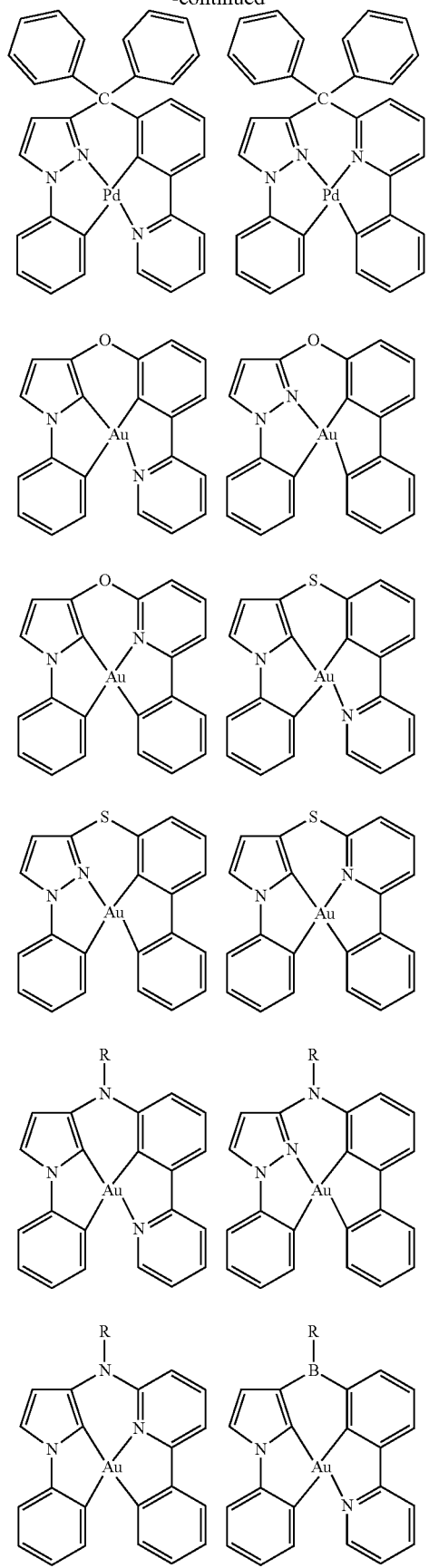
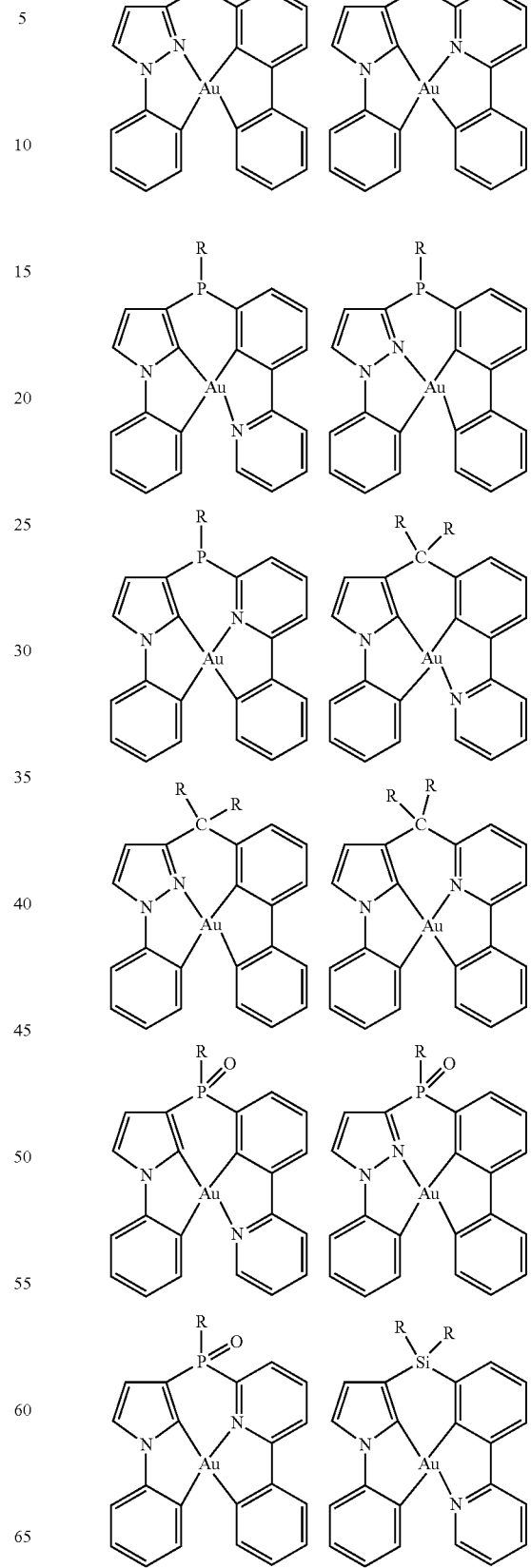

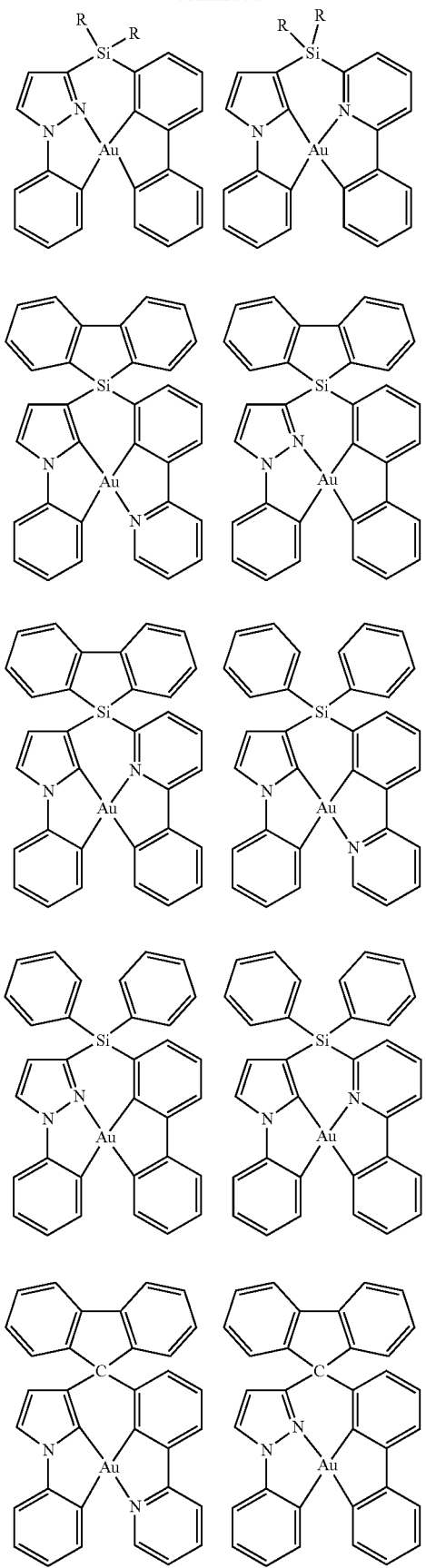
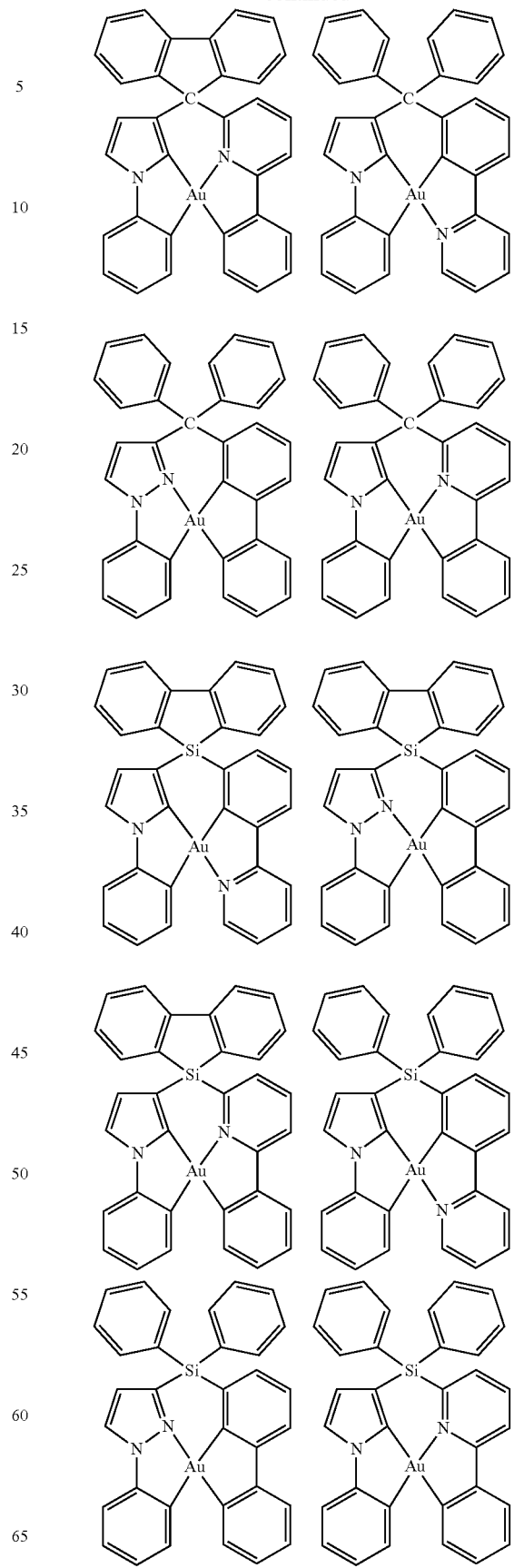

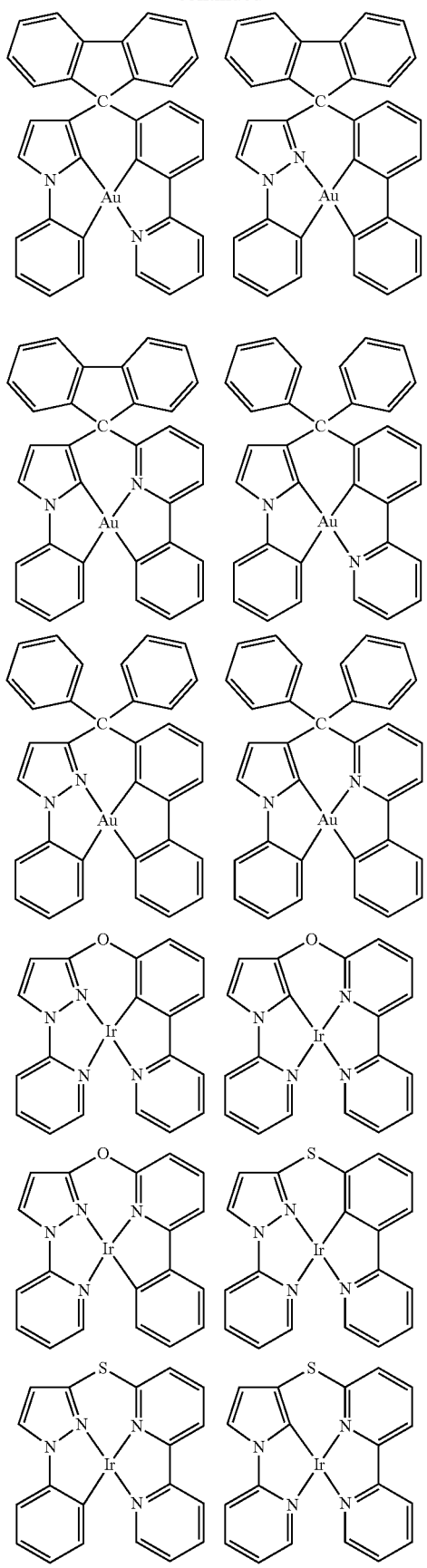
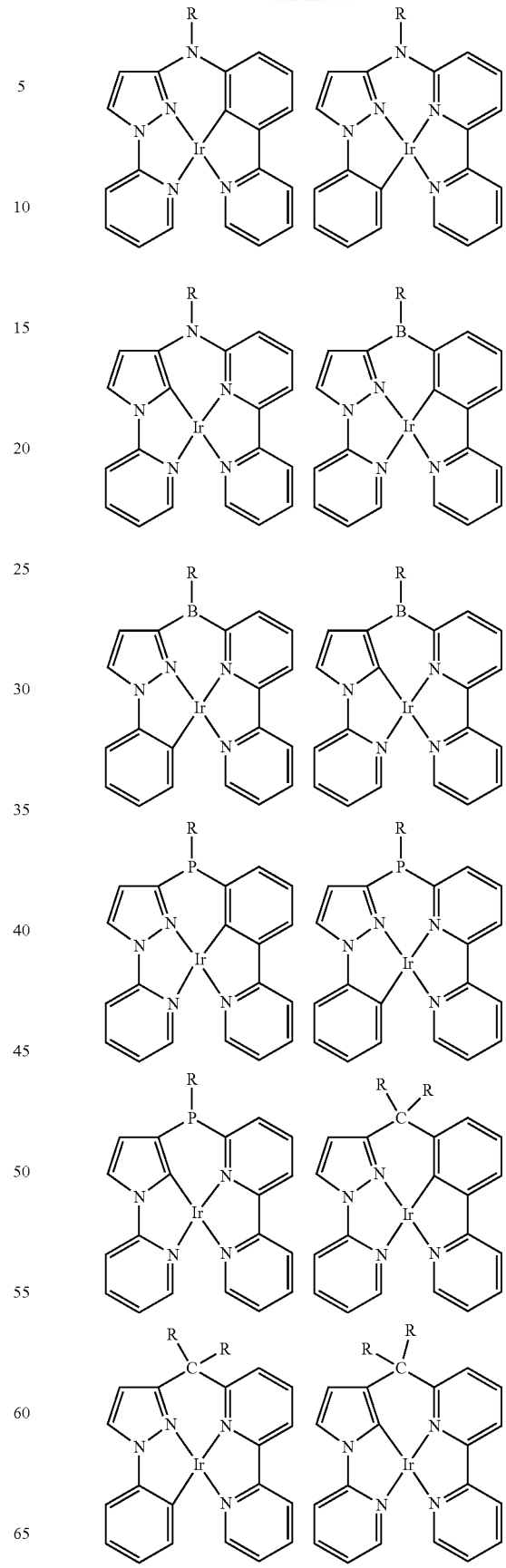

-continued

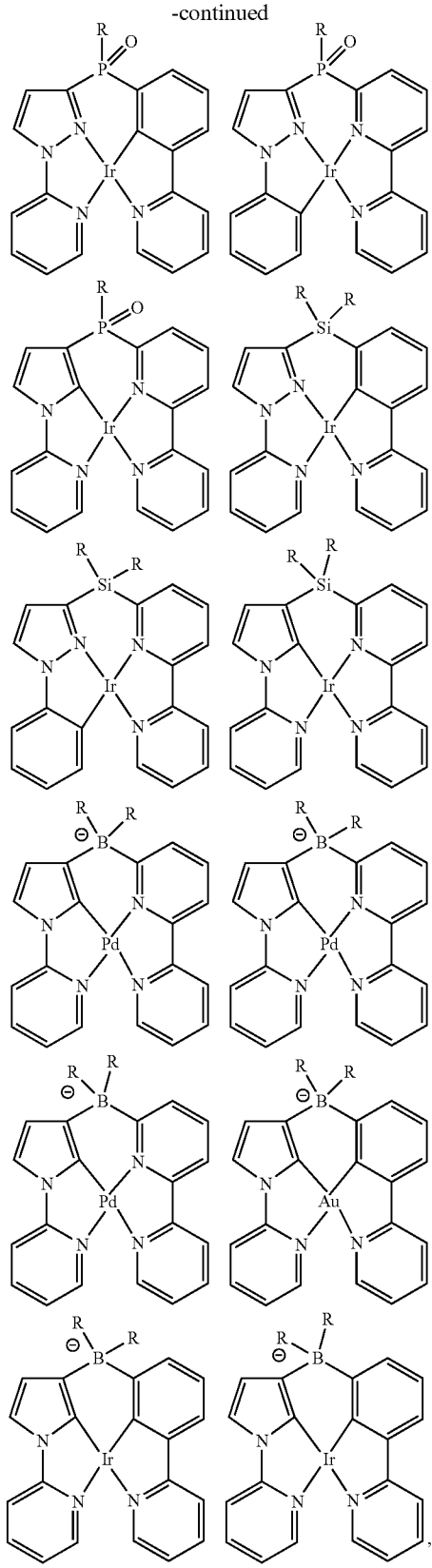

wherein each R is independently hydrogen, hydroxyl, amino, nitro, thiol, or substituted or unsubstituted $C_1$-$C_4$ alkyl, alkoxy, or aryl, hydroxyl, amino, nitro, or thiol.

Dopants in an emissive sublayer can include one or more complexes of General Formula VI:

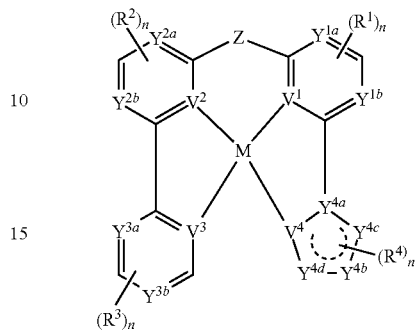

General Formula VI where:

each $R^1$, $R^2$, $R^3$, and $R^4$ represents a non-hydrogen substituent and is independently substituted or unsubstituted $C_1$-$C_4$ alkyl or substituted or unsubstituted aryl;

each n is independently an integer of 0 to 4, valency permitting; and each of $Y^{1a}$, $Y^{1b}$, $Y^{2a}$, $Y^{2b}$, $Y^{3a}$, $Y^{3b}$, $Y^{4a}$, $Y^{4b}$, $Y^{4c}$, $Y^{4d}$ is independently N, $NR^{4a}$, or $CR^{4b}$, wherein each $R^{4a}$ and $R^{4b}$ is independently hydrogen, hydroxyl, amino, nitro, or thiol, or substituted or unsubstituted $C_1$-$C_4$ alkyl, alkoxy, or aryl.

Complexes of General Formula VI can include the following structures:

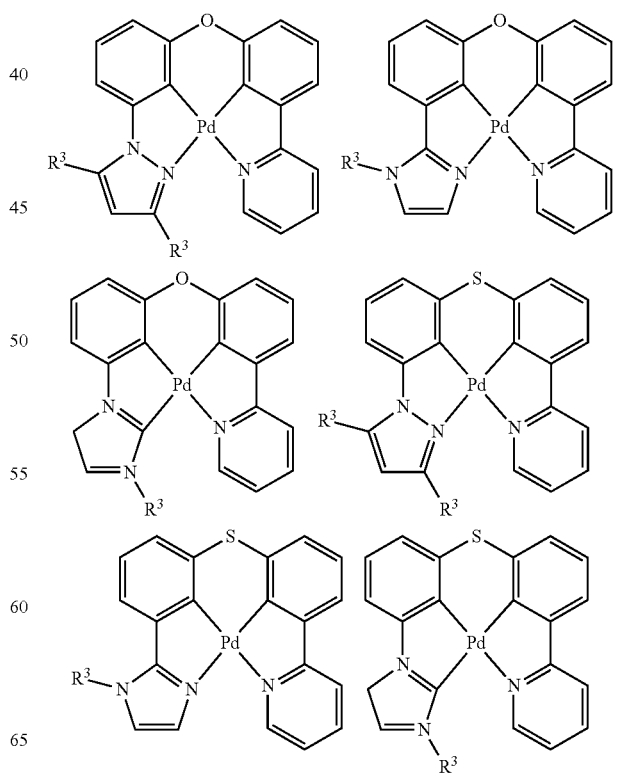

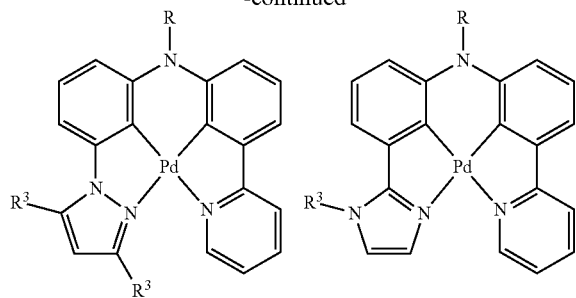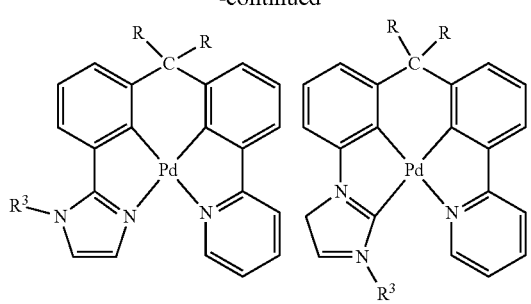

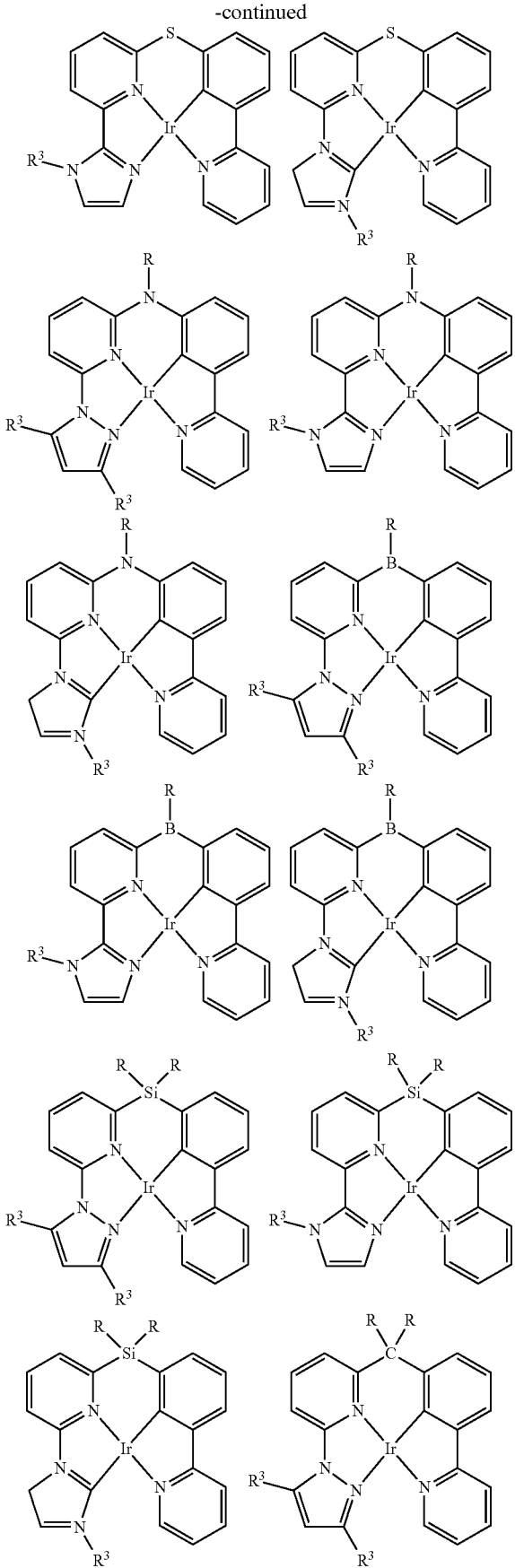
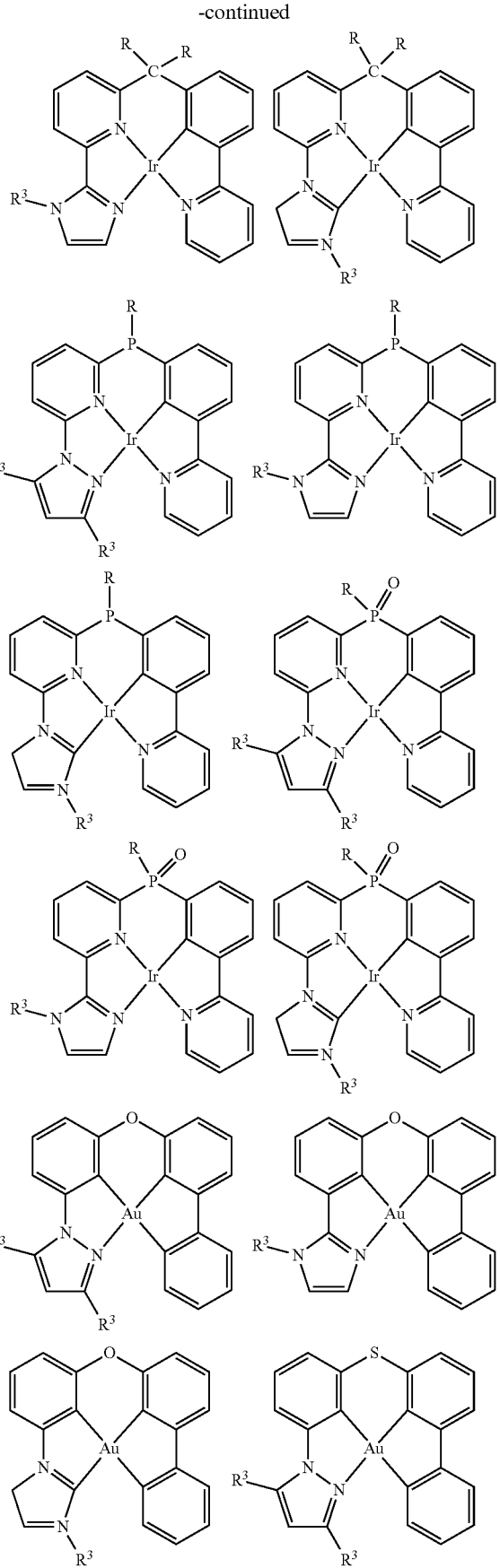

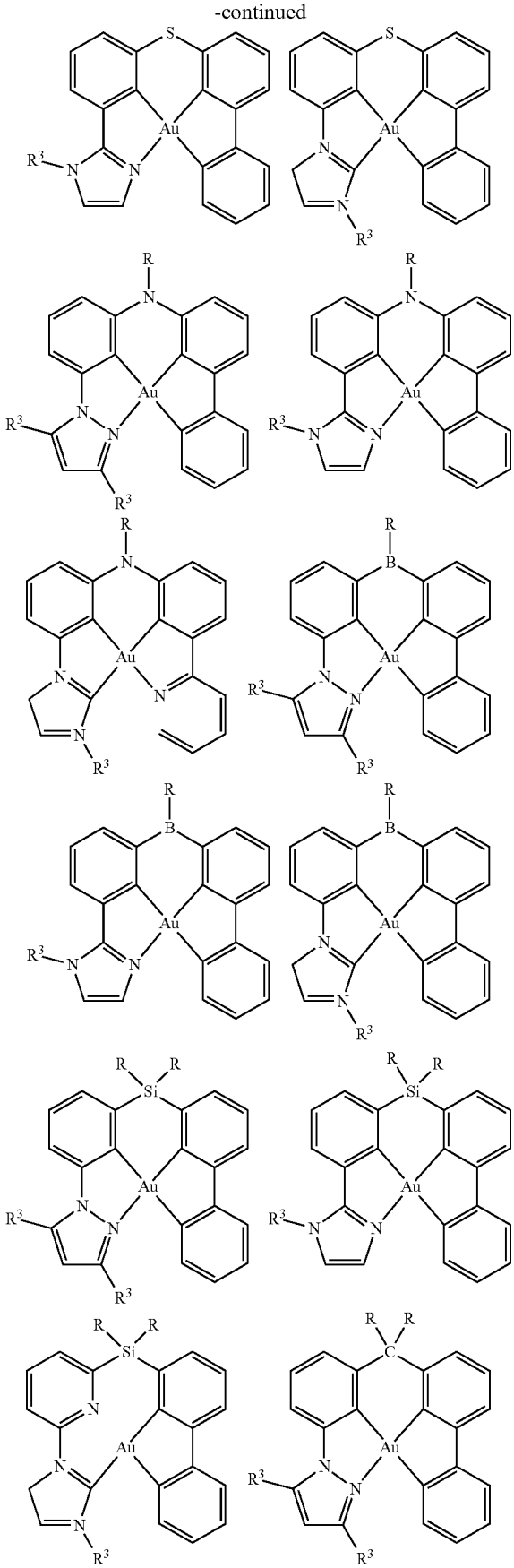
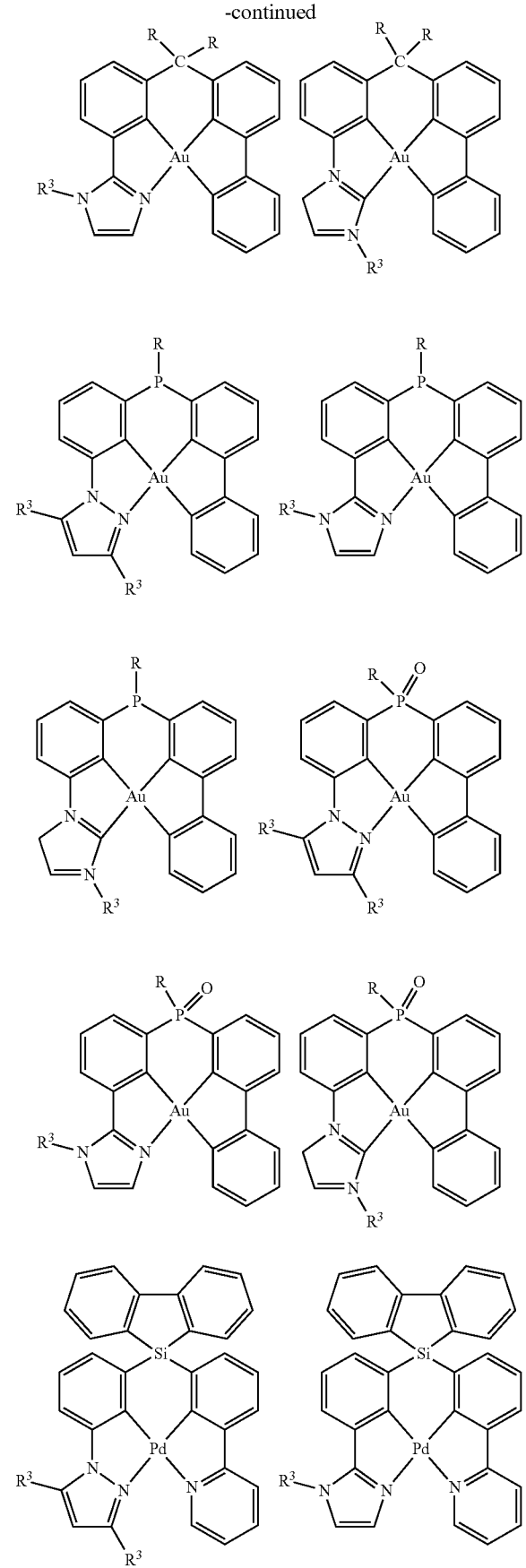

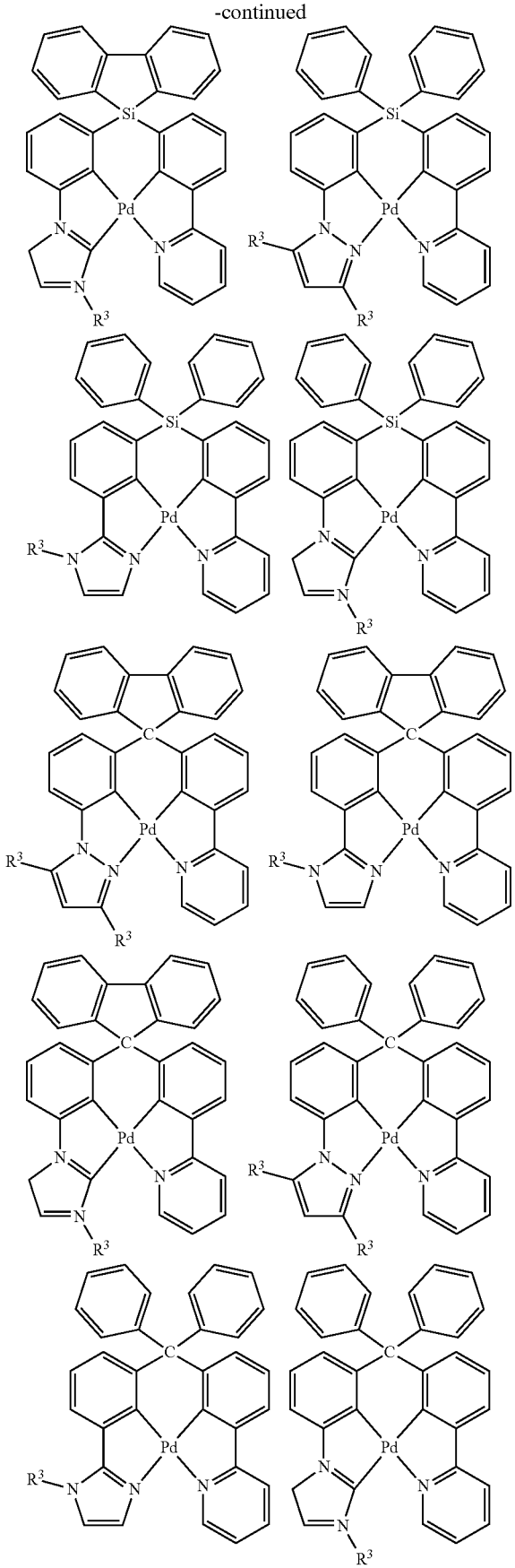
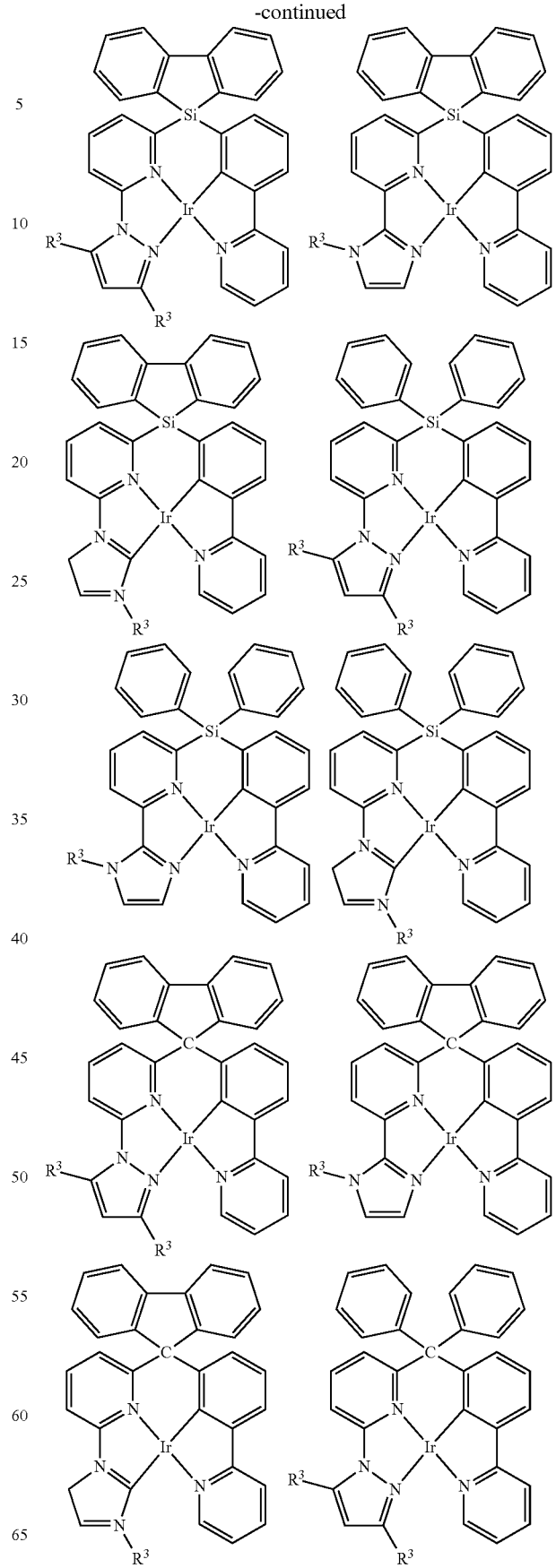

-continued
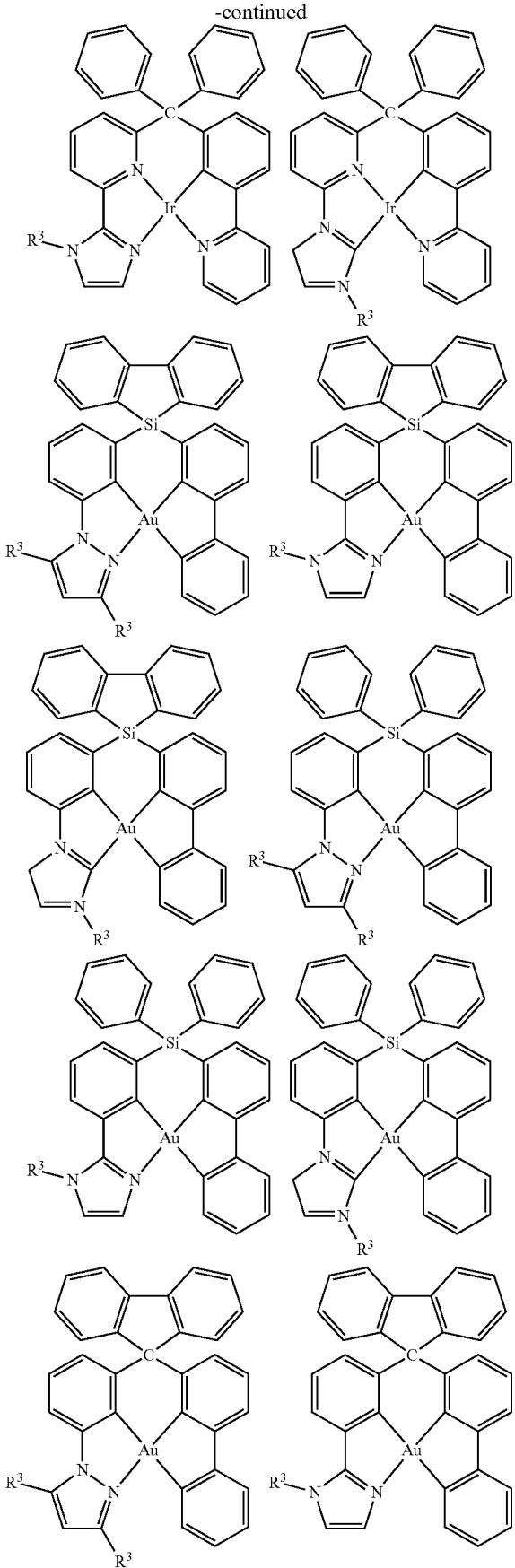
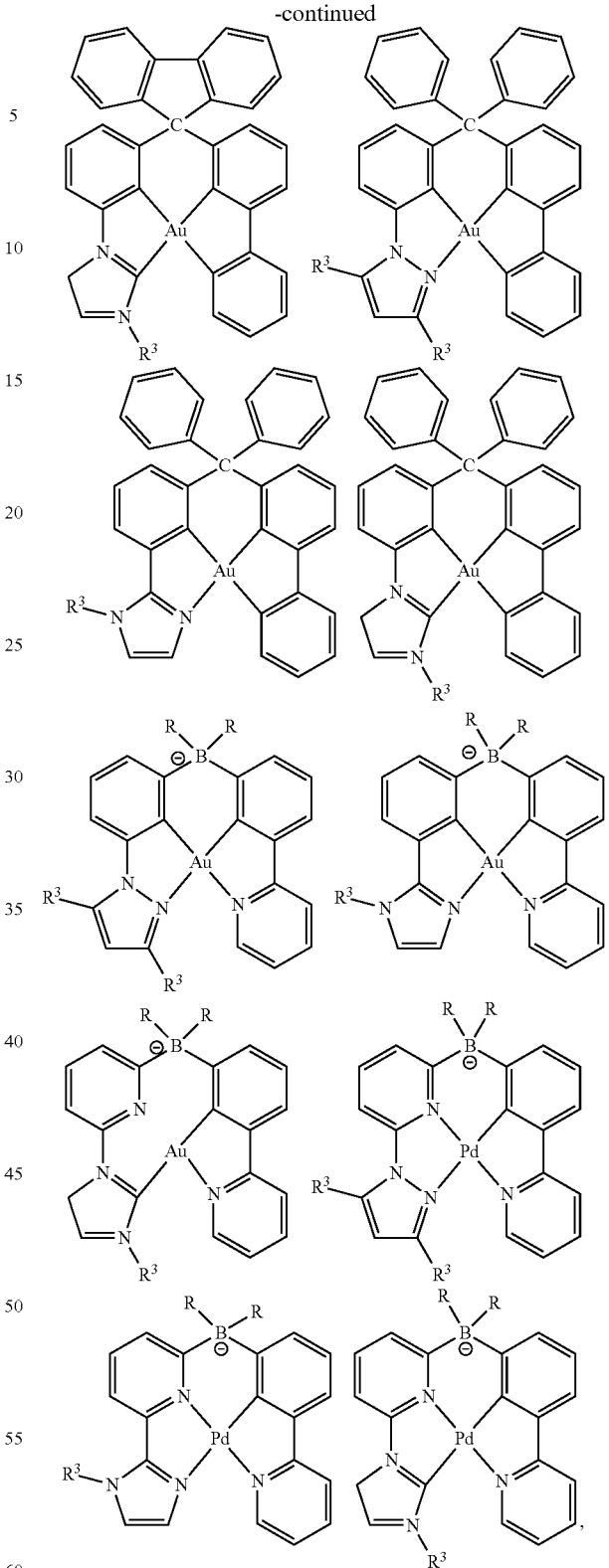
wherein each R and $R^3$ is independently hydrogen, hydroxyl, amino, nitro, thiol, or substituted or unsubstituted $C_1$-$C_4$ alkyl, alkoxy, or aryl, hydroxyl, amino, nitro, or thiol.
As used herein, the terms "optional" or "optionally" means that the subsequently described event or circumstance can or cannot occur, and that the description includes instances where said event or circumstance occurs and instances where it does not.

Disclosed are the components to be used to prepare the compositions of this disclosure as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these complexes cannot be explicitly disclosed, each is specifically contemplated and described herein. For example, if a particular complex is disclosed and discussed and a number of modifications that can be made to a number of molecules including the complexes are discussed, specifically contemplated is each and every combination and permutation of the complex and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions disclosed herein. Thus, if there are a variety of additional steps that can be performed it is understood that each of these additional steps can be performed with any specific embodiment or combination of embodiments of the methods described herein.

As used herein, the term "substituted" is contemplated to include all permissible substituents of organic complexes. In a broad aspect, the permissible substituents include acyclic and cyclic, branched and unbranched, carbocyclic and heterocyclic, and aromatic and nonaromatic substituents of organic complexes. Illustrative substituents include, for example, those described below. The permissible substituents can be one or more and the same or different for appropriate organic complexes. For purposes of this disclosure, the heteroatoms, such as nitrogen, can have hydrogen substituents and/or any permissible substituents of organic complexes described herein which satisfy the valences of the heteroatoms. This disclosure is not intended to be limited in any manner by the permissible substituents of organic complexes. Also, the terms "substitution" or "substituted with" include the implicit proviso that such substitution is in accordance with permitted valence of the substituted atom and the substituent, and that the substitution results in a stable complex, e.g., a complex that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

In defining various terms, "$A^1$", "$A^2$", "$A^3$", "$A^4$" and "$A^5$" are used herein as generic symbols to represent various specific substituents. These symbols can be any substituent, not limited to those disclosed herein, and when they are defined to be certain substituents in one instance, they can, in another instance, be defined as some other substituents.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term "heterocycloalkyl" is a type of cycloalkyl group as defined above, and is included within the meaning of the term "cycloalkyl," where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The terms "alkoxy" and "alkoxyl" as used herein to refer to an alkyl or cycloalkyl group bonded through an ether linkage; that is, an "alkoxy" group can be defined as —OA' where $A^1$ is alkyl or cycloalkyl as defined above. "Alkoxy" also includes polymers of alkoxy groups as just described; that is, an alkoxy can be a polyether such as —OA$^1$-OA$^2$ or —OA$^1$-(OA$^2$)$_a$-OA$^3$, where "a" is an integer of from 1 to 200 and A$^1$, A$^2$, and A$^3$ are alkyl and/or cycloalkyl groups.

The term "alkenyl" as used herein is a hydrocarbon group of from 2 to 24 carbon atoms with a structural formula containing at least one carbon-carbon double bond. Asymmetric structures such as (A$^1$A$^2$)C=C(A$^3$A$^4$) are intended to include both the E and Z isomers. This can be presumed in structural formulae herein wherein an asymmetric alkene is present, or it can be explicitly indicated by the bond symbol C=C. The alkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkenyl" as used herein is a non-aromatic carbon-based ring composed of at least three carbon atoms and containing at least one carbon-carbon double bound, i.e., C=C. Examples of cycloalkenyl groups include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl group as defined above, and is included within the meaning of the term "cycloalkenyl," where at least one of the carbon atoms of the ring is replaced with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkynyl" as used herein is a non-aromatic carbon-based ring composed of at least seven carbon atoms and containing at least one carbon-carbon triple bound. Examples of cycloalkynyl groups include, but are not limited to, cycloheptynyl, cyclooctynyl, cyclononynyl, and the like. The term "heterocycloalkynyl" is a type of cycloalkenyl group as defined above, and is included within the meaning of the term "cycloalkynyl," where at least one of the carbon atoms of the ring is replaced with a heteroatom such as, but not limited to, nitrogen, oxygen, sulfur, or phosphorus. The cycloalkynyl group and heterocycloalkynyl group can be substituted or unsubstituted. The cycloalkynyl group and heterocycloalkynyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "aldehyde" as used herein is represented by the formula —C(O)H. Throughout this specification "C(O)" is a short hand notation for a carbonyl group, i.e., C=O.

The terms "amine" or "amino" as used herein are represented by the formula —NA$^1$A$^2$, where A$^1$ and A$^2$ can be, independently, hydrogen or alkyl, cycloalkyl, alkenyl, cycloalkenyl, alkynyl, cycloalkynyl, aryl, or heteroaryl group as described herein.

The term "alkylamino" as used herein is represented by the formula —NH(-alkyl) where alkyl is a described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula —N(-alkyl)$_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "carboxylic acid" as used herein is represented by the formula —C(O)OH.

The term "ester" as used herein is represented by the formula —OC(O)A$^1$ or —C(O)OA$^1$, where A$^1$ can be alkyl, cycloalkyl, alkenyl, cycloalkenyl, alkynyl, cycloalkynyl, aryl, or heteroaryl group as described herein. The term "polyester" as used herein is represented by the formula -(A$^1$O(O)C-A$^2$-C(O)O)$_a$— or -(A$^1$O(O)C-A$^2$-OC(O))$_a$—, where A$^1$ and A$^2$ can be, independently, an alkyl, cycloalkyl, alkenyl, cycloalkenyl, alkynyl, cycloalkynyl, aryl, or heteroaryl group described herein and "a" is an interger from 1 to 500. "Polyester" is as the term used to describe a group that is produced by the reaction between a complex having at least two carboxylic acid groups with a complex having at least two hydroxyl groups.

The term "ether" as used herein is represented by the formula A$^1$OA$^2$, where A$^1$ and A$^2$ can be, independently, an alkyl, cycloalkyl, alkenyl, cycloalkenyl, alkynyl, cycloalkynyl, aryl, or heteroaryl group described herein. The term "polyether" as used herein is represented by the formula -(A$^1$O-A$^2$O)$_a$—, where A$^1$ and A$^2$ can be, independently, an alkyl, cycloalkyl, alkenyl, cycloalkenyl, alkynyl, cycloalkynyl, aryl, or heteroaryl group described herein and "a" is an integer of from 1 to 500. Examples of polyether groups include polyethylene oxide, polypropylene oxide, and polybutylene oxide.

The term "halide" as used herein refers to the halogens fluorine, chlorine, bromine, and iodine.

The term "heterocyclyl," as used herein refers to single and multi-cyclic non-aromatic ring systems and "heteroaryl as used herein refers to single and multi-cyclic aromatic ring systems: in which at least one of the ring members is other than carbon. The terms includes azetidine, dioxane, furan, imidazole, isothiazole, isoxazole, morpholine, oxazole, oxazole, including, 1,2,3-oxadiazole, 1,2,5-oxadiazole and 1,3,4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

The term "hydroxyl" as used herein is represented by the formula —OH.

The term "azide" as used herein is represented by the formula —N$_3$.

The term "nitro" as used herein is represented by the formula —NO$_2$.

The term "nitrile" as used herein is represented by the formula —CN.

The term "silyl" as used herein is represented by the formula —SiA$^1$A$^2$A$^3$, where A$^1$, A$^2$, and A$^3$ can be, independently, hydrogen or an alkyl, cycloalkyl, alkoxy, alkenyl, cycloalkenyl, alkynyl, cycloalkynyl, aryl, or heteroaryl group as described herein.

The term "sulfo-oxo" as used herein is represented by the formulas —S(O)A$^1$, S(O)$_2$A$^1$, —OS(O)$_2$A$^1$, or —OS(O)$_2$OA$^1$, where A$^1$ can be hydrogen or an alkyl, cycloalkyl, alkenyl, cycloalkenyl, alkynyl, cycloalkynyl, aryl, or heteroaryl group as described herein. Throughout this specification "S(O)" is a short hand notation for S=O. The term "sulfonyl" is used herein to refer to the sulfo-oxo group represented by the formula —S(O)$_2$A$^1$, where A$^1$ can be hydrogen or an alkyl, cycloalkyl, alkenyl, cycloalkenyl, alkynyl, cycloalkynyl, aryl, or heteroaryl group as described herein. The term "sulfone" as used herein is represented by the formula A$^1$S(O)$_2$A$^2$, where A$^1$ and A$^2$ can be, independently, an alkyl, cycloalkyl, alkenyl, cycloalkenyl, alkynyl, cycloalkynyl, aryl, or heteroaryl group as described herein. The term "sulfoxide" as used herein is represented by the formula A$^1$S(O)A$^2$, where A$^1$ and A$^2$ can be, independently, an alkyl, cycloalkyl, alkenyl, cycloalkenyl, alkynyl, cycloalkynyl, aryl, or heteroaryl group as described herein.

The term "thiol" as used herein is represented by the formula —SH.

"R$^1$," "R$^2$," "R$^3$," "R$^n$," where n is an integer, as used herein can, independently, possess one or more of the groups listed above. For example, if R$^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

Complexes described herein may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this disclosure are preferably those that result in the formation of stable or chemically feasible complexes. In is also contemplated that, in certain aspects, unless expressly indicated to the contrary, individual substituents can be further optionally substituted (i.e., further substituted or unsubstituted).

In some aspects, a structure of a complex can be represented by a formula:

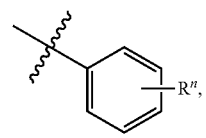

which is understood to be equivalent to a formula:

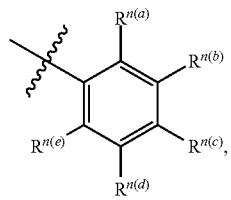

wherein n is typically an integer. That is, R$^n$ is understood to represent up to five independent non-hydrogen substituents, R$^{n(a)}$, R$^{n(b)}$, R$^{n(c)}$, R$^{n(d)}$, R$^{n(e)}$. By "independent substituents," it is meant that each R substituent can be independently defined. For example, if in one instance R$^{n(a)}$ is halogen, then R$^{n(b)}$ is not necessarily halogen in that instance.

Several references to R$^1$, R$^2$, R$^3$, R$^4$, R$^5$, R$^6$, etc. are made in chemical structures and moieties disclosed and described herein. Any description of R$^1$, R$^2$, R$^3$, R$^4$, R$^5$, R$^6$, etc. in the specification is applicable to any structure or moiety reciting R$^1$, R$^2$, R$^3$, R$^4$, R$^5$, R$^6$, etc. respectively.

EXAMPLES

The following examples are put forth so as to provide those of ordinary skill in the art with a complete disclosure and description of how the complexes, compositions, articles, devices and/or methods claimed herein are made and evaluated, and are intended to be purely exemplary and are not intended to be limiting in scope. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Various methods for the preparation method of the complexes and devices described herein are recited in the examples. These methods are provided to illustrate various methods of preparation, but are not intended to limit any of the methods recited herein. Accordingly, one of skill in the art in possession of this disclosure could readily modify a recited method or utilize a different method to prepare one or more of the complexes and devices described herein. The following aspects are only exemplary and are not intended to be limiting in scope. Temperatures, catalysts, concentrations, reactant compositions, and other process conditions can vary, and one of skill in the art, in possession of this disclosure, could readily select appropriate reactants and conditions for a desired complex and devices.

Example 1. Synthesis

General Synthetic Procedure: All commercial reagents were purchased and used as received without further purification. Pd(OAc)$_2$ was purchased from Pressure Chemical Co. n-Bu$_4$NBr, CuI, 2-(tributylstannyl)pyridine and 2-picolinic acid were purchased from Sigma Aldrich. Silica gel (40-60 μm) was purchased from Agela Technologies and BDH. DMSO, toluene (low water), and acetic acid were purchased from Alfa Aesar, J. T. Baker, Fluke and BDH respectively.

All reactions were carried out under an inert N$_2$ atmosphere in oven-dried glassware. External bath temperatures were used to record all reaction temperatures. Flash column chromatography was carried out with silica gel. Proton and carbon NMR spectra ($^1$H NMR and $^{13}$C NMR) were recorded in dimethyl sulfoxide-d$_6$ (DMSO-d$_6$) on a Varian 400 MHz NMR spectrometer. The solvent residual peak (DMSO-d$_6$) was calibrated to 2.50 ppm for $^1$H NMR and 39.52 ppm for $^{13}$C NMR. Multiplicities are abbreviated as follows: s=singlet, d=doublet, dd=doublet of doublets, t=triplet, br=broad, m=multiplet.

Synthesis of 2-(3-(3-(pyridin-2-yl)phenoxy)phenyl) pyridine

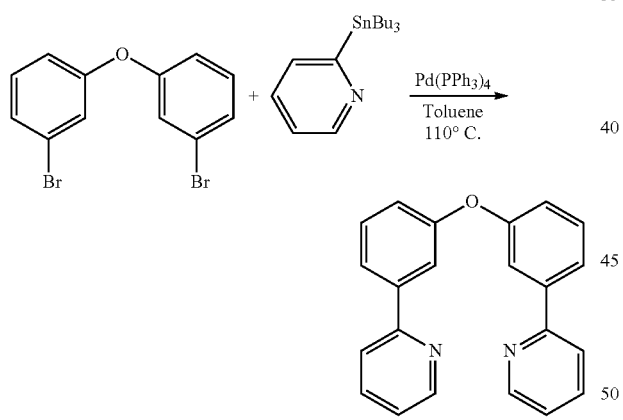

To a 100 mL three-neck round-bottom flask were added 1-bromo-3-(3-bromophenoxy)benzene (656 mg, 2 mmol) and 2-(tributylstannyl)pyridine (1.76 g, 4.8 mmol). The flask was evacuated and backfilled with nitrogen for three cycles. Tetrakis(triphenylphosphine)palladium(0) (115 mg, 0.1 mmol) and toluene (20 mL) were added under nitrogen, and the reaction mixture was stirred at 110° C. under nitrogen for 24 hours. After cooling to room temperature, the mixture was poured into 50 mL of water and extracted with ethyl acetate (3×100 mL), and the combined organic layers were dried with anhydrous Na$_2$SO$_4$ and concentrated under reduced pressure. Purification of the resulting residue by column chromatography (hexanes: ethyl acetate=5:1) afforded the desired product as a white solid (550 mg, 84%). $^1$H NMR (DMSO-d$_6$, 400 MHz): δ 7.16 (dd, J=8.0, 2.4 Hz, 2H), 7.33-7.38 (m, 2H), 7.54 (t, J=7.6 Hz, 2H), 7.79 (m, 2H), 7.85-7.91 (m, 4H), 7.98 (d, J=8 Hz, 2H), 8.63 (d, J=4.4 Hz, 2H).

Synthesis of Palladium (II) 2-(3-(3-(pyridin-2-yl) phenoxy)phenyl) pyridine

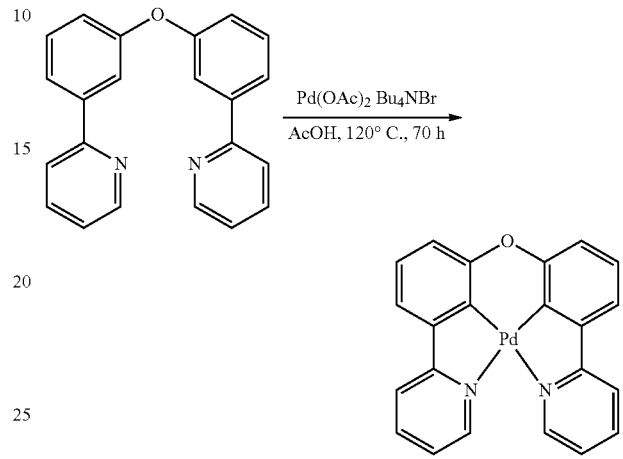

2-(3-(3-(pyridin-2-yl)phenoxy)phenyl)pyridine (470 mg, 1.45 mmol), Pd(OAc)$_2$ (348 mg, 1.55 mmol), and n-Bu$_4$NBr (48 mg, 0.149 mmol) were added to a 100 mL three-neck round-bottom flask, then 30 mL acetic acid was added. The mixture was sparged with nitrogen for 30 minutes, then stirred at ambient temperature for 12 hours. The mixture was subsequently heated in an oil bath at a temperature of 110° C. for another 72 hours. 100 mL of water was added after the mixture was cooled down to room temperature. The resulting precipitate was collected through filtration, washed with water three times, then dried in air. The collected solid was purified through column chromatography on silica gel using dichloromethane as eluent to afford the desired Pd3O3 as a light yellow solid (390 mg, 63%). $^1$H NMR (DMSO-d6, 400 MHz): δ 7.16 (d, J=7.6 Hz, 2H), 7.27 (dd, J=15.6, 8.0 Hz, 2H), 7.55 (dd, J=12.4, 6.4 Hz, 2H), 7.74 (d, J=7.2 Hz, 2H), 8.09-8.15 (m, 2H), 8.28 (d, J=8.4 Hz, 2H), 8.97 (d, J=5.2 Hz, 2H). MS (APCI+) m/z: [M]+ calcd for C$_{22}$H$_{15}$ON$_2$OPd 429.0219, found 429.0232.

Example 2. Preparation of Devices

Materials:
TrisPCz (9,9',9''-triphenyl-9H,9'H,9''H-3,3': 6'3''-tercarbazole) and BPyTP (2,7-di(2,2'-bipyridin-5-yl)triphenylene) were synthesized by methods known in the art. HATCN (1,4,5,8,9,11-hexaazatriphenylene-hexacarbonitrile), NPD (N,N'-diphenyl-N,N'-bis(1-naphthyl)-1,1'-biphenyl-4,4''-diamine), BAlq bis(2-methyl-8-quinolinolato)(biphenyl-4-olato)aluminum, and mCBP 3,3-di(9H-carbazol-9-yl)biphenyl were all provided from commercial suppliers.

Devices are constructed in a thermal vapor deposition chamber with source shutters. DC current is passed through a resistive metal container containing the material to be deposited. The rate and thickness of the deposition are monitored using quartz microbalances and can be controlled by varying the power supplied to the heating element. Once the correct deposition rate is reached, the shutters are opened and the layer is deposited. After reaching the correct thickness the shutters are closed and the power is shut off. This process is repeated with each material to achieve the desired layers and thicknesses in the OLED stack.

Figure 5A:
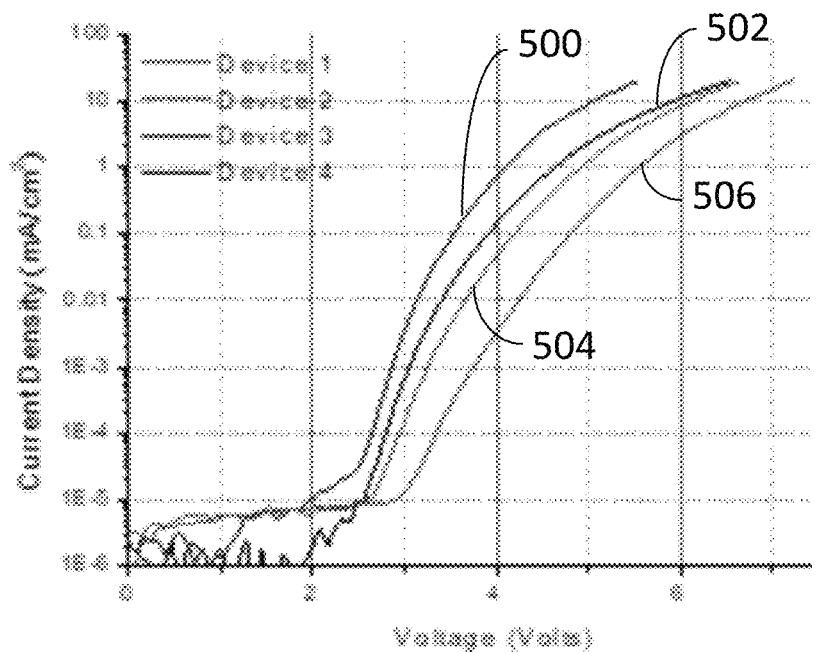
FIG. 5A shows voltage versus current density for Devices 1-4.
Figure 5B:
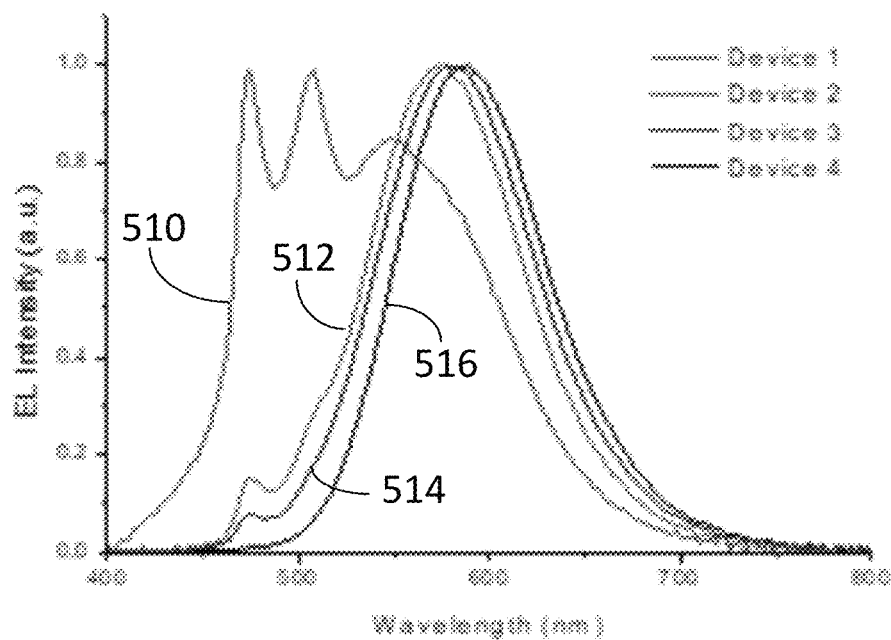
FIGS. 5B and 5C show electroluminescent (EL) intensity versus wavelength versus for Devices 1-4.
Figure 5C:
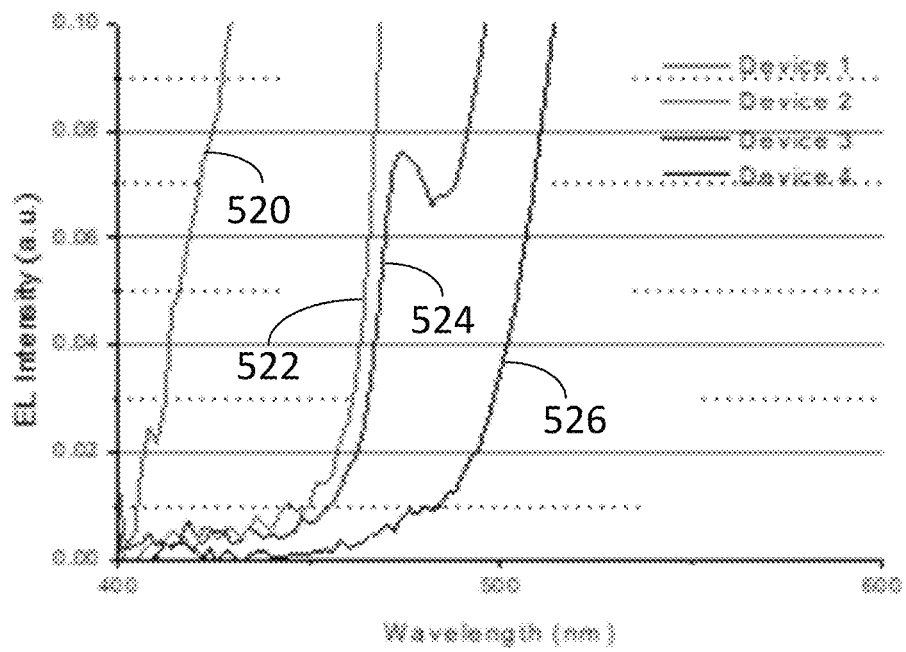
Figure 5D:
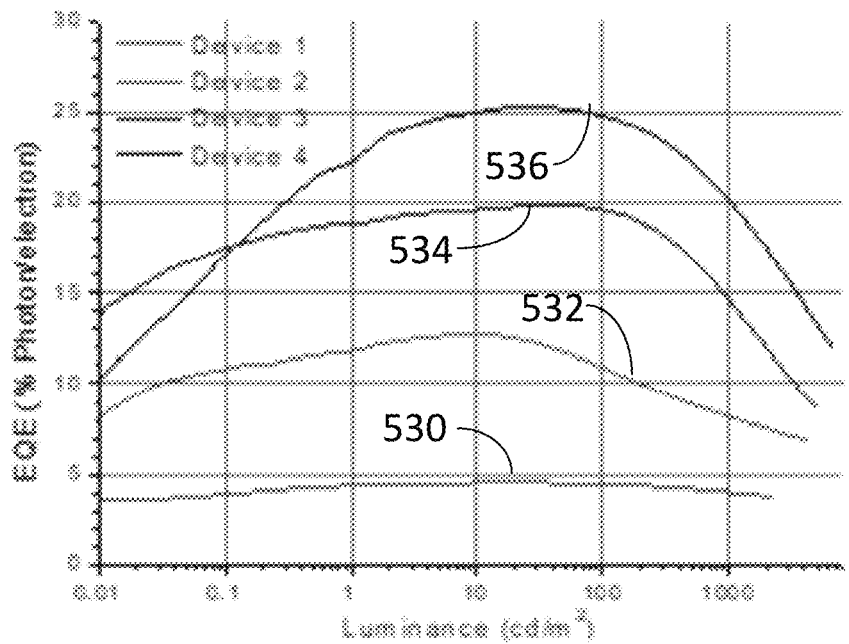
FIG. 5D shows external quantum efficiency (EQE) versus luminance for Devices 1-4.
Figure 5E:
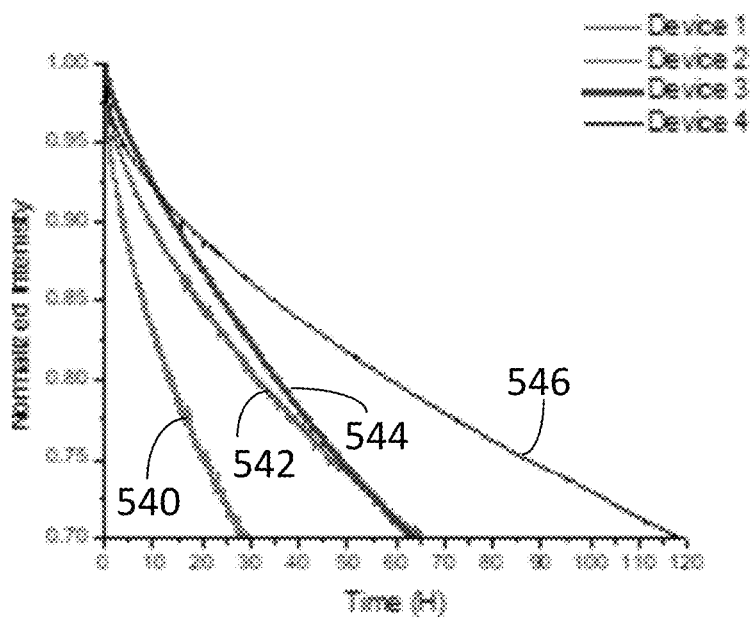
FIG. 5E show intensity versus time for Devices 1-4.

Device 1: HATCN (10 nm)/NPD (40 nm)/Tris-PCz (10 nm)/2% Pd3O3:mCBP (30 nm)/Balq (10 nm)/BpyTP (40 nm)/LiF (1 nm)/Al Device 2: HATCN (10 nm)/NPD (40 nm)/Tris-PCz (10 nm)/6% Pd3O3:mCBP (30 nm)/Balq (10 nm)/BpyTP (40 nm)/LiF (1 nm)/Al Device 3: HATCN (10 nm)/NPD (40 nm)/Tris-PCz (10 nm)/10% Pd3O3:mCBP (25 nm)/Balq (10 nm)/BpyTP (40 nm)/LiF (1 nm)/Al Device 4: HATCN (10 nm)/NPD (40 nm)/Tris-PCz (10 nm)/20% Pd3O3:mCBP (10 nm)/10% Pd3O3:mCBP (10 nm)/6% Pd3O3:mCBP (10 nm)/Balq (10 nm)/BpyTP (40 nm)/LiF (1 nm)/Al Device 5: HATCN (10 nm)/NPD (40 nm)/Tris-PCz (10 nm)/20% Pd3O3:mCBP (4 nm)/2% Pd3O3:mCBP (8 nm)/20% Pd3O3:mCBP (4 nm)/6% Pd3O3:mCBP (8 nm)/Balq (10 nm)/BpyTP (40 nm)/LiF (1 nm)/Al Device 6: HATCN (10 nm)/NPD (40 nm)/Tris-PCz (10 nm)/20% Pd3O3:mCBP (8 nm)/2% Pd3O3:mCBP (8 nm)/6% Pd3O3:mCBP (8 nm)/Balq (10 nm)/BpyTP (40 nm)/LiF (1 nm)/Al Device 7: HATCN (10 nm)/NPD (40 nm)/Tris-PCz (10 nm)/20% Pd3O3:mCBP (4 nm)/2% Pd3O3:mCBP (5 nm)/20% Pd3O3:mCBP (4 nm)/2% Pd3O3:mCBP (5 nm)/6% Pd3O3:mCBP (8 nm)/Balq (10 nm)/BpyTP (40 nm)/LiF (1 nm)/Al Device 8: HATCN (10 nm)/NPD (40 nm)/Tris-PCz (10 nm)/20% Pd3O3:mCBP (4 nm)/2% Pd3O3:mCBP (7 nm)/20% Pd3O3:mCBP (4 nm)/2% Pd3O3:mCBP (7 nm)/6% Pd3O3:mCBP (8 nm)/Balq (10 nm)/BpyTP (40 nm)/LiF (1 nm)/Al FIG. 5A shows current density for Devices 1-4 in plots 500, 502, 504, and 506, respectively, all employing Pd3O3 in mCBP. By increasing the dopant concentration from 2% to 6% then to 10%, an improvement in the device efficiency at the cost of the emission color can be observed. At low concentration, high monomer emission at 478 nm can be seen in FIG. 5B, in which plots 510, 512, 514, and 516 correspond to Devices 1-4, respectively, and this blue emission is desirable for white lighting applications. Plots 520, 522, 524, and 526 in FIG. 5C show electroluminescence intensity versus wavelength for Devices 1-4. Plots 530, 532, 534, and 536 in FIG. 5D show external quantum efficiency (EQE) versus luminance for Devices 1-4, respectively. When the dopant concentration is increased to 10% in Device 3, the device has a peak efficiency of 20%, which is an improvement over Device 1. Plots 540, 542, 544, and 546 of FIG. 5E show intensity versus time for Devices 1-4, respectively. As seen in FIG. 5E, the lifetime doubled between Devices 1 and 3. In Device 4, a split emissive layer structure was employed. By breaking the emissive layer into three separate layers with dopant concentration stepping from 20% to 10% to 6%, the device performance improved even further. Device 4 showed a peak efficiency over 25%, an efficiency at 1000 cd/m² of 20%, and a lifetime almost double that of Device 3. However, with all these improvements the monomer peak at 478 nm has been reduced to less than 1% of the total peak height for Device 4.

Figure 6A:
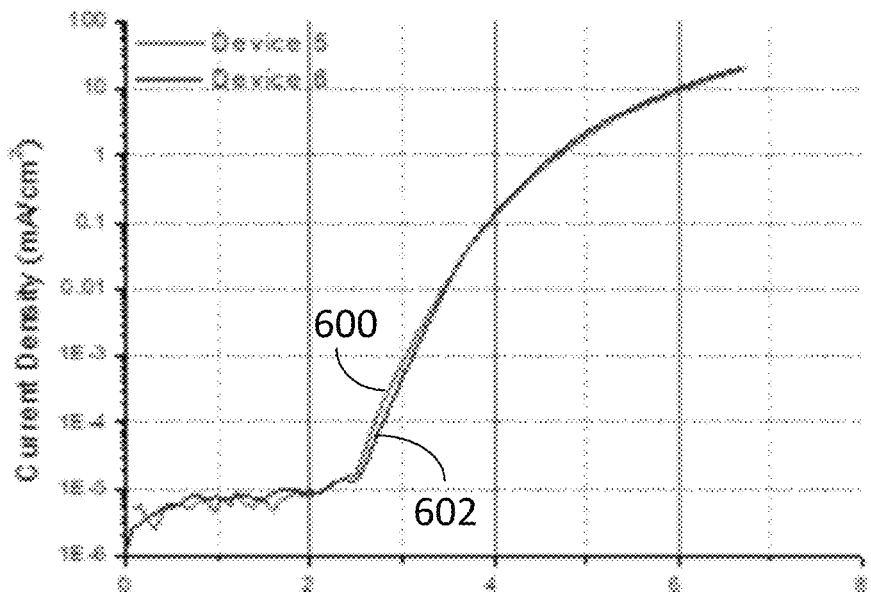
FIG. 6A shows current density versus voltage for Devices 5 and 6.
Figure 6B:
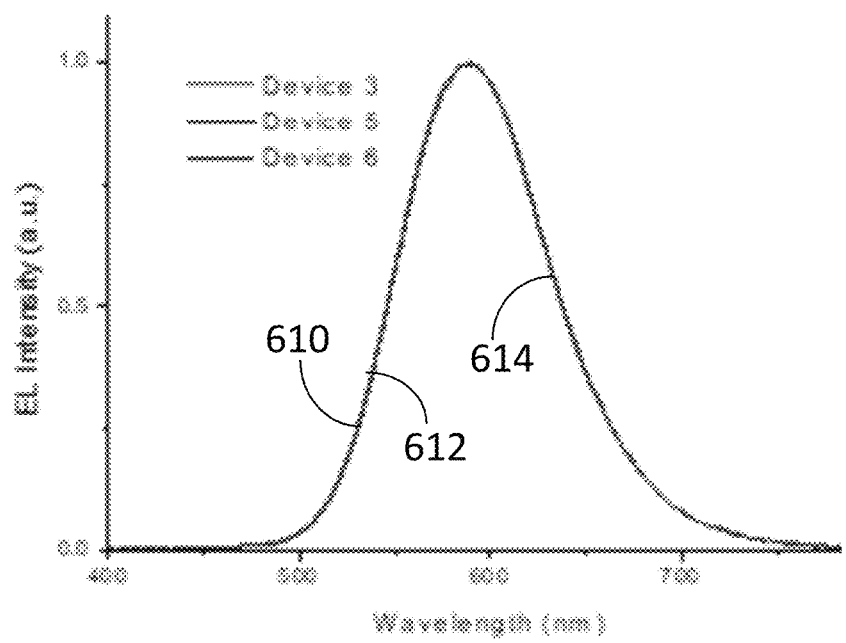
FIG. 6B shows EL intensity versus wavelength for Devices 3, 5, and 6.
Figure 6C:
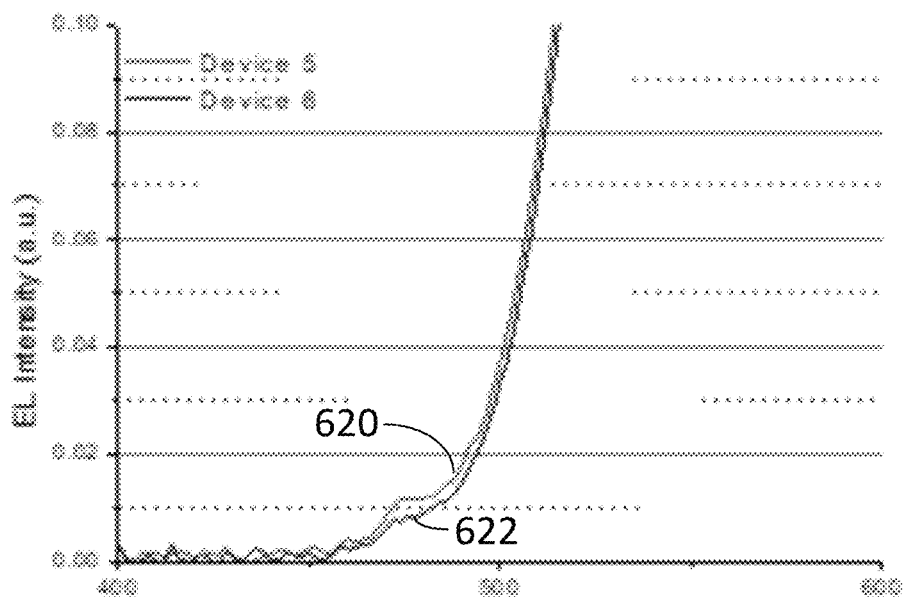
FIG. 6C shows EL intensity versus wavelength for Devices 5 and 6.
Figure 6D:
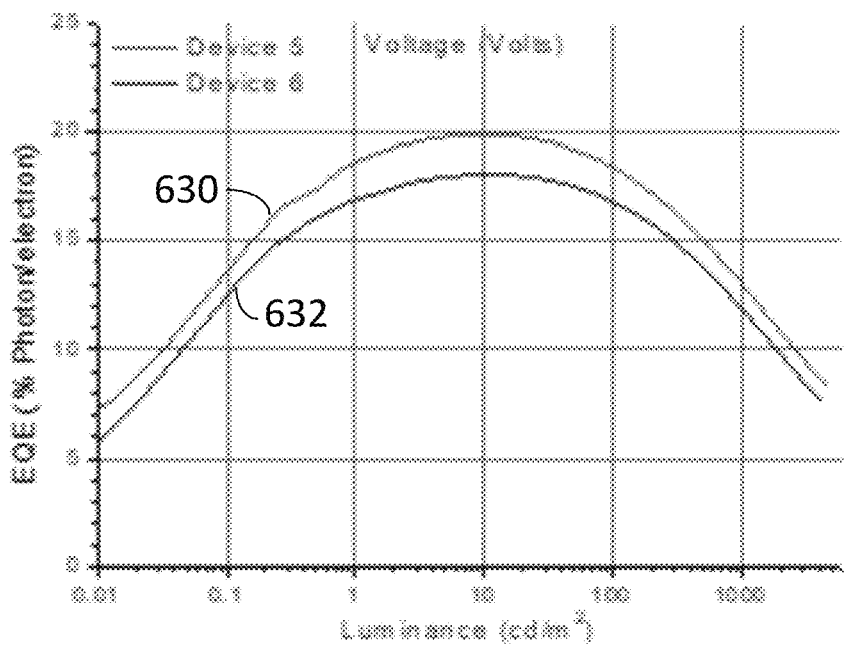
FIG. 6D shows EQE versus luminance for Devices 5 and 6.
Figure 6E:
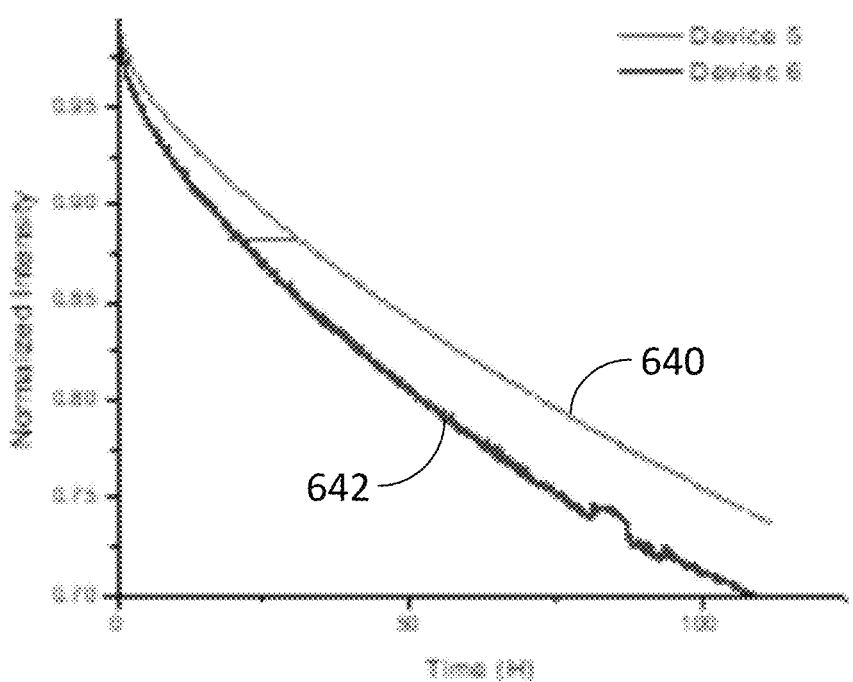
FIG. 6E shows intensity versus time for Devices 5 and 6.

Adding low concentration layers into the emissive stack can alter the charge balance of the device while allowing for monomer emission to still be present. FIGS. 6A-6E show the results of splitting the emissive layer into three stacks and placing a low concentration layer between each stack one at a time. Plots 600 and 602 in FIG. 6A show current density versus voltage for Devices 5 and 6, respectively. Plots 610, 612, and 614 in FIG. 6B show electroluminescent intensity versus wavelength for Devices 3, 5, and 6 respectively. Plots 620 and 622 in FIG. 6C show electroluminescent intensity versus wavelength for Devices 5 and 6, respectively. Plots 630 and 632 in FIG. 6D show EQE versus luminance for Devices 5 and 6, respectively. FIG. 2D shows a high peak efficiency of 20% is maintained for Device 6 with similar lifetime to that of Device 4. Plots 640 and 642 in FIG. 6E show intensity versus time for Devices 5 and 6, respectively. FIG. 6C shows an increase in the monomer peak to 1.3% of the total peak height.

Figure 7A:
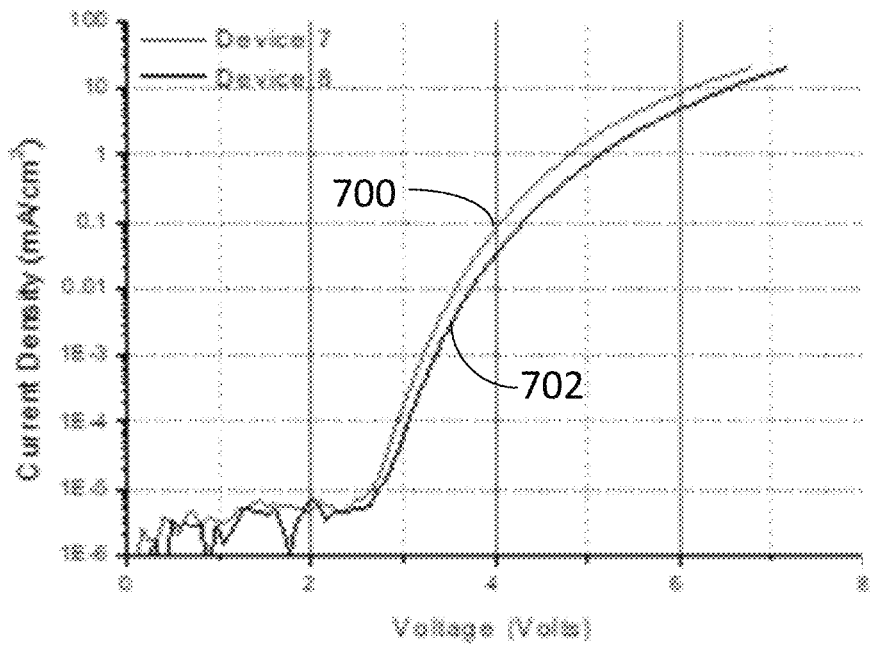
FIG. 7A shows current density versus voltage for Devices 7 and 8.
Figure 7B:
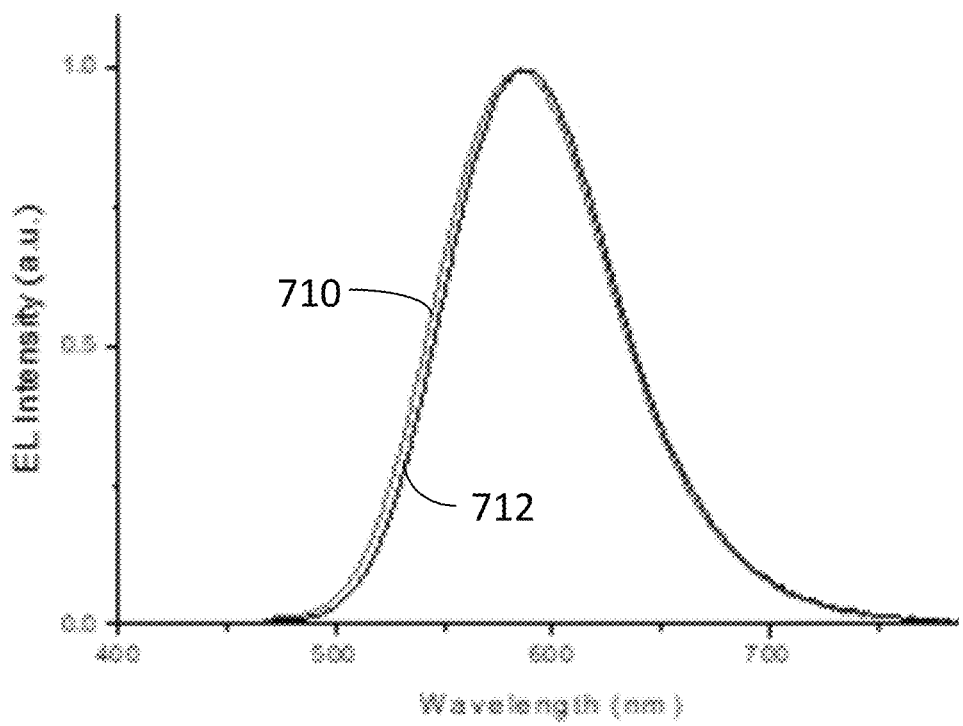
FIG. 7B shows EL intensity versus wavelength for Devices 7 and 8.
Figure 7C:
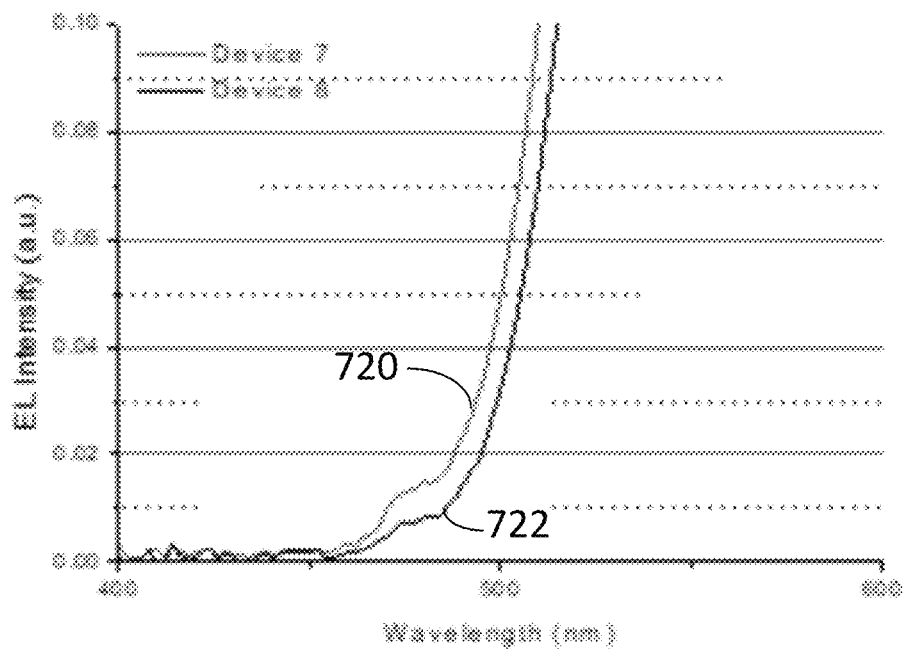
FIG. 7C shows EL intensity versus wavelength for Devices 7 and 8.
Figure 7D:
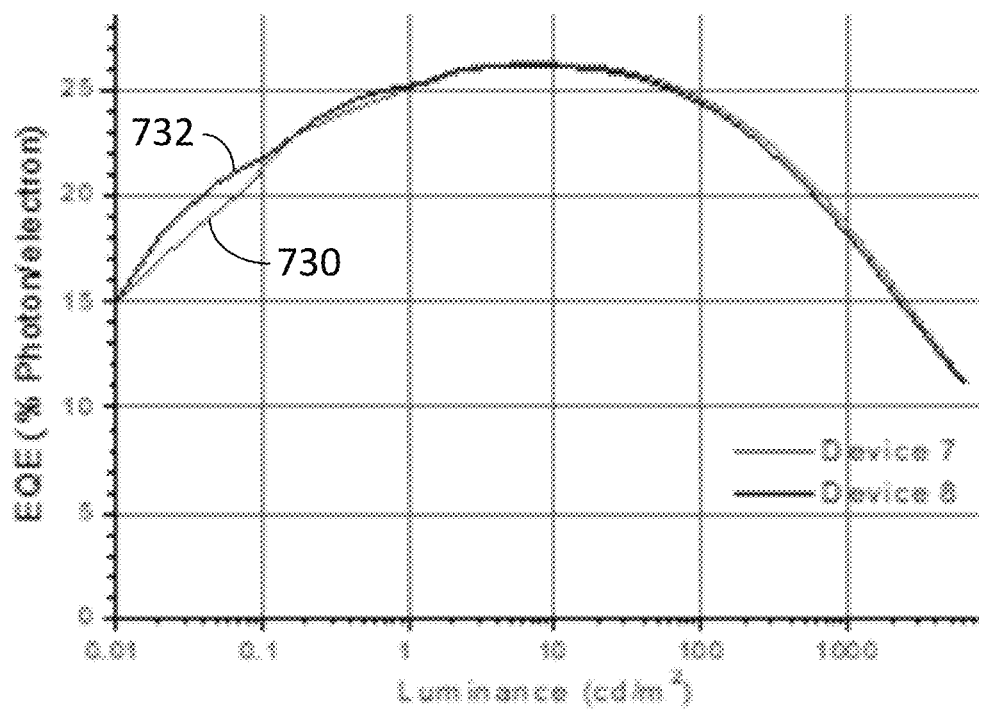
FIG. 7D shows EQE versus luminance for Devices 7 and 8.
Figure 7E:
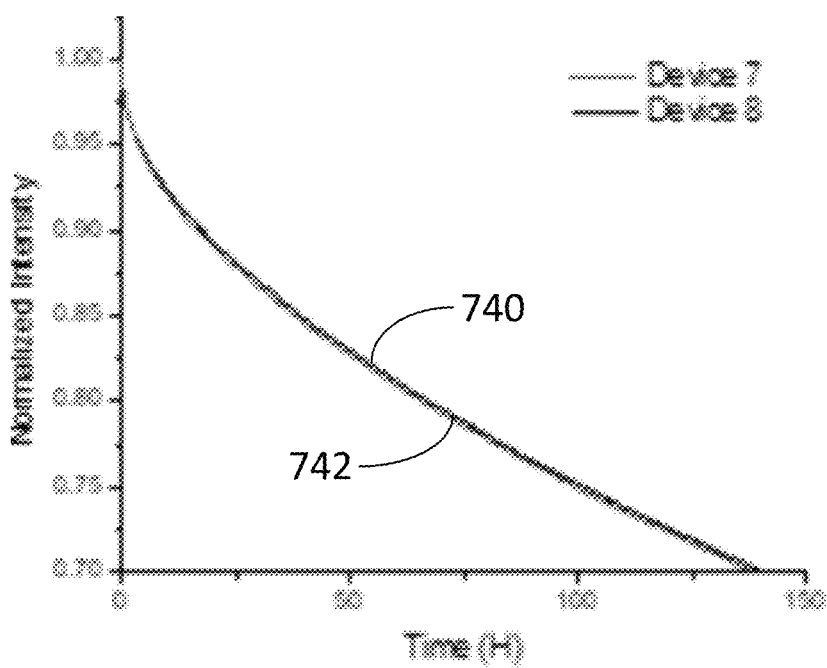
FIG. 7E shows intensity versus time for Devices 7 and 8.

Plots 700 and 702 in FIG. 7A show current density versus voltage for Devices 7 and 8, respectively. Plots 710 and 712 in FIG. 7B show electroluminescent intensity versus wavelength for Devices 7 and 8, respectively. Plots 720 and 722 in FIG. 7C show electroluminescent intensity versus wavelength for Devices 7 and 8, respectively. Plots 730 and 732 show EQE versus luminance for Devices 7 and 8, respectively. Plots 740 and 742 show intensity versus time for Devices 7 and 8, respectively. Devices 7 and 8 have the same device architecture as Devices 5 and 6 but with two low concentration layers. This allows the peak efficiency to surpass 26%, an increase in the monomer peak to 1.5% of the total peak height, and improvement in device lifetime.

What is claimed is:

1. An organic light emitting diode device comprising:
   a hole transporting layer, an emissive layer, and an electron transporting layer, the emissive layer comprising:
   a first sublayer comprising a first emitter as a dopant;
   a second sublayer comprising a second emitter as a dopant; and
   a third sublayer comprising a third emitter as a dopant,
   a fourth sublayer comprising a fourth emitter; and
   a fifth sublayer comprising a fifth emitter;
   wherein the first sublayer is between the hole-transporting layer and the second sublayer, the second sublayer is between the first sublayer and the third sublayer, the third sublayer is between the second sublayer and the electron-transporting layer, the fourth sublayer is between the second sublayer and the fifth sublayer, the fifth sublayer is between the fourth sublayer and the third sublayer,
   wherein a concentration of the first emitter in the first sublayer exceeds a concentration of the third emitter in the third sublayer, and the concentration of the third emitter in the third sublayer exceeds a concentration of the second emitter in the second sublayer, a concentration of the fourth emitter in the fourth sublayer is substantially the same as the concentration of the first emitter in the first sublayer, a concentration of the fifth emitter in the fifth sublayer is substantially the same as the concentration of the second emitter in the second sublayer, and the concentration of the third emitter in the third sublayer exceeds the concentration of the fifth emitter in the fifth sublayer; and
   wherein the first emitter, the second emitter, the third emitter, or any combination thereof, comprises a compound of General Formula I, General Formula II, General Formula III, General Formula IV, General Formula V, or General Formula VI:

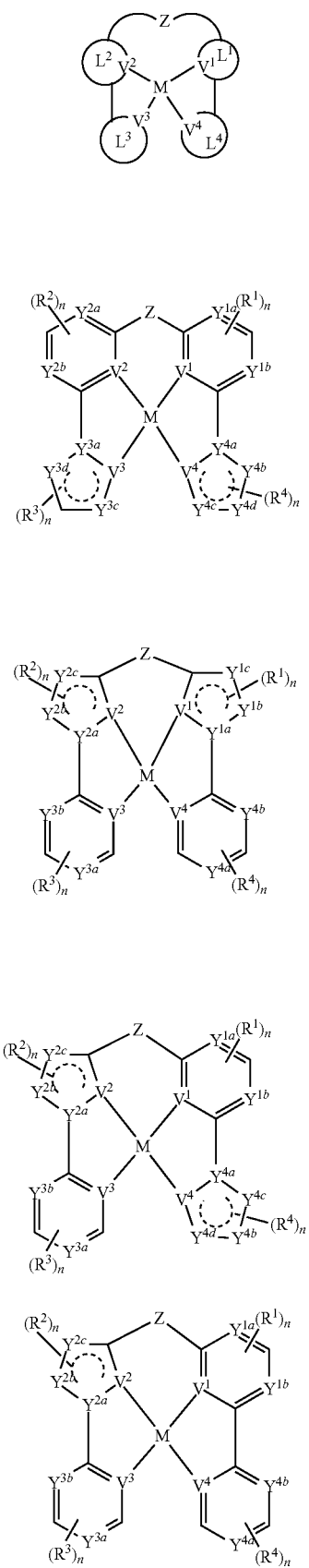

wherein:
M is $Pd^{2+}$, $Ir^+$, $Rh^+$, or $Au^{3+}$,
each of $V^1$, $V^2$, $V^3$, and $V^4$ is coordinated to M and is independently N, C, P, B, or Si,
each of $L^1$, $L^2$, $L^3$, and $L^4$ is independently a substituted or unsubstituted 6-membered aryl or 6-membered heteroaryl, and
Z is O, S, NR, $CR_2$, $SiR_2$, BR, PR, where each R is independently substituted or unsubstituted $C_1$-$C_4$ alkyl or aryl;
each $R^1$, $R^2$, $R^3$, and $R^4$ represents a non-hydrogen substituent and is independently substituted or unsubstituted $C_1$-$C_4$ alkyl or aryl;
each n is independently an integer of 0 to 4, valency permitting; and
each $Y^{1a}$, $Y^{2a}$, $Y^{1b}$, $Y^{2b}$, $Y^{3a}$, $Y^{3c}$, $Y^{3d}$, $Y^{4a}$, $Y^{4b}$, $Y^{4c}$, $Y^{4d}$ is independently N, $NR^{4a}$, or $CR^{4b}$, where each $R^{4a}$ and $R^{4b}$ is independently hydrogen, hydroxyl, amino, nitro, thiol, or substituted or unsubstituted $C_1$-$C_4$ alkyl, alkoxy, or aryl;
provided that when the first emitter, the second emitter, the third emitter, or any combination thereof, comprises a compound of General Formula V, then only one of $V^2$ and $Y^{2a}$ is N.

2. The device of claim 1, wherein the first sublayer is in direct contact with the second sublayer and the second sublayer is in direct contact with the third sublayer.

3. The device of claim 1, wherein the emissive layer is in direct contact with the hole-transporting layer and the electron-transporting layer.

4. The device of claim 1, wherein at least one of conditions (i), (ii), and (iii) is true:
(i) the concentration of the first emitter in the first sublayer is in a range of about 12 wt % to about 50 wt %;
(ii) the concentration of the second emitter in the second sublayer is in a range of about 1 wt % to about 6 wt %; and
(iii) the concentration of the third emitter in the third sublayer is in a range of about 4 wt and about 15 wt %.

5. The device of claim 1, further comprising an electron-blocking layer and a hole-blocking layer, wherein the electron-blocking layer is between the emissive layer and the hole-transporting layer, and the hole-blocking layer is between the emissive layer and the electron-transporting layer.

6. The device of claim 1, wherein the emissive layer comprises six or more sublayers or seven or more sublayers, each sublayer comprising an emitter as a dopant.

7. The device of claim 1, wherein the concentration of the fourth emitter in the fourth sublayer is in a range of about 12 wt % to about 50 wt %.

8. The device of claim 1, wherein the concentration of the fifth emitter in the fifth sublayer is in a range of about 1 wt % to about 6 wt %.

9. The device of claim 1, wherein at least one of conditions (i), (ii), and (iii) is true:
   (i) the first sublayer has a thickness of at least about 4 nm,
   (ii) the second sub layer has a thickness of at least about 1 nm or at least about 2 nm, and
   (iii) the third sublayer has a thickness of at least about 4 nm or at least about 6 nm.

10. The device of claim 1, wherein the device is a phosphorescent organic light emitting diode device.

11. A photovoltaic device or a luminescent display device comprising the device of claim 1.

12. An organic light emitting diode device comprising:
   an emissive layer, the emissive layer comprising:
      a first sublayer comprising a first emitter as a dopant;
      a second sublayer comprising a second emitter as a dopant; and
      a third sublayer comprising a third emitter as a dopant,
   wherein the second sublayer is between the first sublayer and the third sublayer, and a concentration of the first emitter in the first sublayer exceeds a concentration of the third emitter in the third sublayer, and the concentration of the third emitter in the third sublayer exceeds a concentration of the second emitter in the second sublayer, and
   wherein the first emitter, the second emitter, the third emitter, or any combination thereof, comprises a compound of General Formula III, General Formula IV, or General Formula V:

General Formula III

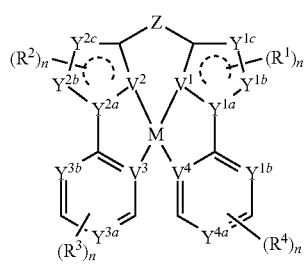

General Formula IV

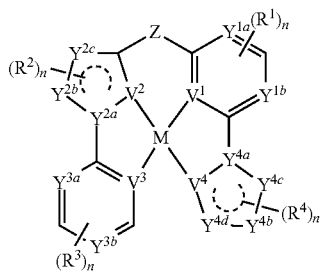

General Formula V

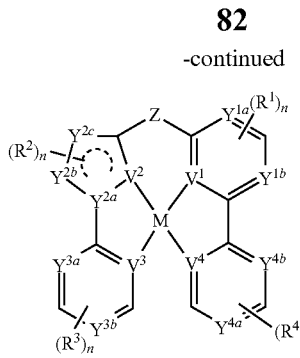

wherein:

in General Formula III, General Formula IV, and General Formula V, M is $Pd^{2+}$, $Ir^+$, $Rh^+$, or $Au^{3+}$, each of $V^1$, $V^2$, $V^3$, and $V^4$ is coordinated to M and is independently N, C, P, B, or Si, Z is O, S, NR, $CR_2$, $SiR_2$, BR, PR,

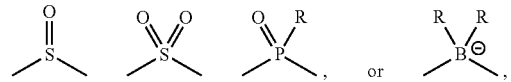

where each R is independently substituted or unsubstituted $C_1$-$C_4$ alkyl or aryl;

each $R^1$, $R^2$, $R^3$, and $R^4$ represents a non-hydrogen substituent and is independently substituted or unsubstituted $C_1$-$C_4$ alkyl or aryl;

each n is independently an integer of 0 to 4, valency permitting; and each $Y^{1a}$, $Y^{2a}$, $Y^{1b}$, $Y^{2b}$, $Y^{1c}$, $Y^{2c}$, $Y^{3a}$, $Y^{3b}$, $Y^{4a}$, $Y^{4b}$, $Y^{4c}$, $Y^{4d}$ is independently N, $NR^{4a}$, or $CR^{4b}$, where each $R^{4a}$ and $R^{4b}$ is independently hydrogen, hydroxyl, amino, nitro, thiol, or substituted or unsubstituted $C_1$-$C_4$ alkyl, alkoxy, or aryl;

provided that when the first emitter, the second emitter, the third emitter, or any combination thereof, comprises a compound of General Formula V, then only one of $V^2$ and $Y^{2a}$ is N.

13. The device of claim 12, wherein the first emitter, the second emitter, the third emitter, or any combination thereof, comprises a compound of General Formula III.

14. The device of claim 12, wherein the first emitter, the second emitter, the third emitter, or any combination thereof, comprises a compound of General Formula IV.

15. The device of claim 12, wherein the first emitter, the second emitter, the third emitter, or any combination thereof, comprises a compound of General Formula V.

* * * * *